(12) United States Patent
Kim et al.

(10) Patent No.: US 9,179,566 B2
(45) Date of Patent: *Nov. 3, 2015

(54) DISPLAY APPARATUS

(71) Applicant: LG ELECTRONICS INC., Seoul (KR)

(72) Inventors: Yunjoo Kim, Seoul (KR); Soonhyung Kwon, Seoul (KR); Jonghyun Byeon, Seoul (KR); Moungyoub Lee, Seoul (KR); Deogjin Lee, Seoul (KR); Sangdon Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/329,366

(22) Filed: Jul. 11, 2014

(65) Prior Publication Data
US 2014/0321036 A1  Oct. 30, 2014

Related U.S. Application Data

(63) Continuation of application No. 13/405,451, filed on Feb. 27, 2012, now Pat. No. 8,804,322.

(30) Foreign Application Priority Data

Feb. 28, 2011 (KR) .................. 10-2011-0017752

(51) Int. Cl.
*G06F 1/16* (2006.01)
*H05K 7/00* (2006.01)
(Continued)

(52) U.S. Cl.
CPC ............ *H05K 7/00* (2013.01); *G02F 1/133308* (2013.01); *G02F 1/133512* (2013.01); *G02F 2001/13332* (2013.01)

(58) Field of Classification Search
USPC ......... 345/107, 207, 173, 174, 156, 168, 690, 345/204, 501, 76, 60, 80, 1.3, 172, 205; 455/575.1, 575.2, 575.3, 575.4; 174/350, 260, 50; 349/158, 110, 54, 349/192; 361/679.01, 679.08, 679.09, 361/679.21, 679.22, 679.23, 679.24, 361/679.25, 679.26, 679.27, 679.34, 361/679.56, 679.29; 200/512, 600
See application file for complete search history.

(56) References Cited

U.S. PATENT DOCUMENTS

2006/0209502 A1  9/2006 Sakata et al. ............... 361/681
2007/0296690 A1* 12/2007 Nagasaki .................... 345/107
(Continued)

FOREIGN PATENT DOCUMENTS

EP  2 211 226 A1  7/2010
JP  2008-203591 A  9/2008
(Continued)

OTHER PUBLICATIONS

International Search Report and Written Opinion dated Sep. 27, 2012 issued in Application No. PCT/KR2012/001397.
(Continued)

*Primary Examiner* — Hung Duong
(74) *Attorney, Agent, or Firm* — Ked & Associates, LLP

(57) ABSTRACT

A display device includes a display panel including a front substrate and a back substrate, a back cover disposed in the rear of the display panel, and a transparent cover including a portion disposed in the front of the front substrate of the display panel. The transparent cover contains a resin material having transmission capable of transmitting light. The transparent cover is separated from a front surface of the front substrate by a predetermined distance, and an air layer is formed between the transparent cover and the front surface of the front substrate.

14 Claims, 67 Drawing Sheets

(51) Int. Cl.
*G02F 1/1333* (2006.01)
*G02F 1/1335* (2006.01)

(56) References Cited

U.S. PATENT DOCUMENTS

| | | | |
|---|---|---|---|
| 2009/0147155 A1 | 6/2009 | Hsu et al. | 348/836 |
| 2011/0115340 A1 | 5/2011 | Lee | 310/348 |
| 2011/0279426 A1* | 11/2011 | Imamura et al. | 345/207 |
| 2011/0285934 A1 | 11/2011 | Watanabe | 349/58 |
| 2012/0050655 A1 | 3/2012 | Takahashi et al. | 349/122 |
| 2012/0069506 A1 | 3/2012 | Lai et al. | 361/679.01 |

FOREIGN PATENT DOCUMENTS

| | | |
|---|---|---|
| JP | 2010-032653 A | 2/2010 |
| JP | 2010-032653 A * | 12/2010 |
| KR | 10-2008-0072884 A | 8/2008 |
| KR | 10-2009-0129466 A | 12/2009 |
| WO | WO 2010/089998 A1 | 8/2010 |

OTHER PUBLICATIONS

United States Notice of Allowance dated Apr. 11, 2014 issued in U.S. Appl. No. 13/405,451.
European Search Report dated Sep. 18, 2014 issued in Application No. 12 753 026.9.

\* cited by examiner

DISPLAY APPARATUS

CROSS-REFERENCE TO RELATED APPLICATIONS

This application is a Continuation application of prior U.S. patent application Ser. No. 13/405,451 filed Feb. 27, 2012, which claims priority under 35 U.S.C. §119 to Korean Application No. 10-2011-0017752 filed in the Korean Intellectual Property Office on Feb. 28, 2011, whose entire disclosures are hereby incorporated by reference.

BACKGROUND OF THE INVENTION

1. Field of the Invention

Embodiments of the invention relate to a display device.

2. Description of the Related Art

With the development of the information society, various demands for display devices have been increasing. Various display devices, such as liquid crystal displays (LCDs), plasma display panels (PDPs), electroluminescent displays (ELDs), and vacuum fluorescent displays (VFDs), have been recently studied and used to meet various demands for the display devices.

Among the display devices, a liquid crystal display panel of the liquid crystal display includes a liquid crystal layer, and a thin film transistor (TFT) substrate and a color filter substrate that are positioned opposite each other with the liquid crystal layer interposed between them. The liquid crystal display panel displays an image using light provided by a backlight unit of the liquid crystal display.

SUMMARY OF THE INVENTION

Embodiments of the invention provide a display device having a configuration, in which a transparent cover with transmission is disposed at an edge of a display panel displaying an image.

In one aspect, there is a display device including a display panel including a front substrate and a back substrate, a back cover disposed in the rear of the display panel, and a transparent cover including a portion disposed in the front of the front substrate of the display panel.

The transparent cover may contain a resin material having transmission capable of transmitting light.

The transparent cover may be separated from a front surface of the front substrate by a predetermined distance.

An air layer may be formed between the transparent cover and the front surface of the front substrate.

The transparent cover may be separated from an side surface of the display panel by a predetermined distance.

An air layer may be formed between the transparent cover and the side surface of the display panel.

An optical layer may be disposed between the back cover and the display panel.

The transparent cover may be connected to the back cover.

The display device may further include a black frame including a portion positioned between the front substrate of the display panel and the transparent cover.

The black frame may further include a portion positioned between the transparent cover and the back cover.

The black frame may further include a portion attached to the front substrate.

The black frame may be separated from the transparent cover by a predetermined distance in a direction vertical to the display panel.

An air layer may be formed between the transparent cover and the black frame in the direction vertical to the display panel.

The black frame may be separated from the transparent cover by a predetermined distance in a longitudinal direction of the display panel.

An air layer may be formed between the transparent cover and the black frame in the longitudinal direction of the display panel.

The black frame may further include a portion positioned between an side surface of the display panel and the transparent cover.

A reflective layer may be disposed between the transparent cover and the black frame.

The reflective layer may contact the black frame.

The black frame may include a first part overlapping the reflective layer in a direction vertical to the display panel and a second part not overlapping the reflective layer.

A thickness of a portion of the transparent cover overlapping the first part of the black frame in the direction vertical to the display panel may be different from a thickness of a portion of the transparent cover overlapping the second part of the black frame in the direction vertical to the display panel.

The first part of the black frame may be positioned between an side surface of the display panel and the second part of the black frame in a longitudinal direction of the display panel and the thickness of the portion of the transparent cover overlapping the first part of the black frame in the direction vertical to the display panel may be greater than the thickness of the portion of the transparent cover overlapping the second part of the black frame in the direction vertical to the display panel.

The transparent cover may extend further than the black frame toward the middle of the display panel in a longitudinal direction of the display panel.

As the transparent cover approaches the middle of the display panel in a longitudinal direction of the display panel, the transparent cover may include a portion having a gradually decreasing thickness.

An acute angle may be formed between a front surface of the front substrate of the display panel and the surface of the transparent cover in a direction away from the middle of the display panel.

A display device according to an embodiment of the invention is positioned the transparent cover having transmission capable of transmitting light at an edge of display panel displaying image, have an effect that a size of a bezel area of the display panel looks smaller than its actual size.

DETAILED DESCRIPTION OF THE EMBODIMENTS

Figure 1:
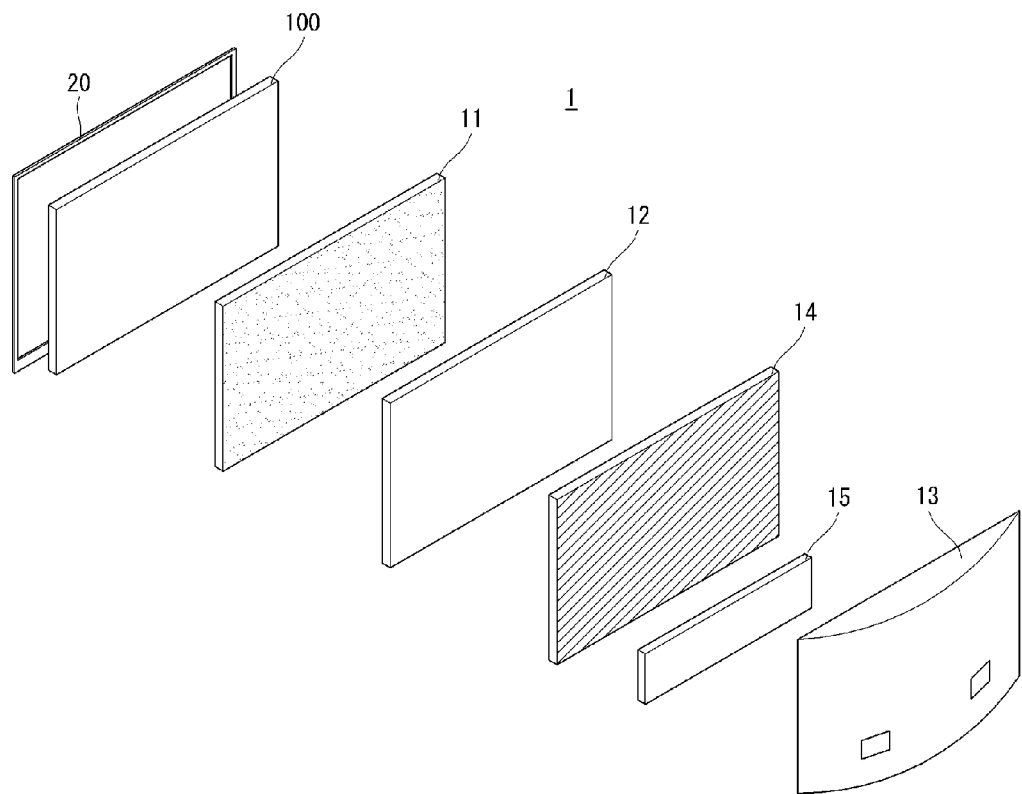
FIGS. 1 to 4 schematically illustrate a configuration of a display device according to an example embodiment of the invention.

A display device according to embodiments of the invention is described in detail below with reference to the accompanying drawings.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to "or" being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following embodiments of the present invention are provided to those skilled in the art in order to describe the present invention more completely. Accordingly, shapes and sizes of elements shown in the drawings may be exaggerated for clarity.

FIGS. 1 to 4 schematically illustrate a configuration of a display device according to an example embodiment of the invention.

As shown in FIG. 1, a display device 1 according to an embodiment of the invention may include a display panel 100, an optical layer 11, a backlight unit 12, a frame 14, a driving board 15, a back cover 13, and a transparent cover 20.

Although not shown, various kinds of display panels such as a liquid crystal display (LCD) panel, a plasma display panel (PDP), and an organic light emitting diode (OLED) display panel may be used as the display panel 100 displaying an image in the embodiment of the invention.

In the embodiment of the invention, the LCD panel is used as an example of the display panel 100.

The transparent cover 20 may be disposed at an edge of the display panel 100. The transparent cover 20 may have the transmission capable of transmitting light. The transparent cover 20 is described in detail later.

The optical layer 11 may include a plurality of sheets. For example, although not shown, the optical layer 11 may include at least one of a prism sheet and a diffusion sheet.

The backlight unit 12 may be positioned in the rear of the optical layer 11. Although not shown, the backlight unit 12 may include at least one light source.

Various types of light sources may be used in the embodiment of the invention. For example, the light source may be one of a light emitting diode (LED) chip and a LED package having at least one LED chip. In this instance, the light source may be a colored LED emitting one of red, green, and blue light or a white LED.

The frame 14 may be positioned in the rear of the backlight unit 12 and may support the backlight unit 12.

The driving board 15 may be positioned in the rear of the frame 14. The driving board 15 may supply a driving signal to electrodes of the display panel 100. Further, the driving board 15 may supply a driving signal to the backlight unit 12.

The back cover 13 may be positioned in the rear of the driving board 15.

The optical layer 11 may be closely attached to the display panel 100. Alternatively, the backlight unit 12 may be closely attached to the optical layer 11. In this instance, a thickness of the display device according to the embodiment of the invention may be reduced.

FIG. 1 shows a direct type backlight unit as an example of the backlight unit 12. An edge type backlight unit shown in FIG. 2 may be used in the embodiment of the invention.

Figure 2:
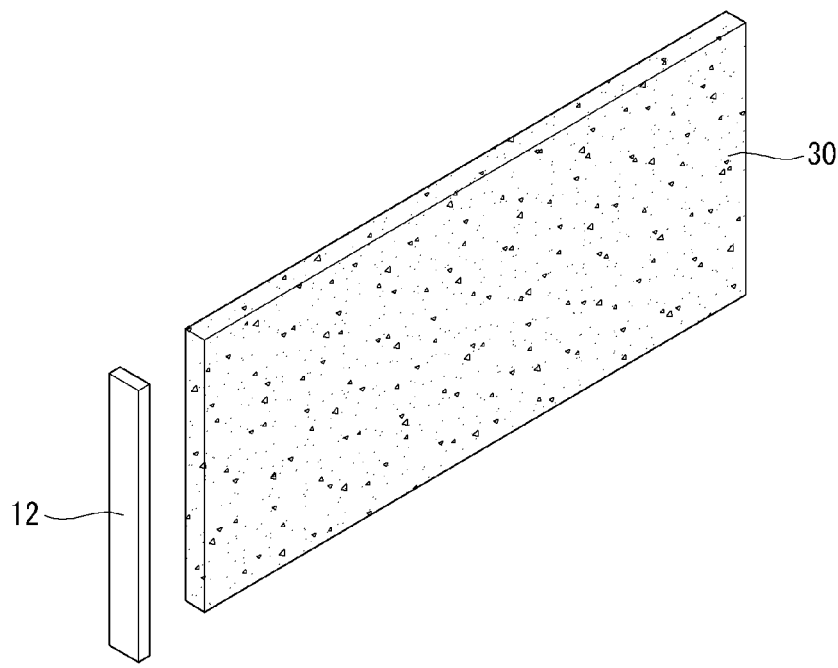

More specifically, as shown in FIG. 2, the display device according to the embodiment of the invention may include a light guide plate 30 positioned between the optical layer 11 and the frame 14. The edge type backlight unit 12 may be disposed on the side of the light guide plate 30.

In this instance, the edge type backlight unit 12 may emit light on the side of the light guide plate 30. Further, the light guide plate 30 may reflect or scatter light incident on the side of the light guide plate 30 and may emit the light forward. For this, the light guide plate 30 may include scattering particles (not shown).

Figure 3:
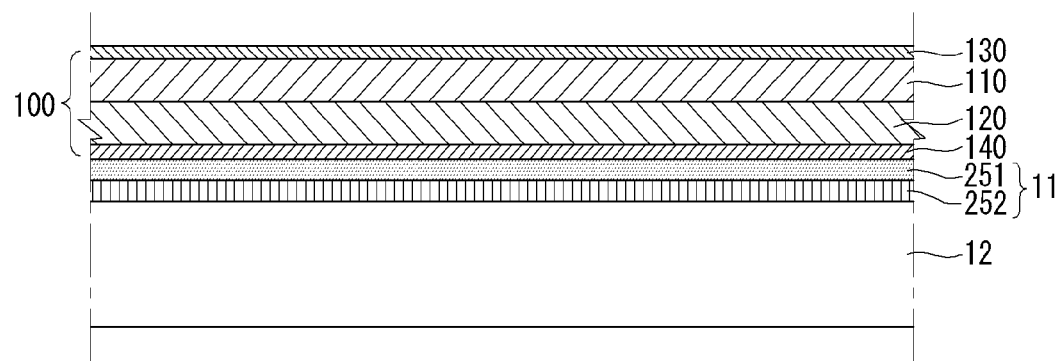
Figure 4:
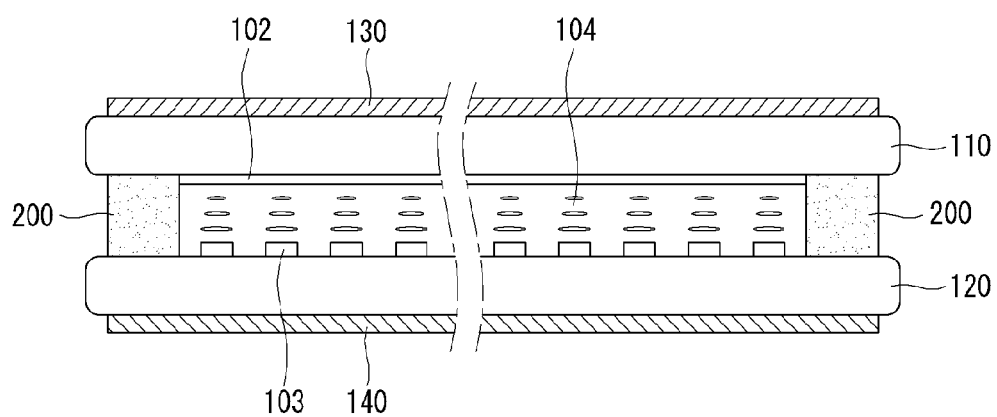

As shown in FIG. 3 and FIG. 4, the display panel 100 may include a front substrate 110 and a back substrate 120, that are positioned opposite each other and are attached to each other to form a uniform cell gap therebetween.

As shown in FIG. 4, a liquid crystal layer 104 may be formed between the front substrate 110 and the back substrate 120.

A seal part 200 may be formed between the front substrate 110 and the back substrate 120 and may seal the liquid crystal layer 104.

A color filter 102 may be positioned on the front substrate 110 and may implement red, green, and blue colors.

The color filter 102 may include a plurality of pixels each including red, green, and blue subpixels. Other configurations may be used for the pixel.

For example, each pixel may include red, green, blue, and white subpixels. When light is incident on the color filter 102, images corresponding to the red, green, and blue colors may be displayed.

Predetermined transistors 103, for example, thin film transistors (TFTs) may be formed on the back substrate 120. The transistors 103 may turn on or off liquid crystals in each pixel.

Considering the above description, the front substrate 110 may be referred to as a color filter substrate, and the back substrate 1201 may be referred to as a TFT substrate.

A front polarizing film 130 may be positioned on a front surface of the front substrate 110 and may polarize light passing through the display panel 100. A back polarizing film 140 may be positioned on a back surface of the back substrate 120 and may polarize light passing through the optical layer 11 positioned in the rear of the back substrate 120.

The liquid crystal layer 104 may be formed of a plurality of liquid crystal molecules, and the arrangement of the liquid crystal molecules may change in response to a driving signal supplied by the transistors 103. Hence, light provided by the backlight unit 12 may be incident on the color filter 102 based on changes in the molecular arrangement of the liquid crystal layer 104.

As a result, the color filter 102 may implement red, green, and blue light, and thus a predetermined image may be displayed on the front substrate 110 of the display panel 100.

Because the image may be displayed in an area corresponding to the TFTs 103 disposed on the back substrate 120, the area corresponding to the TFTs 103 may be referred to as "an Active Area", AA, and an area outside the outermost TFT 103 may be referred to as "a Dummy Area", DA.

Alternatively, a boundary between the active area of the display panel 100, on which the image is displayed, and the dummy area may be set by the seal part 200. Namely, an area inside the seal part 200 may be referred to as the active area AA, and an area outside the seal part 200 may be referred to as the dummy area DA.

Since the above-described structure and the above-described configuration of the display panel 100 are only one example, they may be changed, added, or omitted.

FIGS. 5 to 41 illustrate in detail a display device according to an example embodiment of the invention. In the following description, the descriptions of the configuration and the structure described above are omitted.

Figure 5:
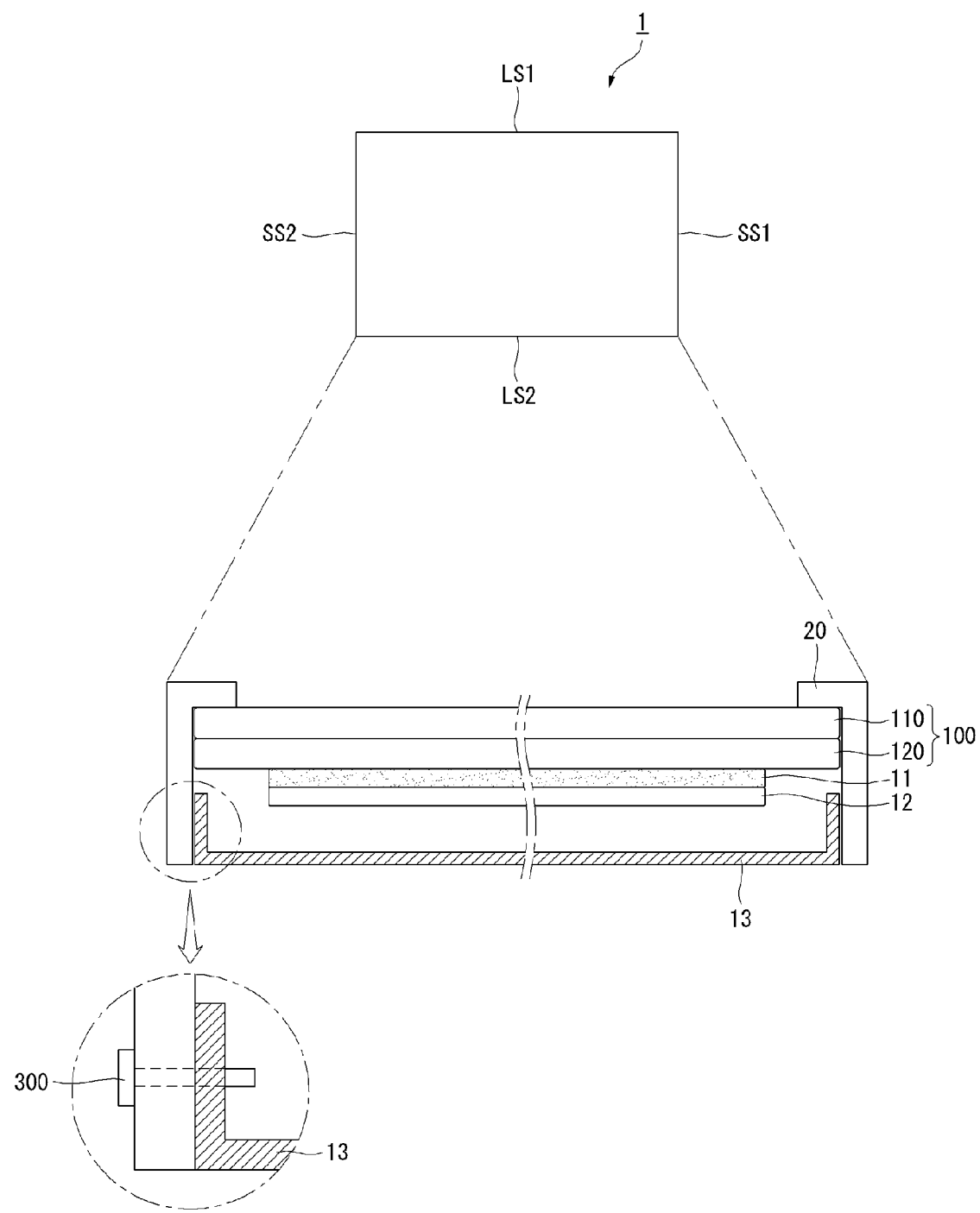
FIGS. 5 to 41 illustrate in detail a display device according to an example embodiment of the invention.

As shown in FIG. 5, a display device 1 according to an embodiment of the invention may include a display panel 100, a back cover 13 positioned in the rear of the display panel 100, and a transparent cover 20 including a portion positioned in the front of a front substrate 110 of the display panel 100. The back cover 13 may be connected to the transparent cover 20. For example, the back cover 13 may be connected to the transparent cover 20 by a first fastening part 300 such as a screw.

Figure 6:
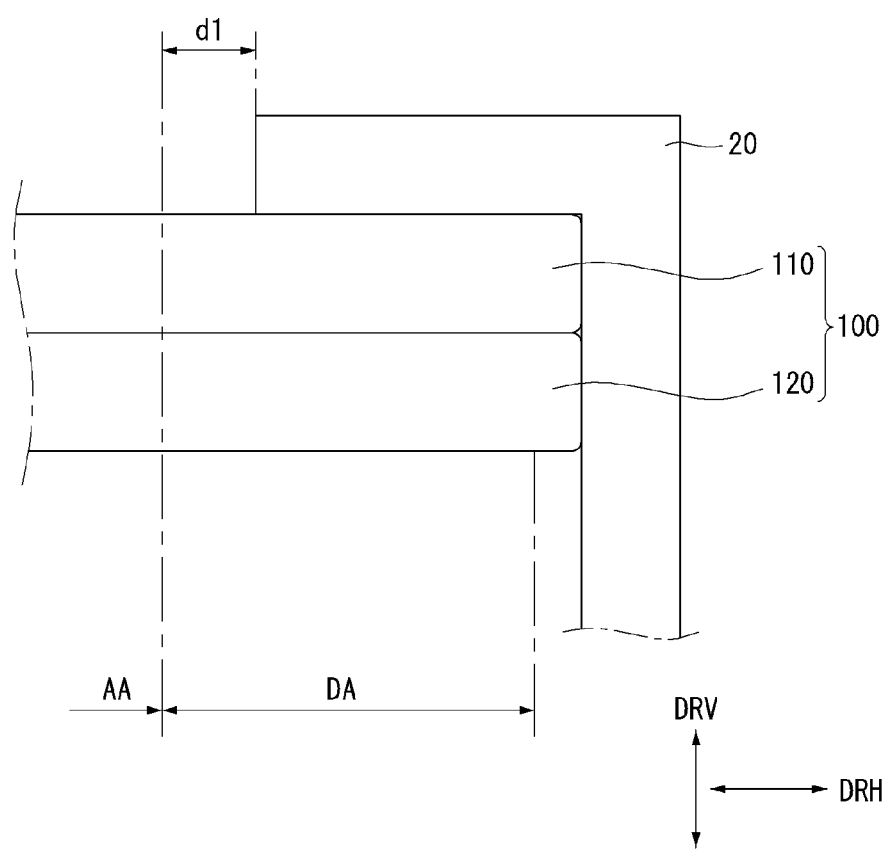

As shown in FIG. 6, the transparent cover 20 may include a portion disposed in front of a dummy area DA outside an active area AA displaying an image. In other words, the transparent cover 20 may include a portion overlapping the dummy area DA of the display panel 100 in a direction DRV vertical to the display panel 100.

Further, the transparent cover 20 may include a portion positioned on the side of the display panel 100. In other words, the transparent cover 20 may include a portion overlapping the display panel 100 in a direction DRH horizontal to the display panel 100.

The transparent cover 20 may have the transmission capable of transmitting light. For this, the transparent cover 20 may contain a resin material. Other materials may be used for the transparent cover 20 under condition that the transparent cover 20 has the transmission.

Figure 7:
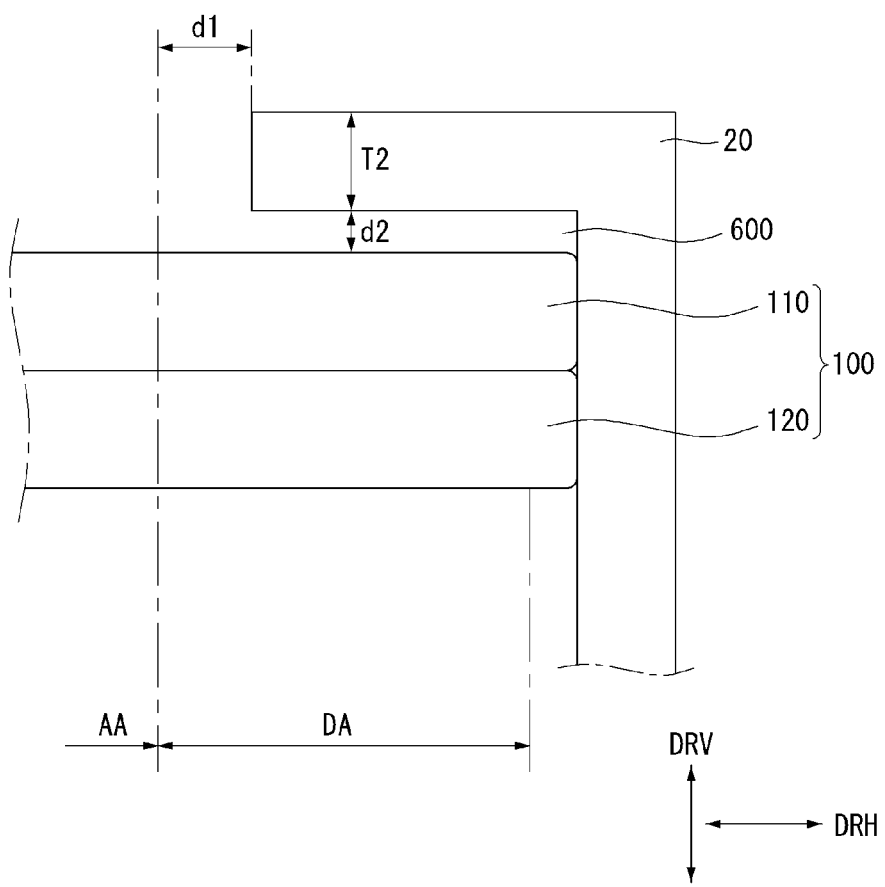

As shown in FIG. 7, the transparent cover 20 may be separated from a front surface of the front substrate 110 by a predetermined distance d2. Hence, a first air layer 600 may be formed between the transparent cover 20 and the front surface of the front substrate 110.

As above, when the transparent cover 20 is separated from the front surface of the front substrate 110 by the predetermined distance d2 and the first air layer 600 is formed between the transparent cover 20 and the front surface of the front substrate 110, a bezel area of the display device 1 may look smaller than its actual size. The bezel area of the display device 1 may an area outside the active area AA, and thus the image may not be displayed in the bezel area. Therefore, the bezel area maybe referred to as the dummy area DA.

Figure 8:
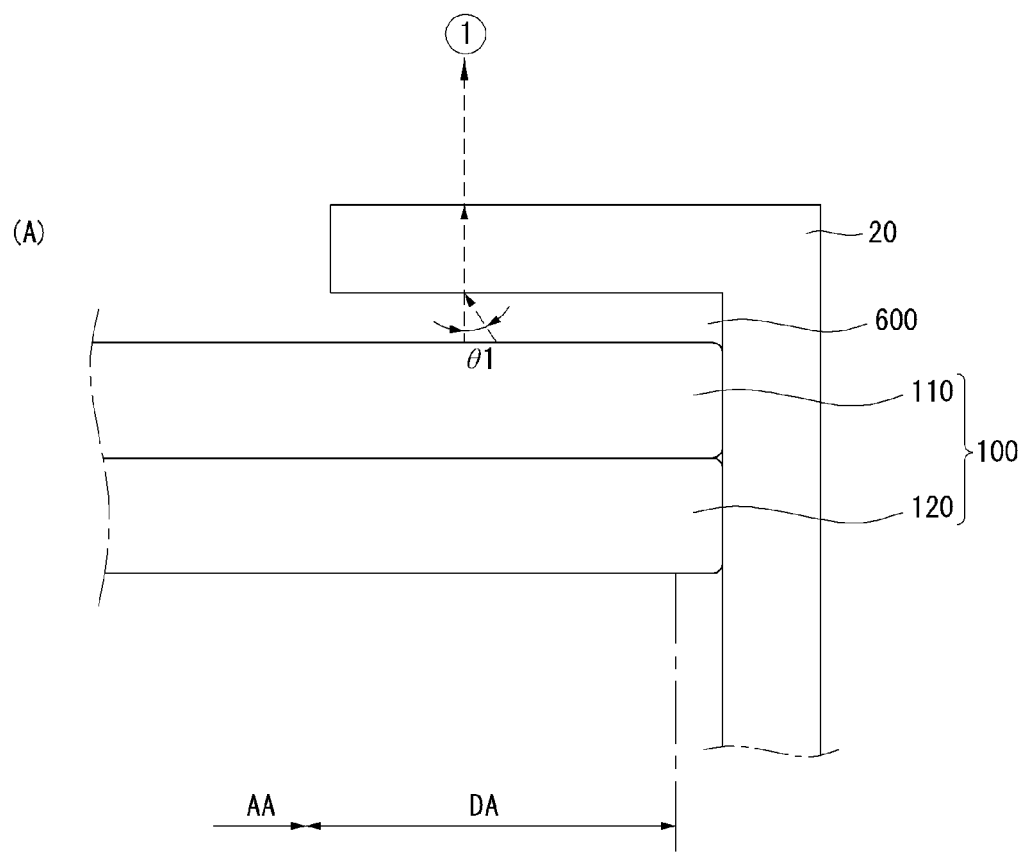
Figure 8:
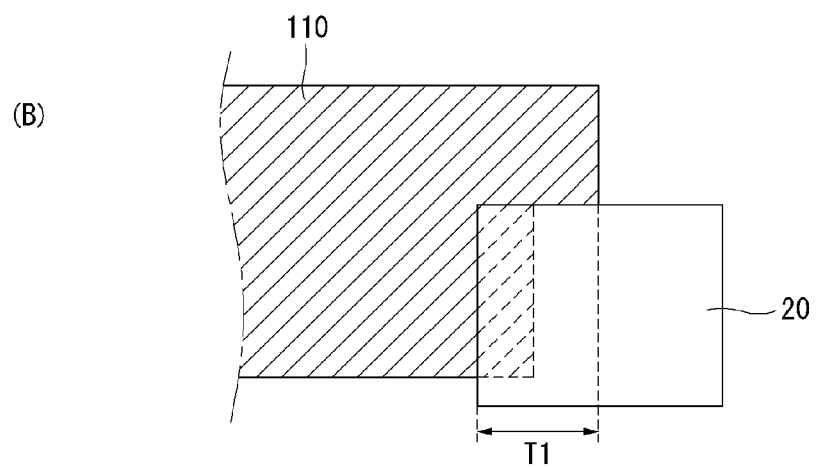

For example, as shown in (A) of FIG. 8, light incident from a position '②' in front of the display panel 100 may enter into the transparent cover 20 at an incident angle of θ1.

Hence, as shown in (B) of FIG. 8, the bezel area of the display panel 100 may look smaller than its actual size by the size of T1.

A refractive index of the transparent cover 20 may be greater than a refractive index of air, so as to obtain a visual effect of the smaller size of the bezel area of the display device 1.

As shown in FIG. 7, a thickness T2 of the portion of the transparent cover 20 positioned in the front of the front substrate 110 may be greater than the distance d2 between the front surface of the front substrate 110 and the transparent cover 20 in the direction DRV vertical to the display panel 100.

Further, the transparent cover 20 may be separated from the active area AA by a predetermined distance d1 in the direction DRH horizontal to the display panel 100, so as to prevent a distortion of the image displayed on the active area AA of the display panel 100 while obtaining the visual effect of the smaller size of the bezel area of the display device 1.

Figure 9:
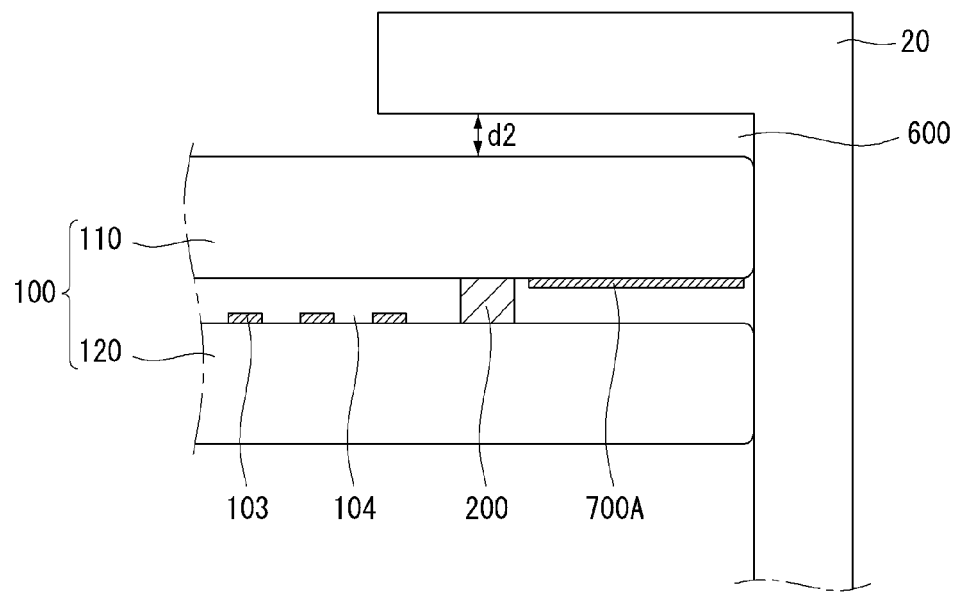

As shown in FIG. 9, a black layer 700A may be formed between the front substrate 110 and a back substrate 120. For example, the black layer 700A may be formed on a back surface of the front substrate 110. The black layer 700A may be almost black. Other colors may be used for the black layer 700A.

The black layer 700A may look smaller than its actual size due to the transparent cover 20. Because the black layer 700A is almost black darker than its surroundings, the black layer 700A may further increase the visual effect of the smaller size of the bezel area.

The active area AA and the dummy area DA of the display panel 100 may be distinguished from each other by the black layer 700A.

For example, a formation area of the black layer 700A may indicate the dummy area DA, and an area inside the black layer 700A may indicate the active area AA.

Alternatively, the active area AA and the bezel area of the display panel 100 may be distinguished from each other by the black layer 700A.

For example, a formation area of the black layer 700A may indicate the bezel area.

The bezel area and the dummy area DA of the display panel 100 may be different from each other.

For example, when the formation area of the black layer 700A indicates the bezel area, an area between the active area AA and the bezel area, which are separated from each other by a predetermined distance, may indicate the dummy area DA.

Figure 10:
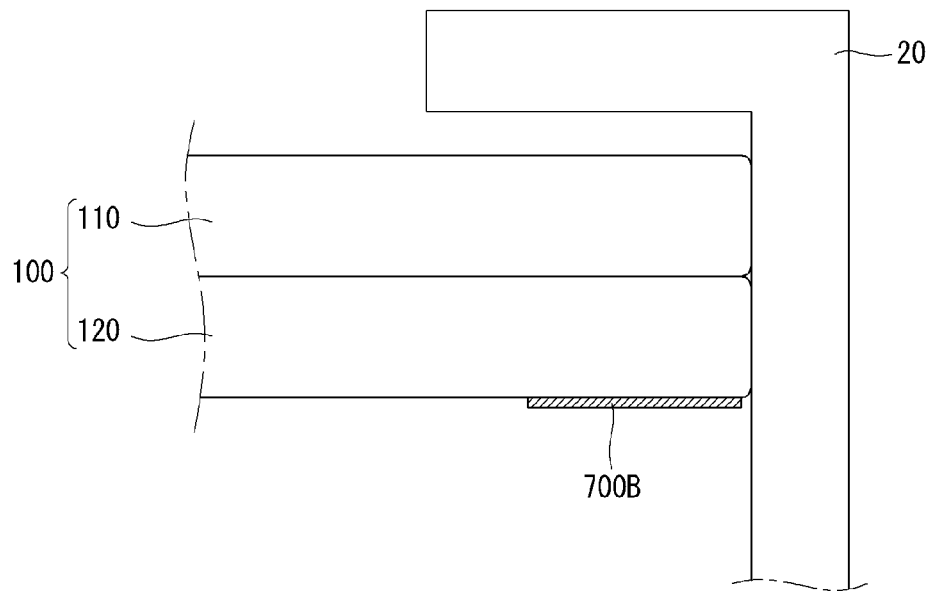

As shown in FIG. 10, another black layer 700B may be formed on a back surface of the back substrate 120.

The black layer 700B may further increase the visual effect of the smaller size of the bezel area.

Figure 11:
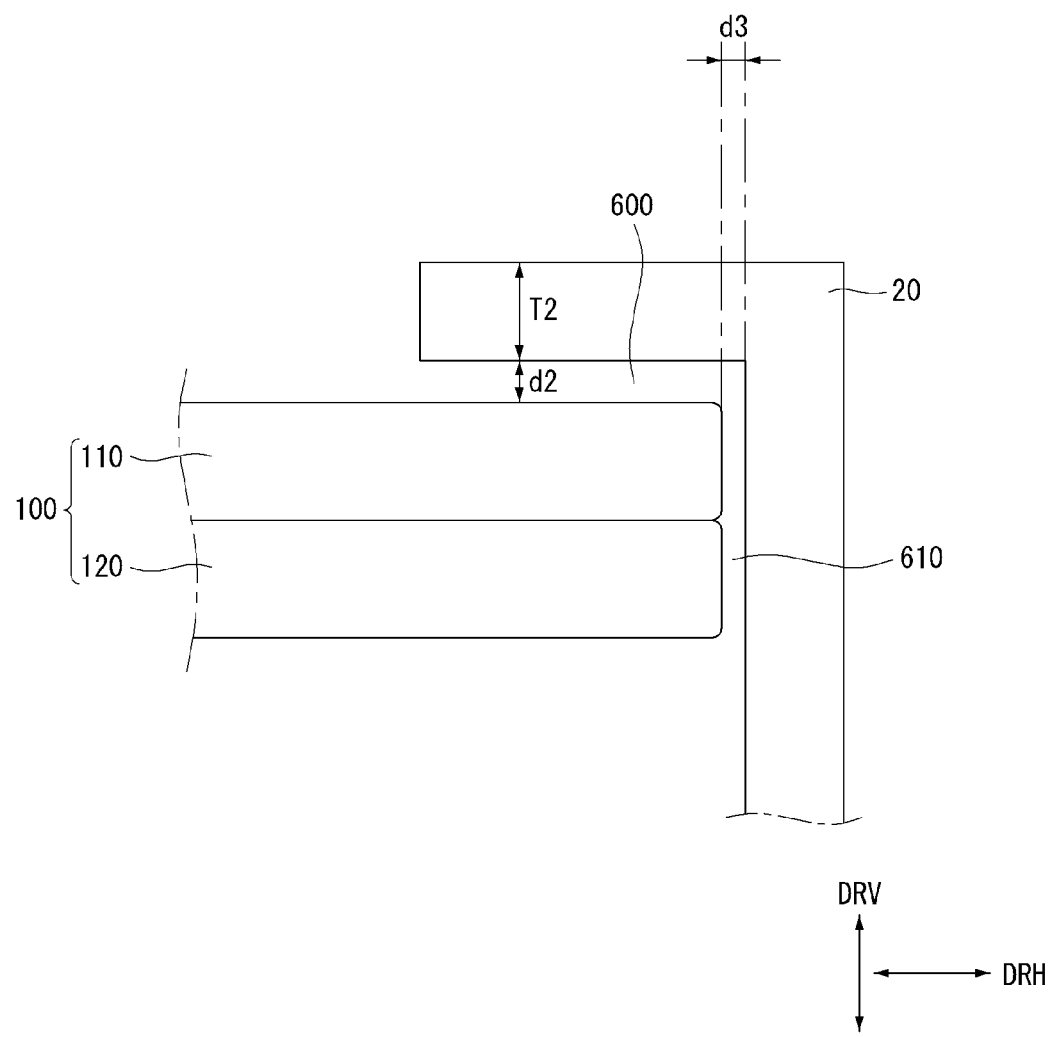

As shown in FIG. 11, the transparent cover 20 may be separated from an end of the front substrate 110 by a predetermined distance d3 in the direction DRH horizontal to the display panel 100. Hence, a second air layer 610 may be formed between the transparent cover 20 and the end of the front substrate 110.

As above, when the transparent cover 20 is separated from the end of the front substrate 110 by the predetermined distance d3 and the second air layer 610 is formed between the transparent cover 20 and the end of the front substrate 110, colors of the front substrate 110 and/or the back substrate 120 may be prevented from running on the transparent cover 20. Hence, the visual effect of the smaller size of the bezel area of the display device 1 may be obtained.

Further, it does not matter that the distance d3 between the transparent cover 20 and the end of the front substrate 110 is narrow. For example, the distance d3 between the transparent cover 20 and the end of the front substrate 110 may be less than the distance d2 between the front surface of the front substrate 110 and the transparent cover 20.

As shown in FIG. 11, the transparent cover 20 may not contact the front substrate 110.

Figure 12:
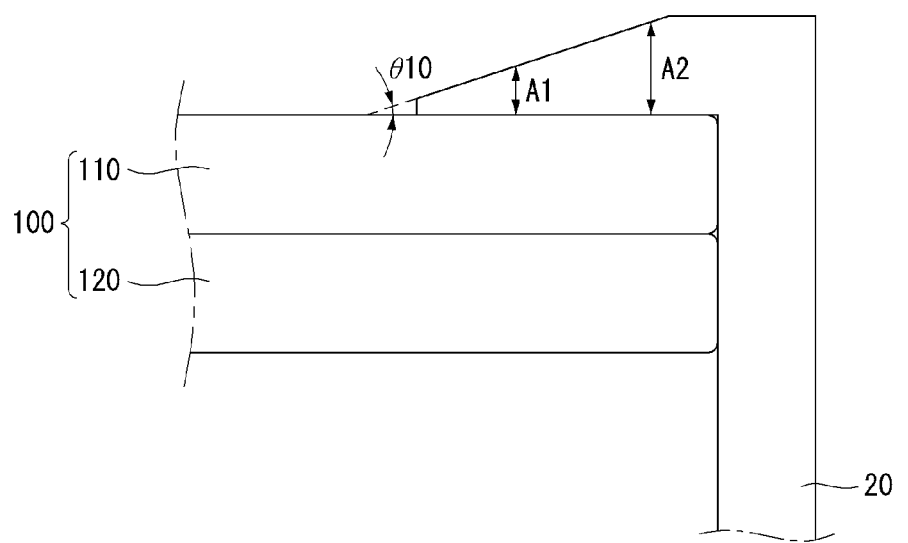
Figure 12:
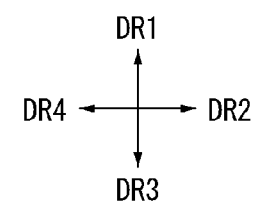

As shown in FIG. 12, the transparent cover 20 may include a portion having different thicknesses. More specifically, the portion of the transparent cover 20 may have the gradually decreasing thickness as it approaches the middle of the display panel 100 in a longitudinal direction of the display panel 100 (i.e., the direction DRH horizontal to the display panel 100).

In other words, a portion of the transparent cover 20 positioned in the front of the display panel 100 may have a gradually decreasing thickness as it goes in a fourth direction DR4. Namely, a thickness A1 of a first portion of the portion of the transparent cover 20 positioned in the front of the display panel 100 may be less than a thickness A2 of a second portion which is closer to an side surface of the display panel 100 than the first portion.

In this instance, the transparent cover 20 may have an inclined surface based on the front surface of the front substrate 110 of the display panel 100.

Hence, an angle θ10 between the front surface of the front substrate 110 and the inclined surface of the transparent cover 20 in a direction away from the middle of the display panel 100, i.e., in a second direction DR2 may include a portion having an acute angle.

Figure 13:
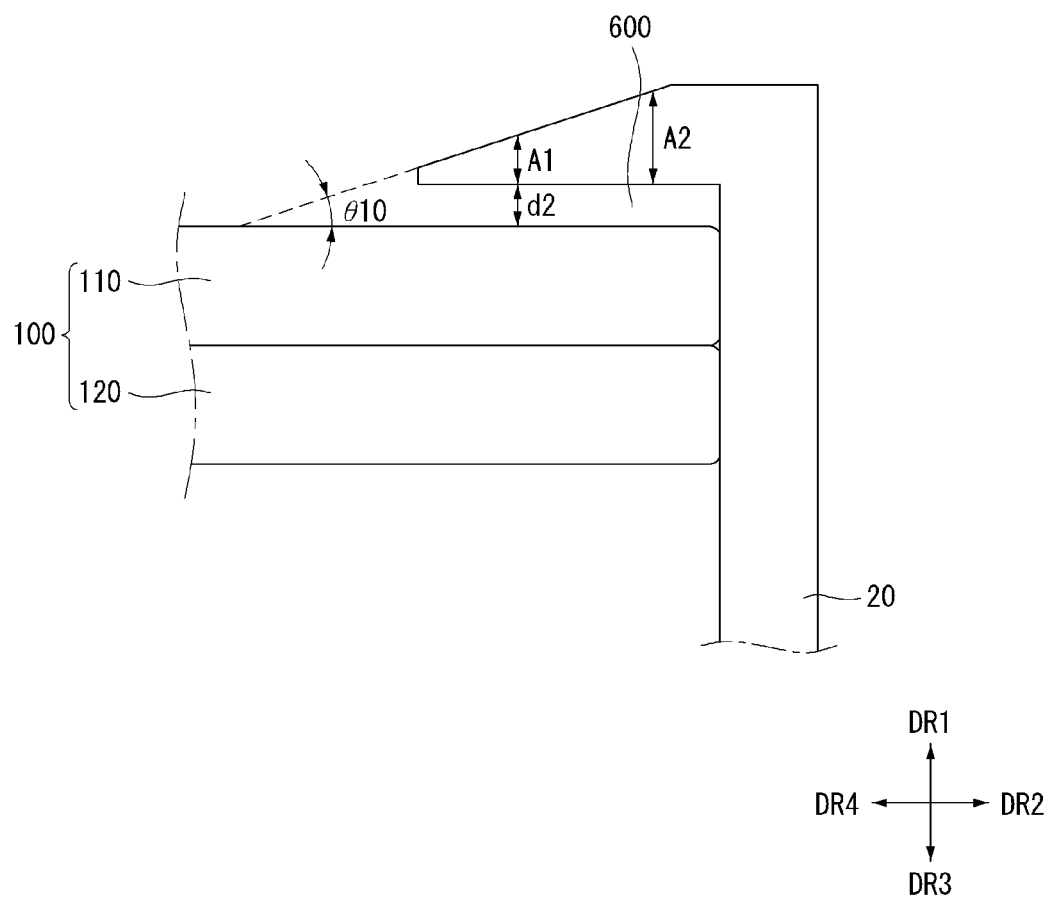

As shown in FIG. 13, when the transparent cover 20 includes the portion having the gradually decreasing thickness, the transparent cover 20 may be separated from the front surface of the front substrate 110 by the predetermined distance d2.

Figure 14:
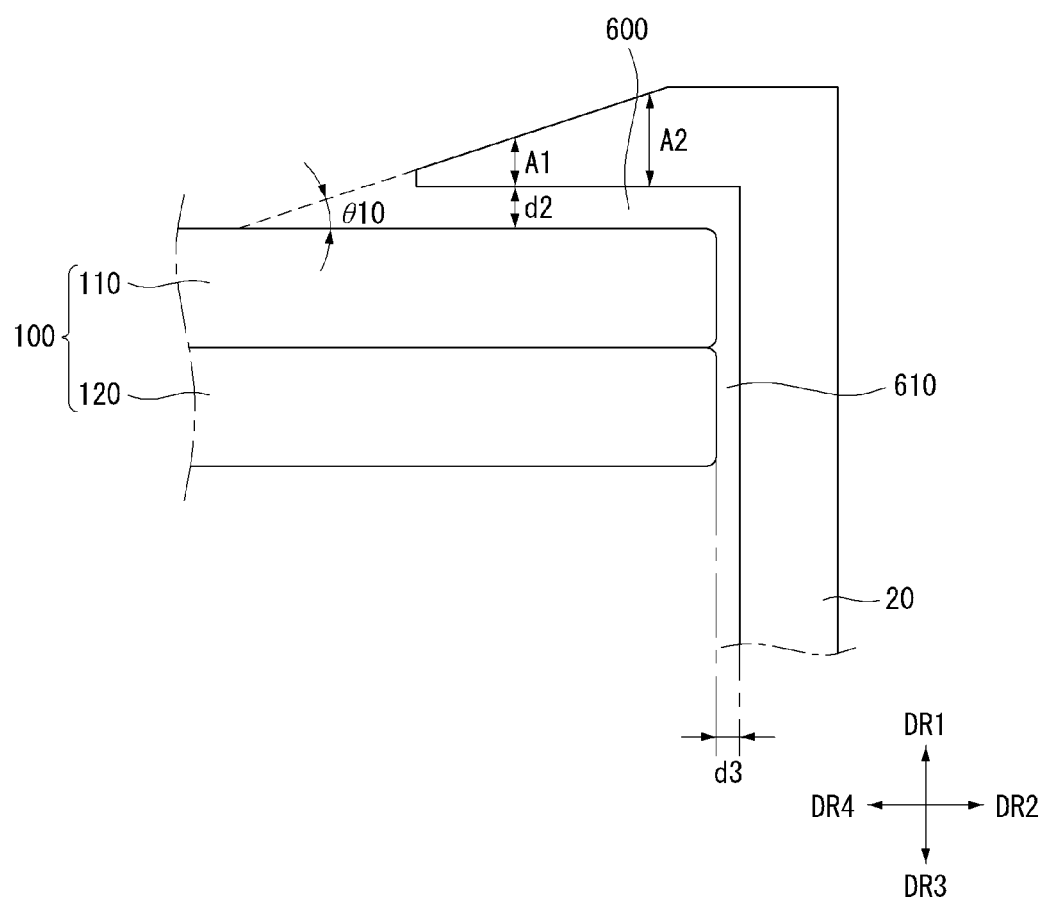

Further, as shown in FIG. 14, when the transparent cover 20 includes the portion having the gradually decreasing thickness, the transparent cover 20 may be separated from the end of the front substrate 110 by the predetermined distance d3 in the direction DRH horizontal to the display panel 100.

Figure 15:
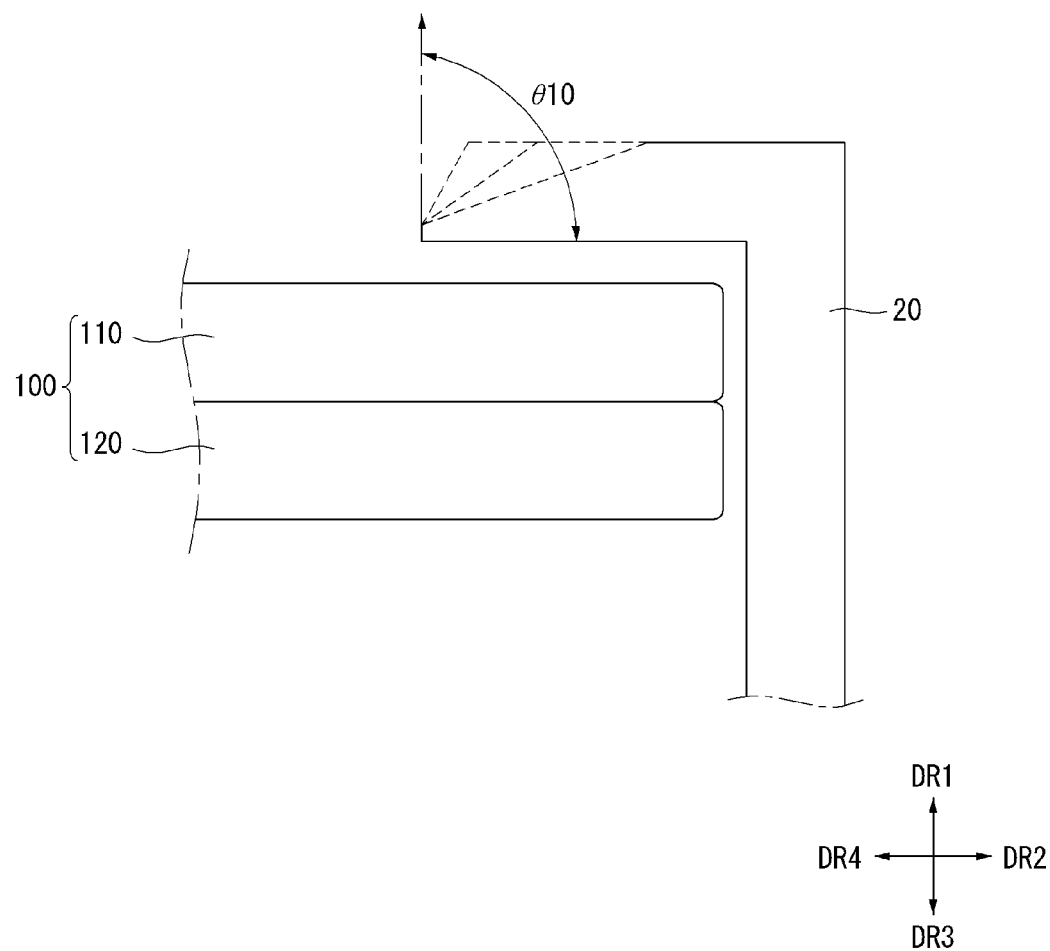

As shown in FIG. 15, the angle θ10 between the front surface of the front substrate 110 and the inclined surface of the transparent cover 20 may variously change under the condition of the acute angle. When considering that a viewer mainly views an image in front of the display device 1, the angle θ10 between the front surface of the front substrate 110 and the inclined surface of the transparent cover 20 may be about 10° to 50°.

As above, when the transparent cover 20 has the inclined surface, the visual effect of the smaller size of the bezel area of the display device 1 may be obtained.

Figure 16:
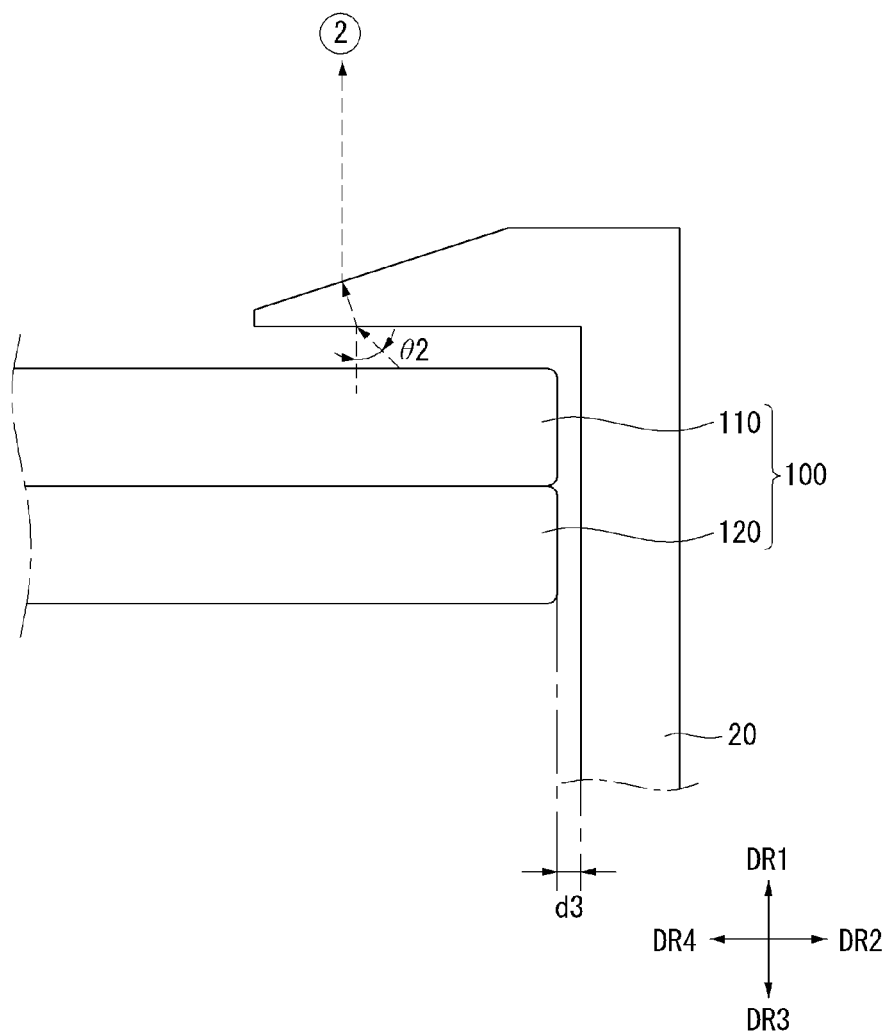

For example, as shown in FIG. 16, when light incident from a position '②' in front of the display panel 100 in a vertical direction enters into the transparent cover 20, an incident angle of the light may change to a predetermined angle. Further, when the light comes from the transparent cover 20, the incident angle of the light may change to θ2. The angle θ2 shown in FIG. 16 may be greater than the angle θ1 shown in FIG. 8.

Hence, the bezel area of the display panel 100 may look smaller than its actual size by the size greater than T1 shown in FIG. 8.

Figure 17:
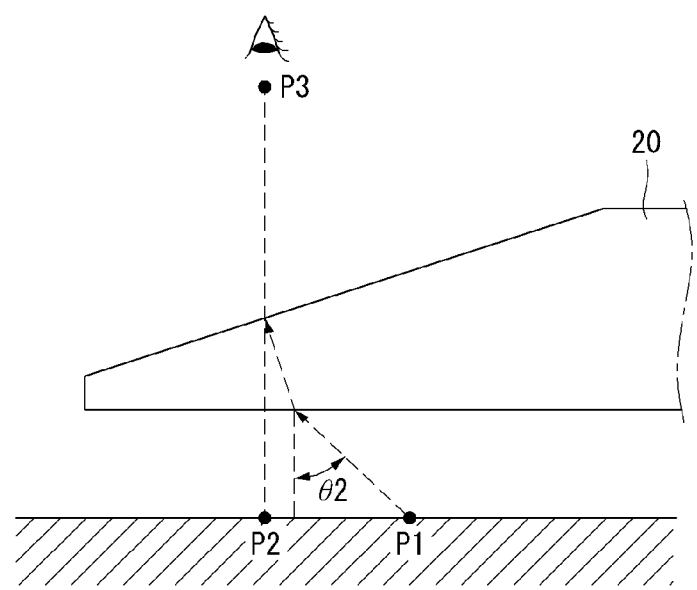

More specifically, as shown in FIG. 17, an incident angle of light incident on the transparent cover 20 from a position P1 at an angle θ2 may decrease because of a difference between refractive indexes of air and the transparent cover 20. Afterwards, when the light comes from the transparent cover 20, the incident angle of the light may increase.

Hence, when the viewer at a position P3 sees a position P2, the viewer actually seeing the position P2 may perceive an image displayed at the position P1 by the refraction of light.

The visual effect of the smaller size of the bezel area of the display panel 100 according to the embodiment of the invention may be obtained by the above operation.

Figure 18:
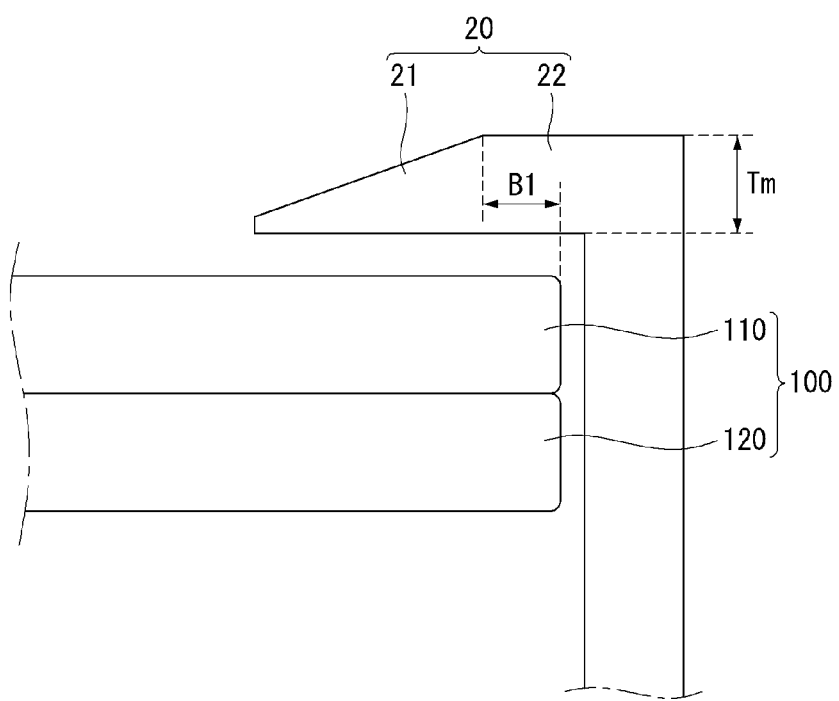
Figure 18:
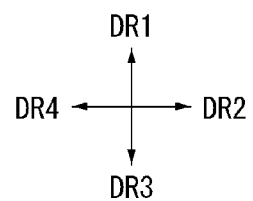

As shown in FIG. 18, a portion of the transparent cover 20 positioned in front of the display panel 100 may be divided into a third portion 21 and a fourth portion 22. A thickness of the third portion 21 may gradually change, and the fourth portion 22 may have a uniform thickness.

Alternatively, the third portion 21 may have an inclined surface based on the front surface of the front substrate 110, and a surface of the fourth portion 22 may be parallel to the front surface of the front substrate 110.

The third portion 21 may be separated from an end of the front substrate 110 in the direction DRH horizontal to the display panel 100 by a predetermined distance B1.

In this instance, the visual effect of the smaller size of the bezel area of the display panel 100 may be obtained.

The distance B1 between the third portion 21 and the end of the front substrate 110 in the direction DRH horizontal to the display panel 100 may be less than a maximum thickness Tm of the portion of the transparent cover 20 positioned in front of the display panel 100.

Figure 19:
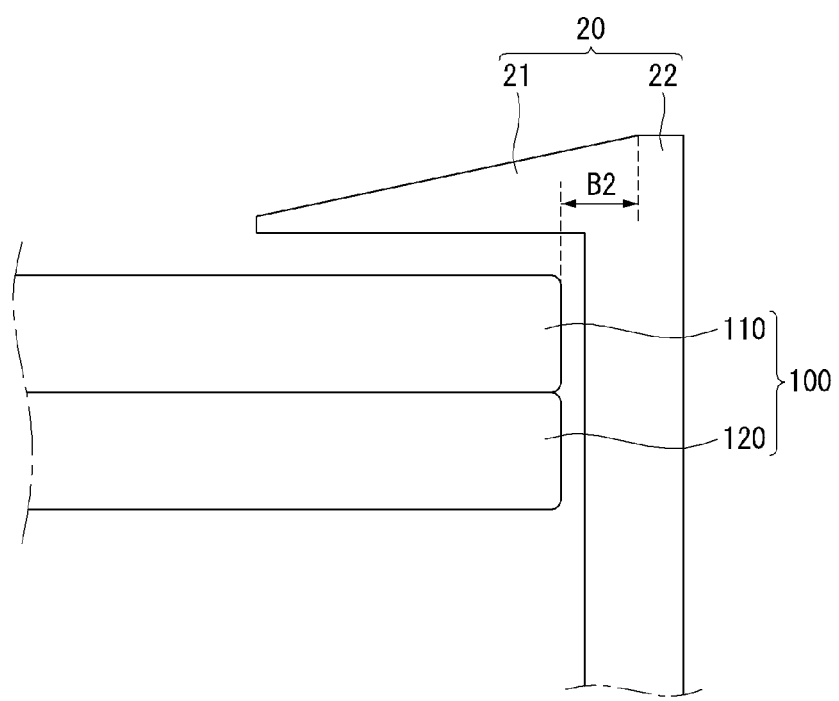

Alternatively, as shown in FIG. 19, the third portion 21 may overlap the end of the front substrate 110 in the direction DRV vertical to the display panel 100. In this instance, the third portion 21 may extend further than the end of the front substrate 110 by a predetermined length B2 in a direction away from the middle of the display panel 100.

In this instance, the visual effect of the smaller size of the bezel area of the display panel 100 may be obtained.

Figure 20:
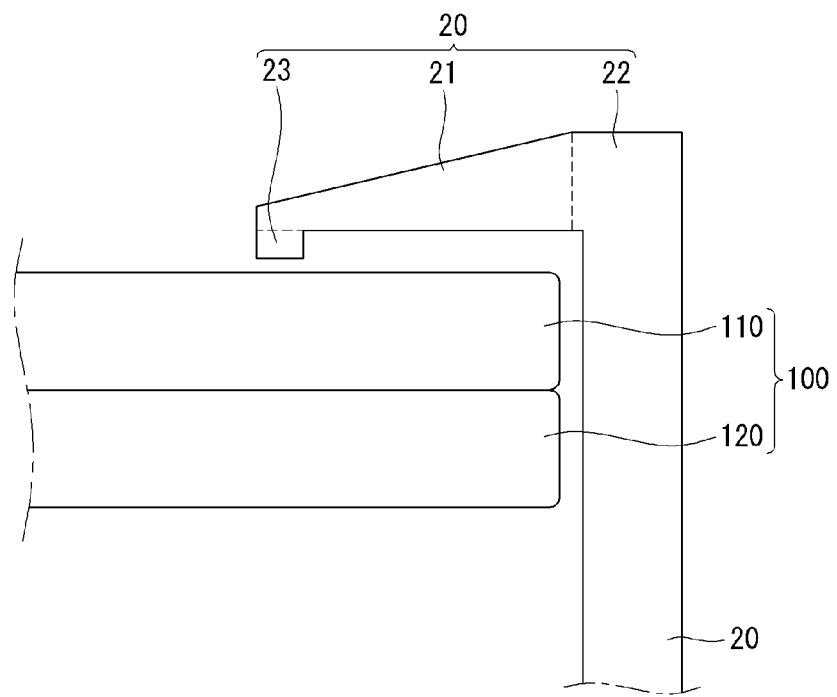
Figure 20:
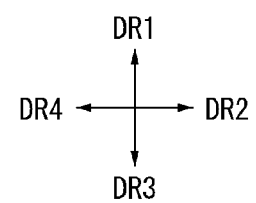

Alternatively, as shown in FIG. 20, the transparent cover 20 may include a fifth portion 23 protruding from an end of the transparent cover 20 in a direction toward the front substrate 110.

The fifth portion 23 may protrude from the third portion 21. The fifth portion 23 may prevent a foreign material such as dust from entering into a space between the front substrate 110 and the transparent cover 20.

Figure 21:
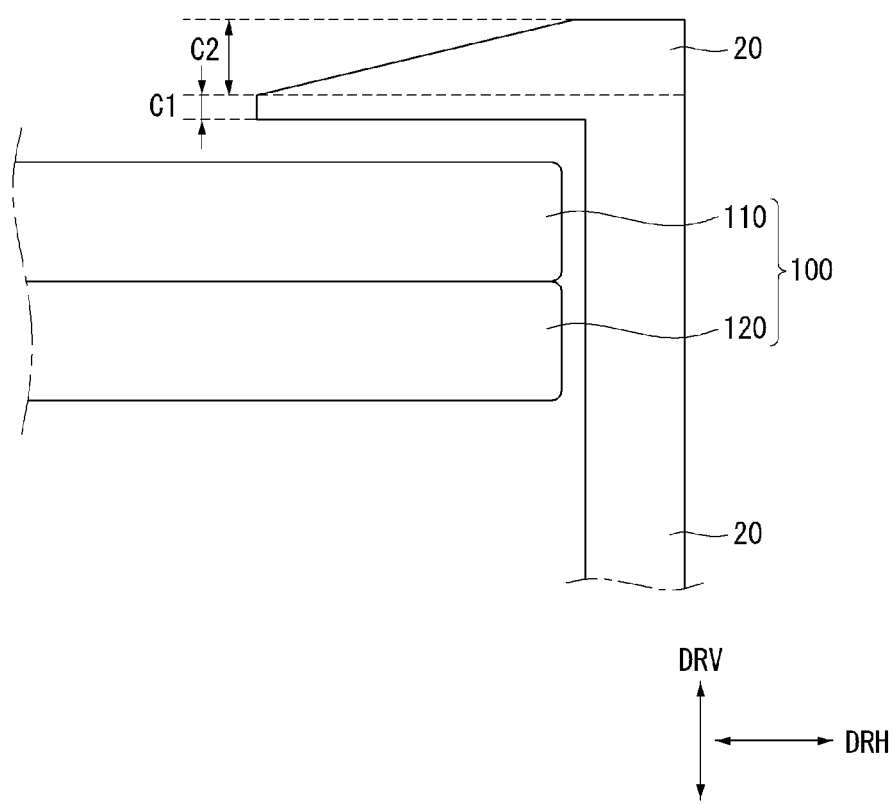

As shown in FIG. 21, the portion of the transparent cover 20 positioned in front of the display panel 100 may have a blunt end in a direction toward the middle of the display panel 100. Hence, the working stability may be improved.

In this instance, the portion of the transparent cover 20 positioned in front of the display panel 100 may include a portion having an inclined surface and a portion having a flat surface in the direction DRV vertical to the display panel 100.

A thickness C2 of the inclined portion may be greater than a thickness C1 of the flat portion.

Figure 22:
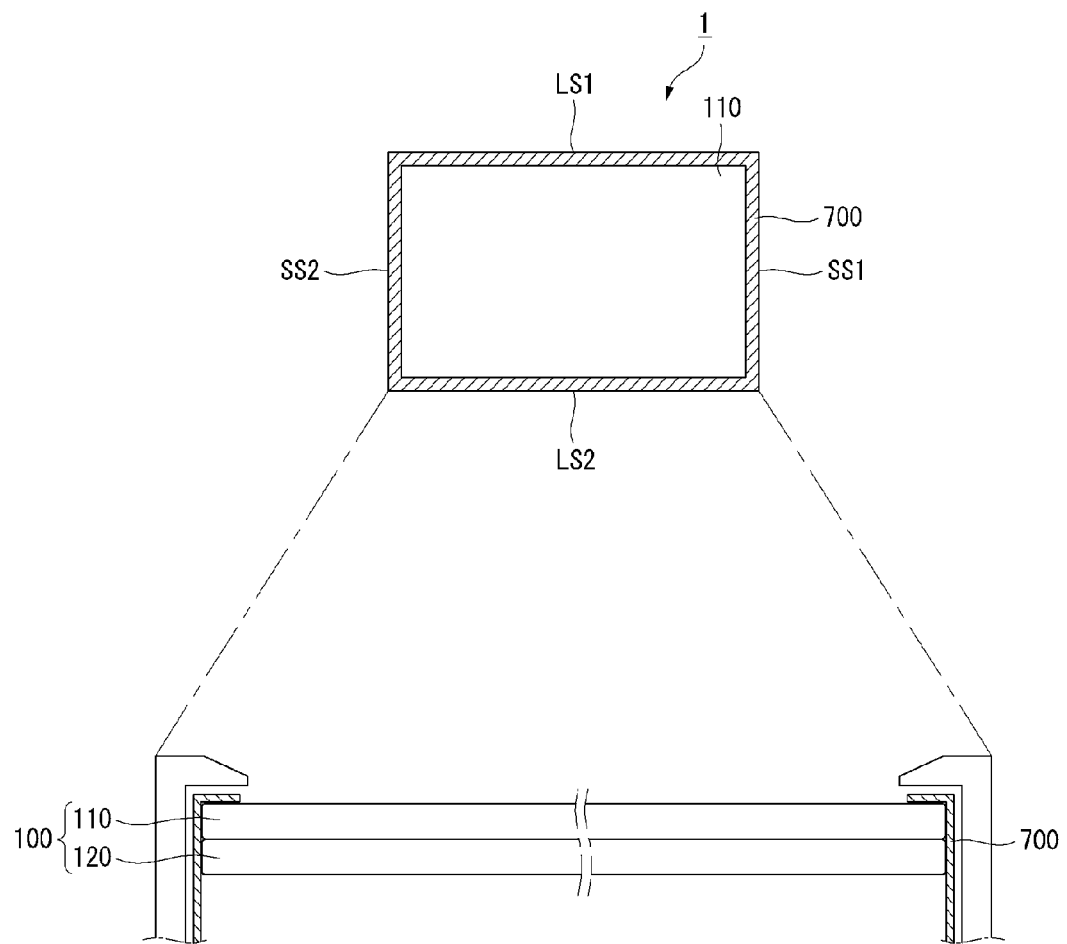

As shown in FIG. 22, the display device 1 according to the embodiment of the invention may further include a black frame 700. In the following description, the descriptions of the configuration and the structure described above are omitted. For example, configuration and structure of the transparent cover 20 may correspond to those described above.

The active area AA and the dummy area DA of the display panel 100 may be distinguished from each other by the black frame 700.

For example, a formation area of the black frame 700 may indicate the dummy area DA, and an area inside the black frame 700 may indicate the active area AA.

As shown in FIG. 22, the black frame 700 may be disposed at an edge of the display panel 100. The black frame 700 may be almost black. Other colors may be used for the black frame 700.

The black frame 700 may include a portion positioned between the front substrate 110 and the transparent cover 20. Further, the black frame 700 may include a portion positioned between the side of the display panel 100 and the transparent cover 20.

Figure 23:
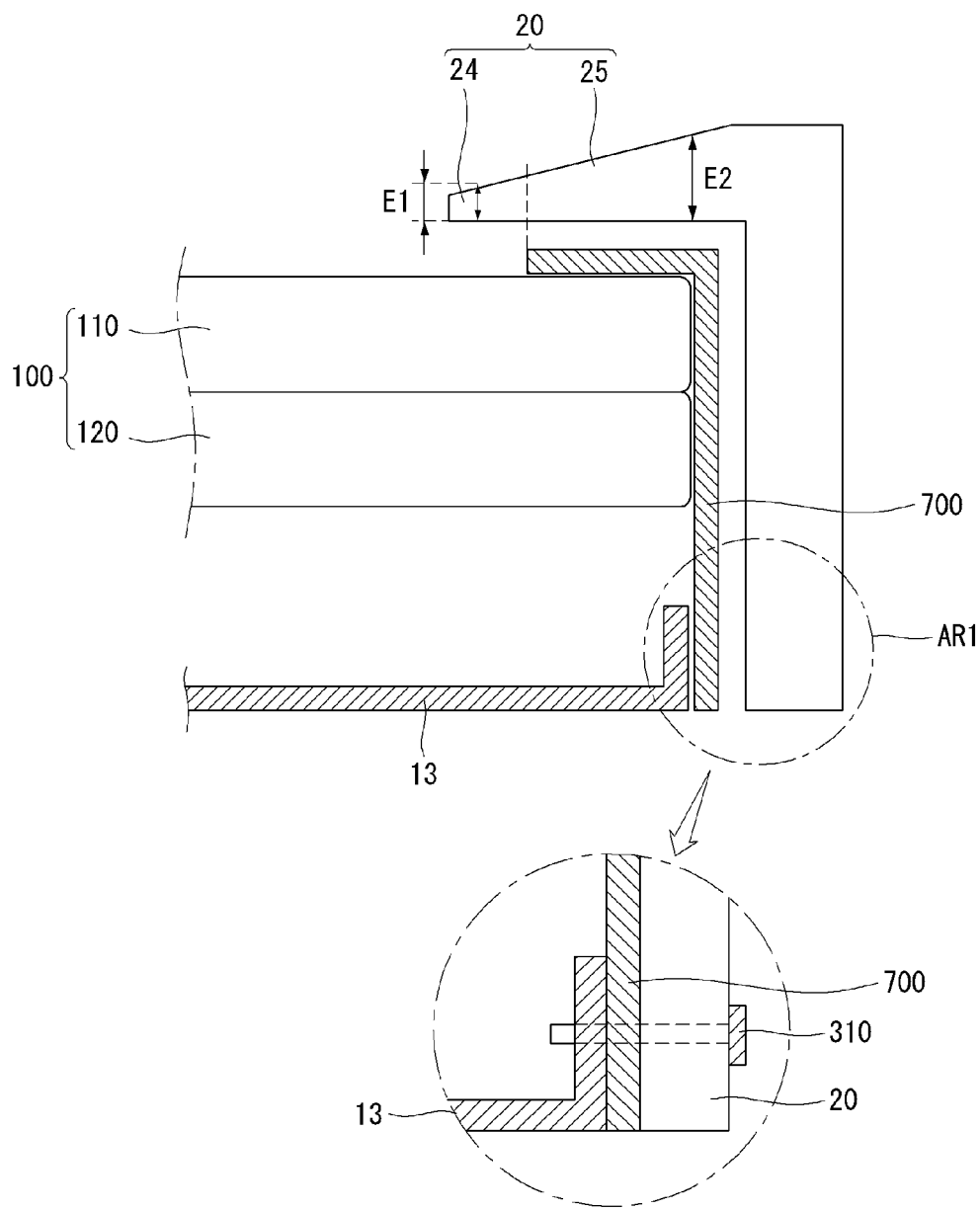

As indicated by a circle AR1 shown in FIG. 23, the black frame 700 may further include a portion positioned between the transparent cover 20 and the back cover 13 in the direction DRH horizontal to the display panel 100.

In this instance, the black frame 700, the back cover 13, and the transparent cover 20 may be fastened to one another by a second fastening part 310 such as a screw.

The transparent cover 20 may extend further than the black frame 700 by a predetermined length toward the middle of the display panel 100 in a longitudinal direction of the display panel 100 (i.e., the direction DRH horizontal to the display panel 100). Hence, a portion of the transparent cover 20 positioned in front of the display panel 100 may be divided into a seventh portion 25 overlapping the black frame 700 in the direction DRV vertical to the display panel 100 and a sixth portion 24 not overlapping the black frame 700.

Even when the black frame 700 is formed, the transparent cover 20 may include a portion having a gradually changing thickness. Hence, a thickness E1 of the sixth portion 24 may be less than a thickness E2 of the seventh portion 25.

Figure 24:
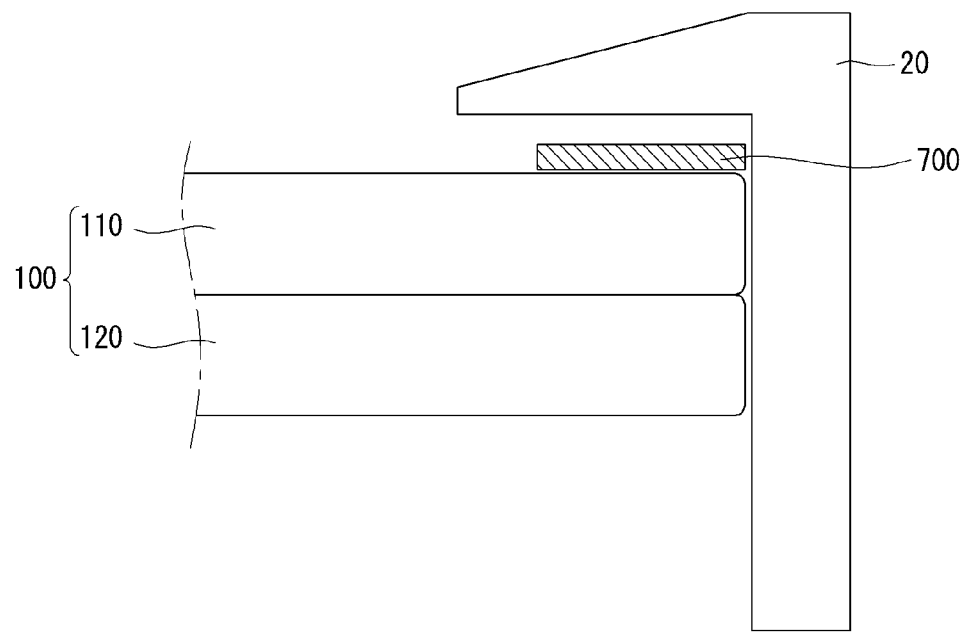

As shown in FIG. 24, the black frame 700 may include a portion positioned in the front of the front substrate 110 and may include a portion positioned on the side of the display panel 100. In this instance, the black frame 700 may be attached to a front surface of the front substrate 110.

Figure 25:
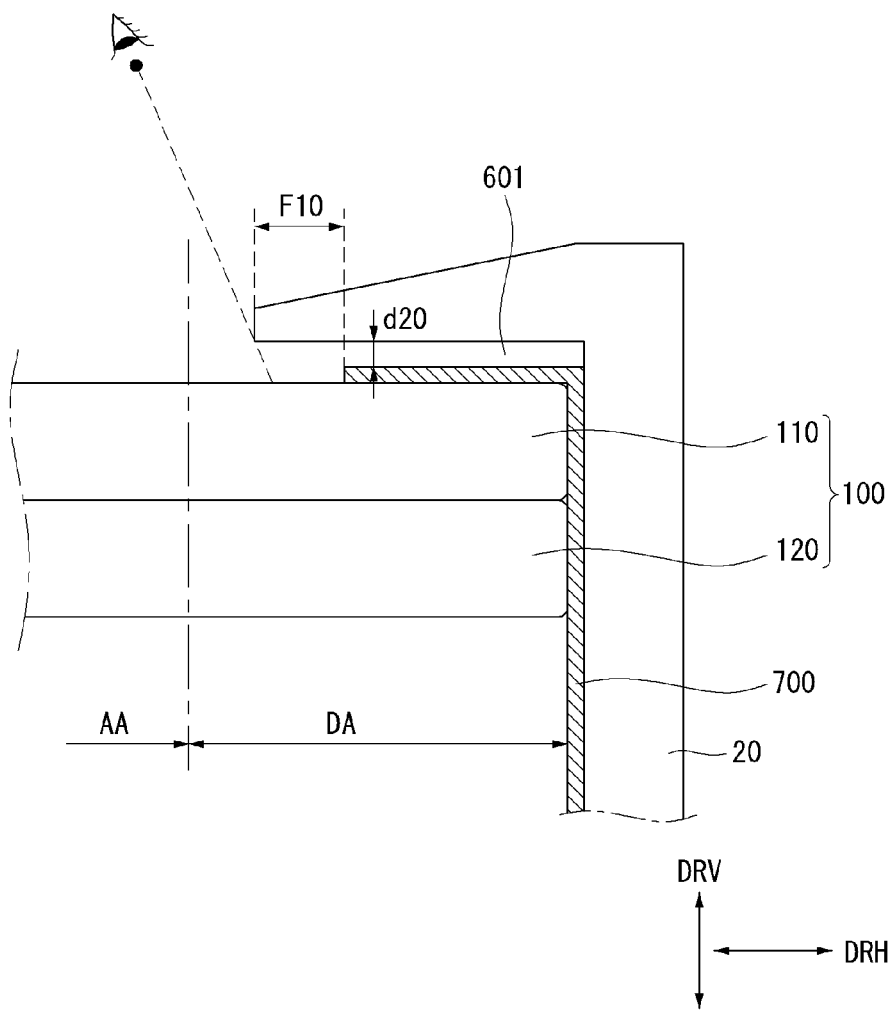

As shown in FIG. 25, when the transparent cover 20 extend further than the black frame 700 by a predetermined length F10 toward the middle of the display panel 100 in the direction DRH horizontal to the display panel 100, the viewer may be prevented from directly observing the black frame 700. Namely, the viewer may indirectly observe the black frame 700 through the transparent cover 20. Hence, the black frame 700 may look smaller than its actual size.

Further, as shown in FIG. 25, the black frame 700 may be separated from the transparent cover 20 by a predetermined distance d20. Hence, a third air layer 601 may be formed between a front surface of the transparent cover 20 and the black frame 700.

As above, when the black frame 700 is separated from the transparent cover 20 by the predetermined distance d20 and the third air layer 601 is formed between the front surface of the transparent cover 20 and the black frame 700, the visual effect of the smaller size of the bezel area or the black frame 700 of the display device 1 may be obtained.

Further, when the black frame 700 is separated from the transparent cover 20 by the predetermined distance d20, the distance d20 between the front surface of the transparent cover 20 and the black frame 700 may be different from the length F10 of the portion of the transparent cover 20 which extends further than the black frame 700 toward the middle of the display panel 100 in the direction DRH horizontal to the display panel 100.

For example, the distance d20 is less than the length F10. In this instance, the viewer viewing the image cannot see the black frame 700.

Figure 26:
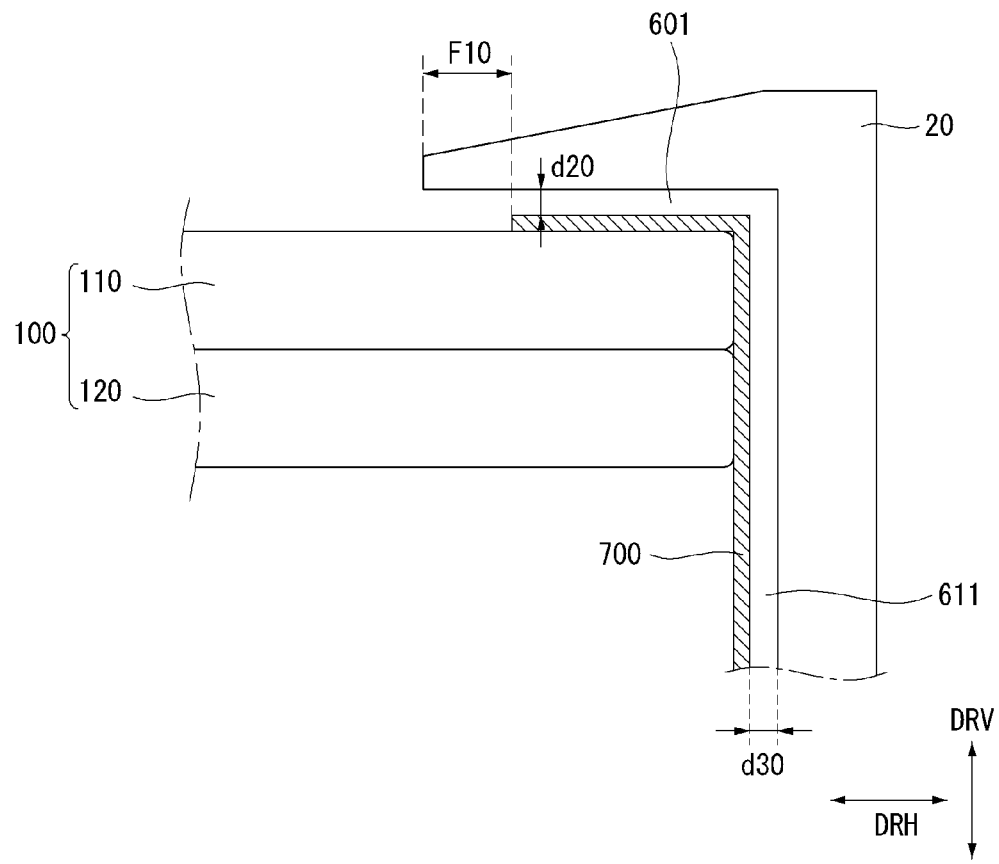

As shown in FIG. 26, the black frame 700 may be separated from the transparent cover 20 by a predetermined distance d30 in the direction DRH horizontal to the display panel 100. Hence, a fourth air layer 611 may be formed between the side of the transparent cover 20 and the black frame 700.

As above, when the black frame 700 is separated from the transparent cover 20 by the predetermined distance d30 and the fourth air layer 611 is formed between the side of the transparent cover 20 and the black frame 700, colors of the black frame 700 may be prevented from running on the transparent cover 20. Hence, the visual effect of the smaller size of the bezel area of the display device 1 may be obtained.

Further, it does not matter that the distance d30 between the side of the transparent cover 20 and the black frame 700 in the direction DRH horizontal to the display panel 100 is narrow. For example, the distance d30 between the side of the transparent cover 20 and the black frame 700 in the direction DRH horizontal to the display panel 100 may be less than the distance d20 between the front surface of the transparent cover 20 and the black frame 700 in the direction DRV vertical to the display panel 100.

Figure 27:
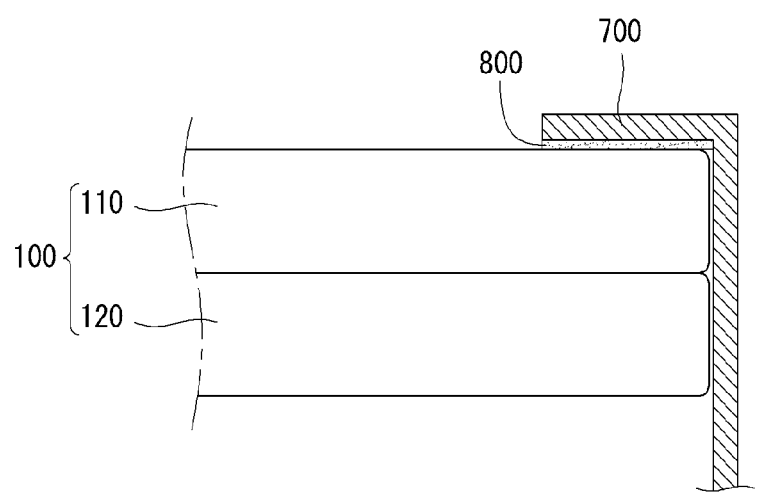

The black frame 700 may be manufactured in the form of a tape. In this instance, as shown in FIG. 27, the black frame 700 may include a portion attached to the front substrate 110. For this, a first adhesive layer 800 may be formed between the black frame 700 and the front substrate 110.

As above, when the black frame 700 is manufactured in the form of a tape, a simple process for attaching the black frame 700 of the tape form to the display panel 100 may be used. Therefore, time required in the manufacturing process may be reduced.

Further, when the black frame 700 is manufactured in the form of a tape, the black frame 700 may include a portion attached to the side of the front substrate 110.

The black frame 700 may contain a metal material.

For example, the black frame 700 may be manufactured by forming a frame using the metal material such as aluminum (Al) and then painting a black paint on the surface of the frame.

In this instance, as shown in FIG. 23, a fastening strength between the black frame 700, the transparent cover 20, and the back cover 13 may be further improved. Hence, the structural stability of the display device 1 may be improved.

Figure 28:
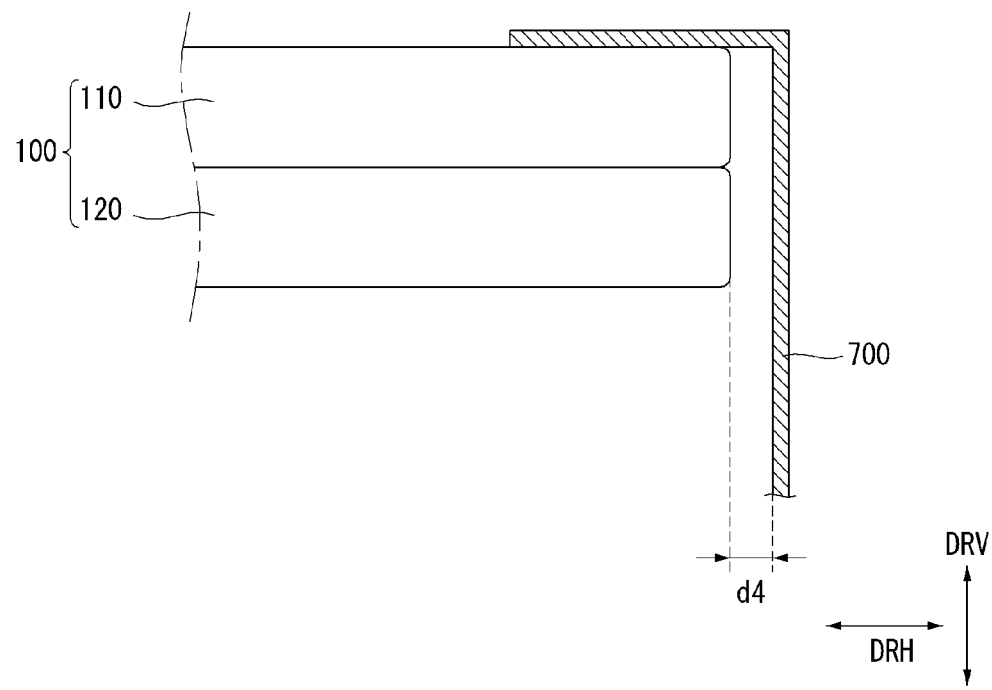

As shown in FIG. 28, when the black frame 700 contains the metal material, the black frame 700 may be separated from the side of the display panel 100 by a predetermined distance d4. In this instance, a collision between the black frame 700 and the side of the display panel 100 may be prevented. Hence, a damage of the display panel 100 may be prevented.

The transparent cover 20 may include a protrusion, so as to secure a predetermined distance between the transparent cover 20 and the black frame 700.

Figure 29:
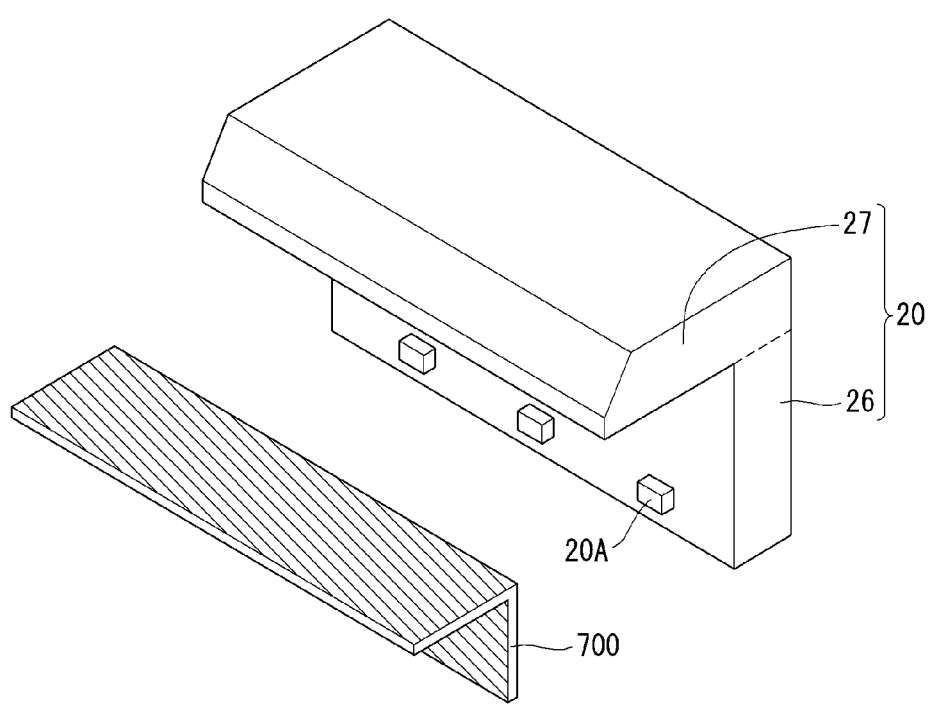

More specifically, as shown in FIG. 29, the transparent cover 20 may include a plurality of first protrusions 20A each protruding toward the black frame 700.

The first protrusions 20A may protrude toward the black frame 700 in the direction DRH horizontal to the display panel 100.

The transparent cover 20 may include a horizontal part 27 horizontal to the display panel 100 and a vertical part 26 vertical to the display panel 100.

The first protrusions 20A may protrude from the vertical part 26 of the transparent cover 20 toward the black frame 700.

Figure 30:
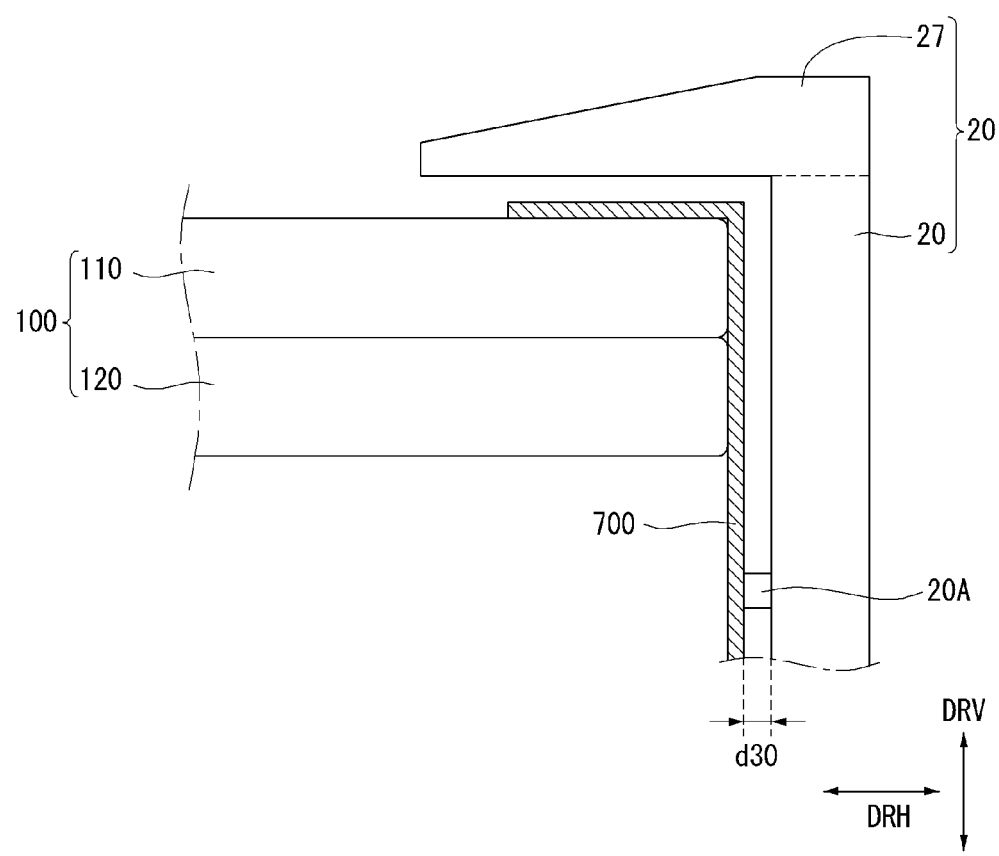

In this instance, as shown in FIG. 30, each first protrusion 20A may be configured so that the vertical part 26 of the transparent cover 20 and the black frame 700 do not contact each other by securing the predetermined distance d30 between the vertical part 26 of the transparent cover 20 and the black frame 700.

Figure 31:
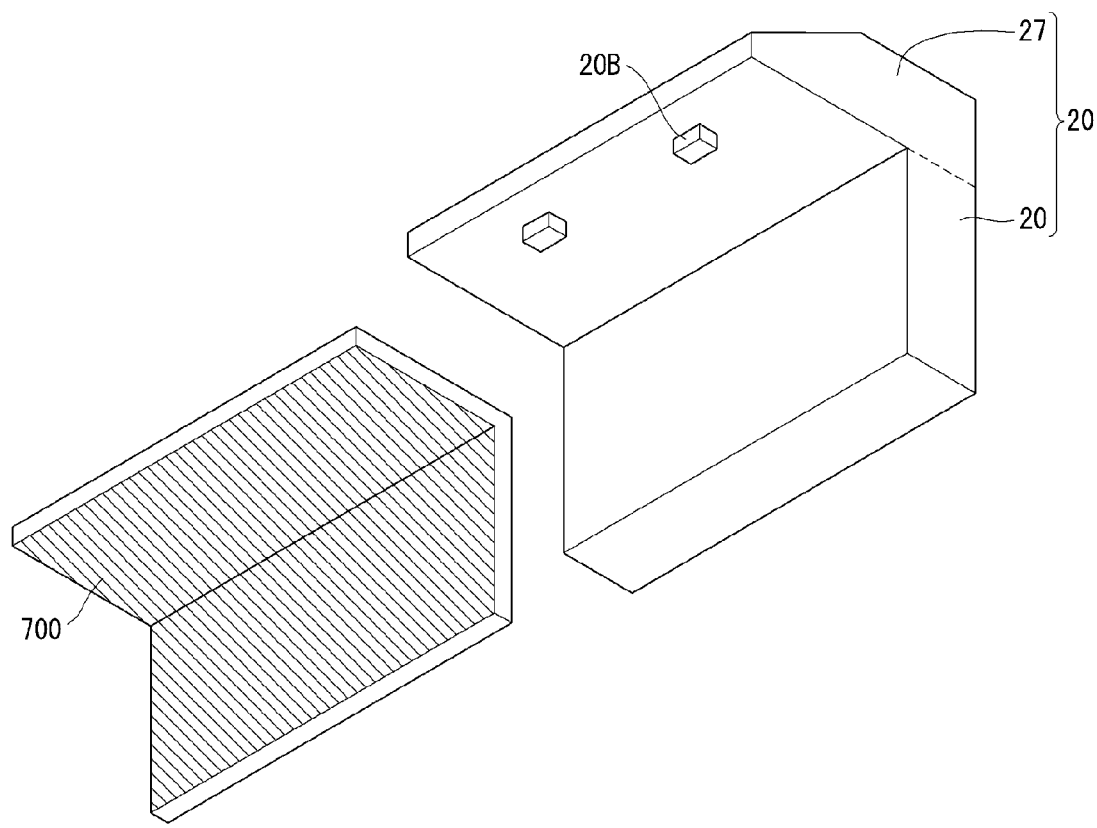

Alternatively, as shown in FIG. 31, the transparent cover 20 may include a plurality of second protrusions 20B.

The second protrusions 20B may protrude toward the black frame 700 in the direction DRV vertical to the display panel 100. In other words, the second protrusions 20B may protrude from the horizontal part 27 of the transparent cover 20 toward the black frame 700.

Figure 32:
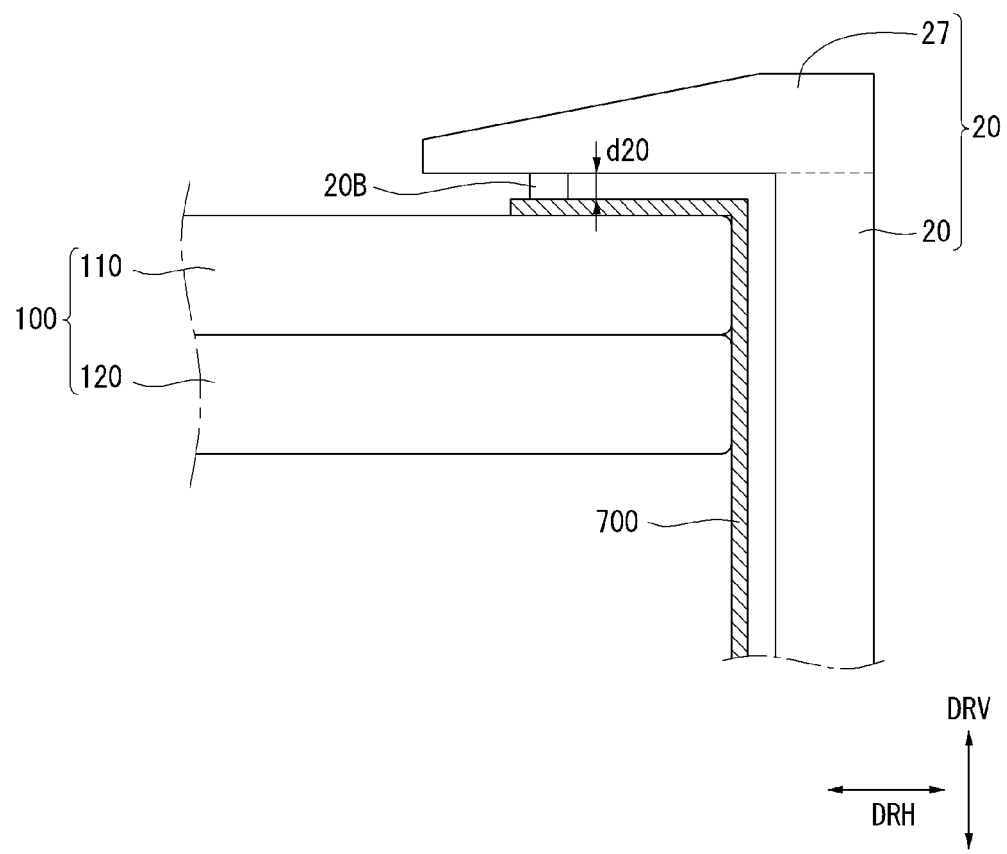

In this instance, as shown in FIG. 32, each second protrusion 20B may be configured so that the horizontal part 27 of the transparent cover 20 and the black frame 700 do not contact each other by securing the predetermined distance d20 between the horizontal part 27 of the transparent cover 20 and the black frame 700.

Further, the first and second protrusions 20A and 20B may contact the black frame 700.

Figure 33:
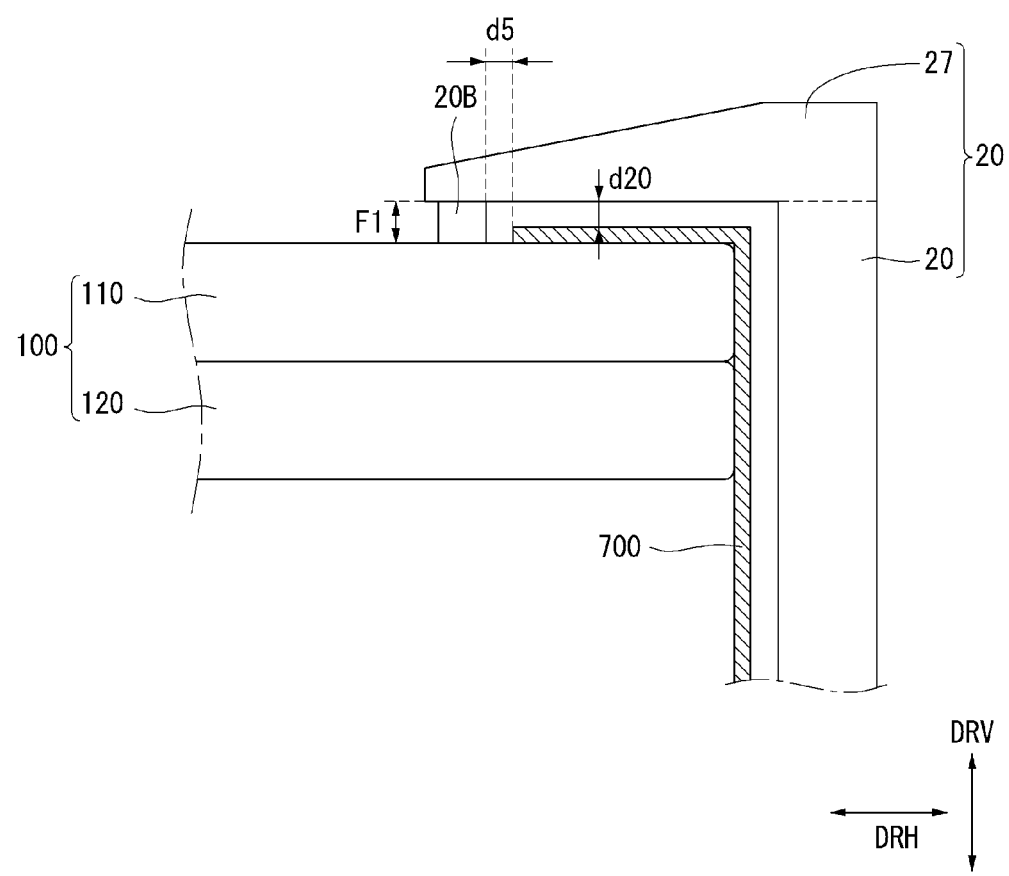

Alternatively, as shown in FIG. 33, the second protrusion 20B may not contact the black frame 700 and may contact the front substrate 110. Hence, the second protrusion 20B may be separated from the black frame 700 by a predetermined distance d5 in the direction DRH horizontal to the display panel 100. A height F1 of the second protrusion 20B may be greater than the distance d20 between the horizontal part 27 of the transparent cover 20 and the black frame 700.

In this instance, the second protrusion 20B may be configured so that the horizontal part 27 of the transparent cover 20 and the black frame 700 do not contact each other by securing the predetermined distance d20 between the horizontal part 27 of the transparent cover 20 and the black frame 700. Further, the second protrusion 20B may prevent a foreign material from entering into a space between the front substrate 110 and the transparent cover 20.

The display device 1 according to the embodiment of the invention may further include a reflective layer 900 disposed between the transparent cover 20 and the black frame 700.

Figure 34:
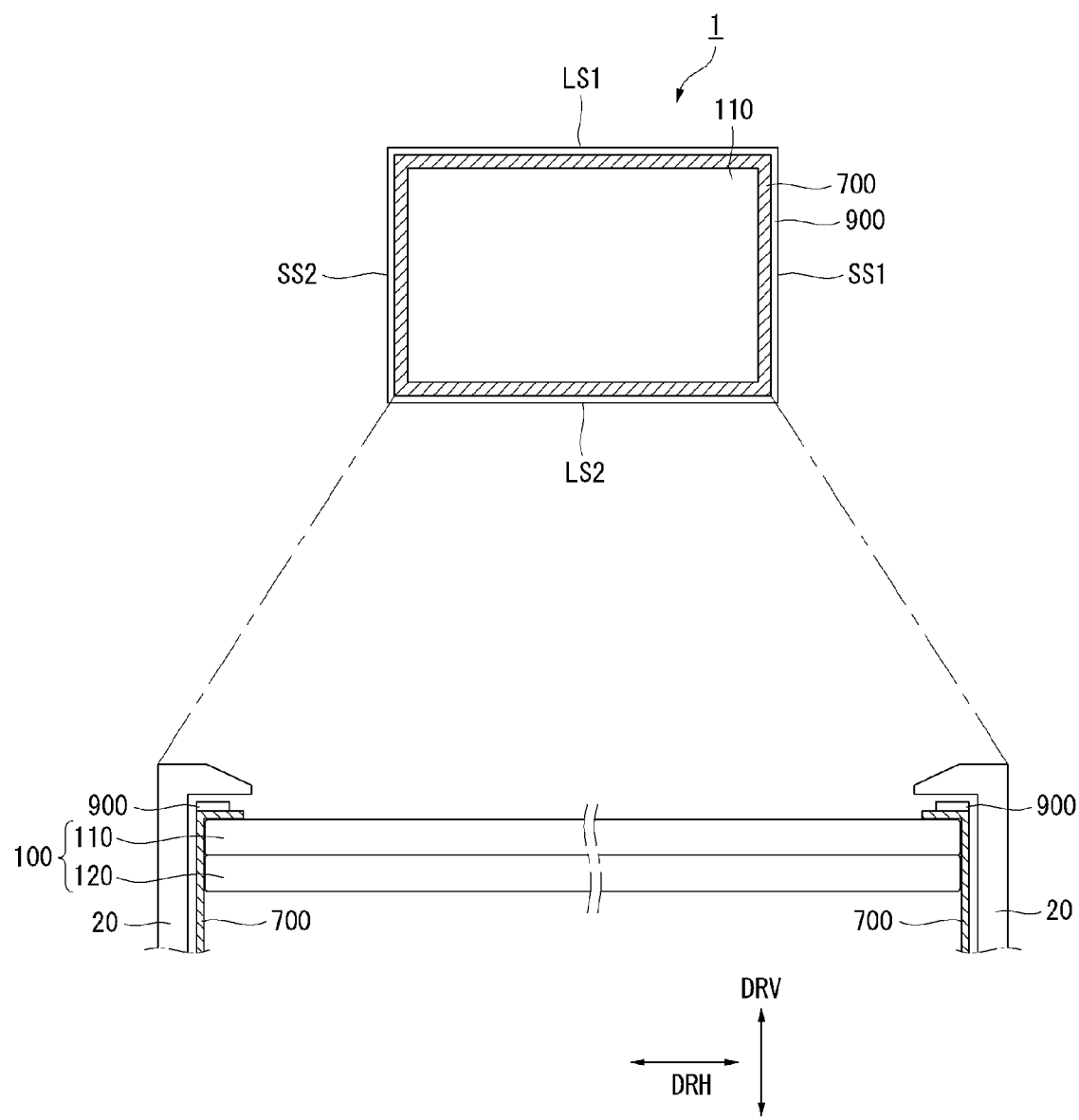

More specifically, as shown in FIG. 34, the reflective layer 900 may be disposed at the edge of the display panel 100. The reflective layer 900 may have various materials and shapes under condition that it can reflect incident light. For example, the reflective layer 900 may contain a metal material which has an excellent reflectance and thus may be used as a mirror.

The reflective layer 900 may include a portion positioned between the transparent cover 20 and the black frame 700 in front of the display panel 100.

Figure 35:
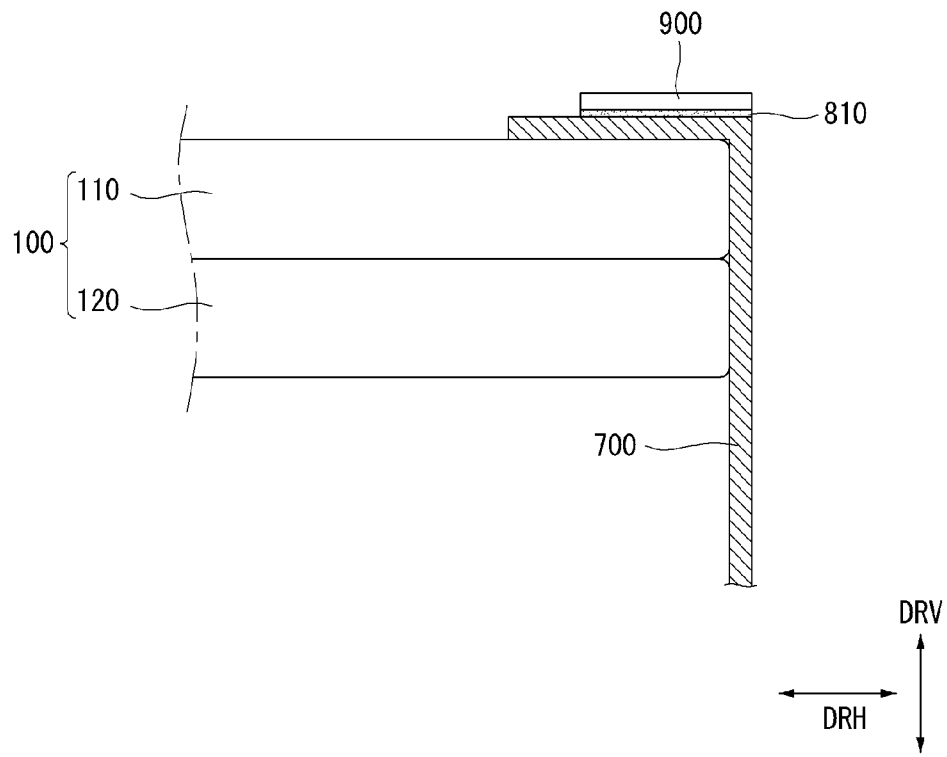

The reflective layer 900 may include a portion attached to the black frame 700. For this, as shown in FIG. 35, a second adhesive layer 810 may be disposed between the reflective layer 900 and the black frame 700.

Figure 36:
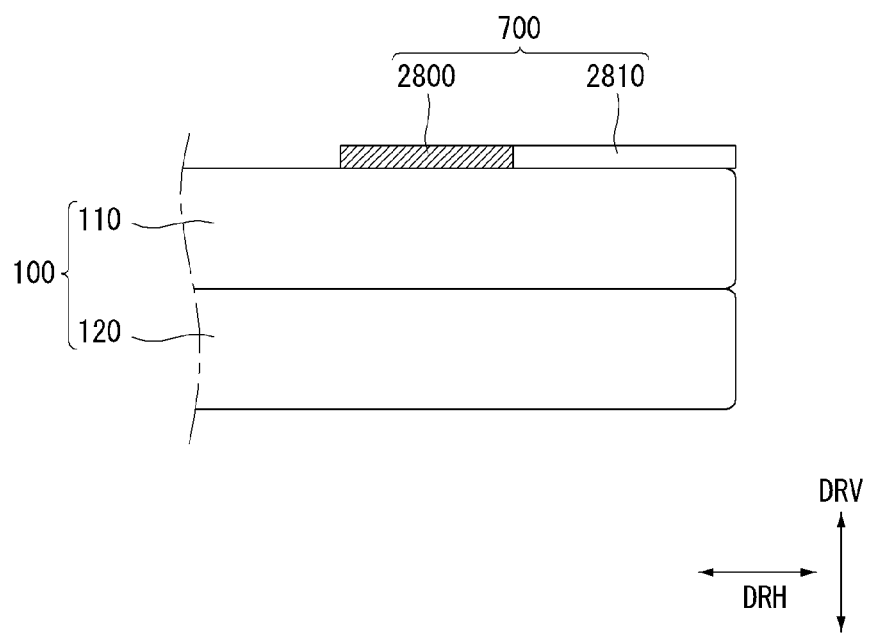

Alternatively, the reflective layer 900 may be a portion of the black frame 700. In other words, the black frame 700 and the reflective layer 900 may form an integral body. For example, as shown in FIG. 36, the black frame 700 may include a black part 2800 and a reflective part 2810. A reflectance of the reflective part 2810 may be greater than a reflectance of the black part 2800.

The black frame 700 may be manufactured by painting a black paint on the surface of a base formed of a metal material, for example, aluminum (Al) having a high reflectance. A portion of the base to form the reflective layer 900 may not be painted with the black paint and may be exposed.

Figure 37:
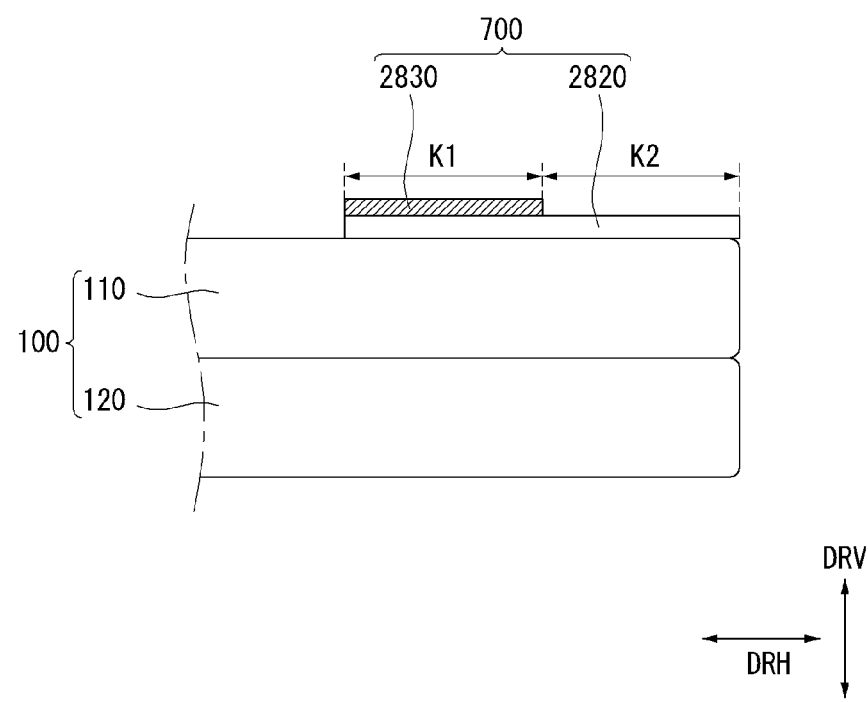

For example, as shown in FIG. 37, the black frame 700 may include a base 2820 and a paint part 2830 painted on the surface of a first area K1 of the base 2820. The base 2820 may be formed of a metal material having a high reflectance, and the paint part 2830 may be formed of a predetermined paint.

In this instance, a second area K2 of the black frame 700, in which the paint part 2830 is not formed, may serve as the reflective layer 900 capable of reflecting incident light.

As above, when the reflective layer 900 is formed in the bezel area of the display device 1, the visual effect of the smaller size of the bezel area of the display device 1 may be obtained by the reflection operation of the reflective layer 900.

Figure 38:
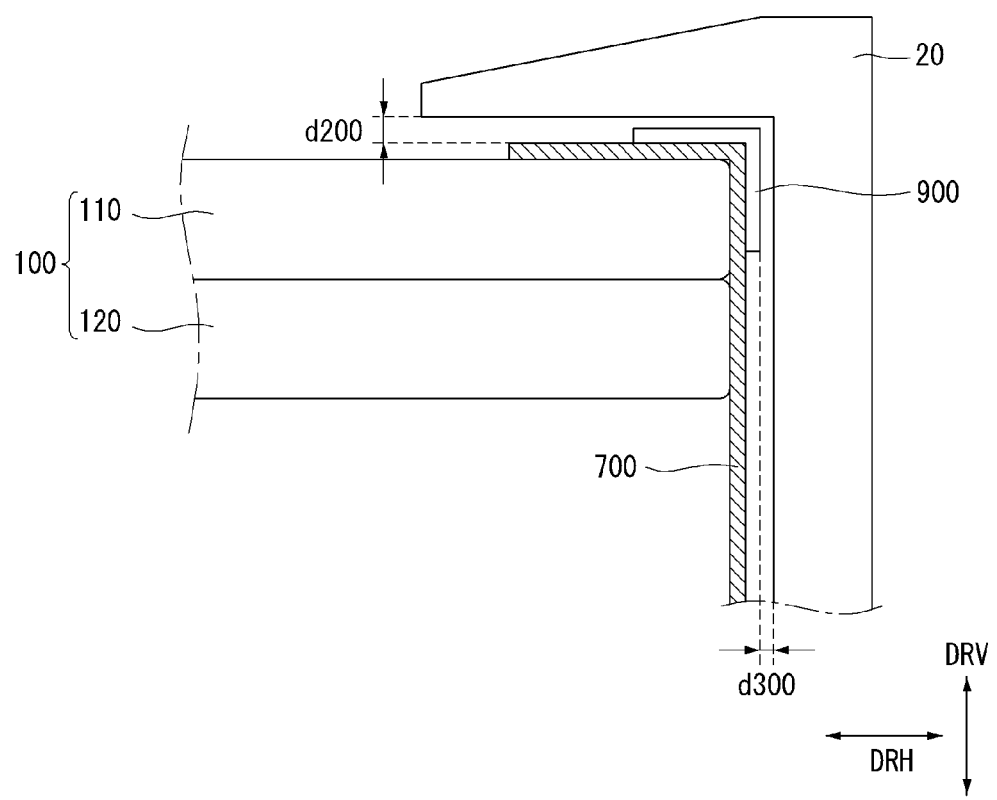

As shown in FIG. 38, the reflective layer 900 may be separated from the transparent cover 20 by a predetermined distance.

For example, the reflective layer 900 may be separated from the front surface of the front substrate 110 by a predetermined distance d200 in the direction DRV vertical to the display panel 100. Hence, an air layer may be formed between the reflective layer 900 and the front surface of the front substrate 110.

Further, the reflective layer 900 may be separated from the end of the front substrate 110 by a predetermined distance d300 in the direction DRH horizontal to the display panel 100. Hence, an air layer may be formed between the reflective layer 900 and the end of the front substrate 110.

Figure 39:
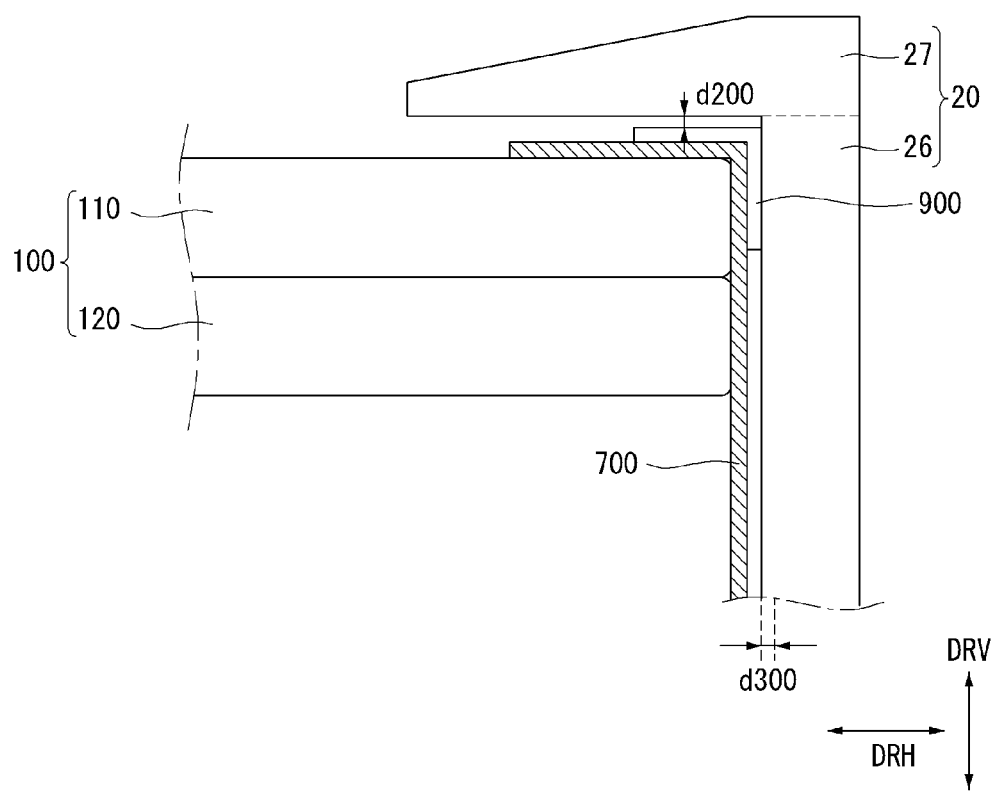

The reflective layer 900 may include a portion contacting the black frame 700. For example, as shown in FIG. 39, when the reflective layer 900 includes a portion positioned between the black frame 700 and the transparent cover 20 in the direction DRH horizontal to the display panel 100, the portion of the reflective layer 900 between the black frame 700 and the transparent cover 20 in the direction DRH horizontal to the display panel 100 may contact the transparent cover 20.

When the reflective layer 900 is disposed between the black frame 700 and the transparent cover 20, the viewer may perceive that a portion of the black frame 700 disappears by the reflection operation of the reflective layer 900. Therefore, even if the portion of the reflective layer 900 positioned between the black frame 700 and the transparent cover 20 in the direction DRH horizontal to the display panel 100 contacts the transparent cover 20, the visual effect of the smaller size of the bezel area of the display device 1 may not be reduced.

Figure 40:
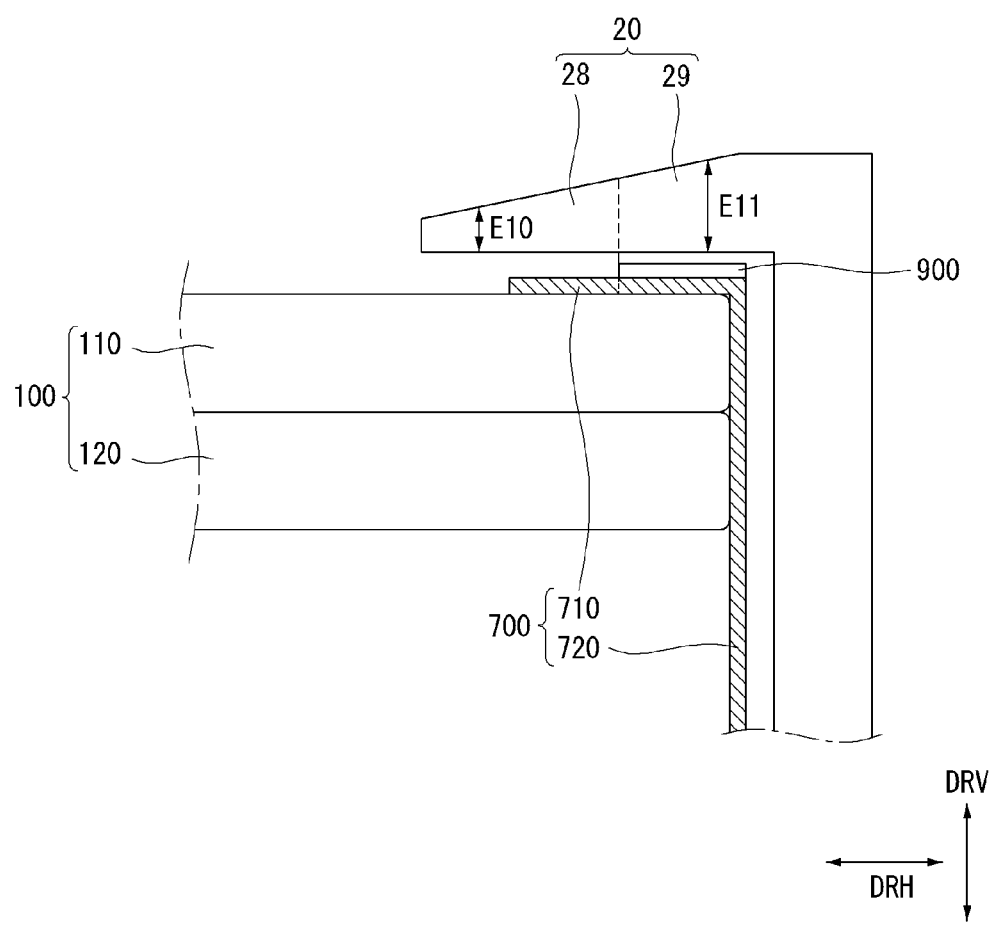

The size of the reflective layer 900 may be less than the size of the black frame 700. Hence, the black frame 700 may be divided into an area overlapping the reflective layer 900 and an area not overlapping the reflective layer 900. For example, as shown in FIG. 40, the black frame 700 may include a first portion 720 overlapping the reflective layer 900 and a second portion 710 not overlapping the reflective layer 900 in the direction DRV vertical to the display panel 100.

A thickness E11 of a portion 29 of the transparent cover 20 overlapping the first portion 720 of the black frame 700 in the direction DRV vertical to the display panel 100 may be different from a thickness E10 of a portion 28 of the transparent cover 20 overlapping the second portion 710 of the black frame 700 in the direction DRV vertical to the display panel 100.

For example, when the first portion 720 of the black frame 700 is disposed between the side surface of the display panel 100 and the second portion 710 of the black frame 700 in the longitudinal direction of the display panel 100, i.e., the direction DRH horizontal to the display panel 100, the thickness E11 of the portion 29 of the transparent cover 20 may be greater than the thickness E10 of the portion 28 of the transparent cover 20.

The transparent cover 20 may have a multi-layered structure.

Figure 41:
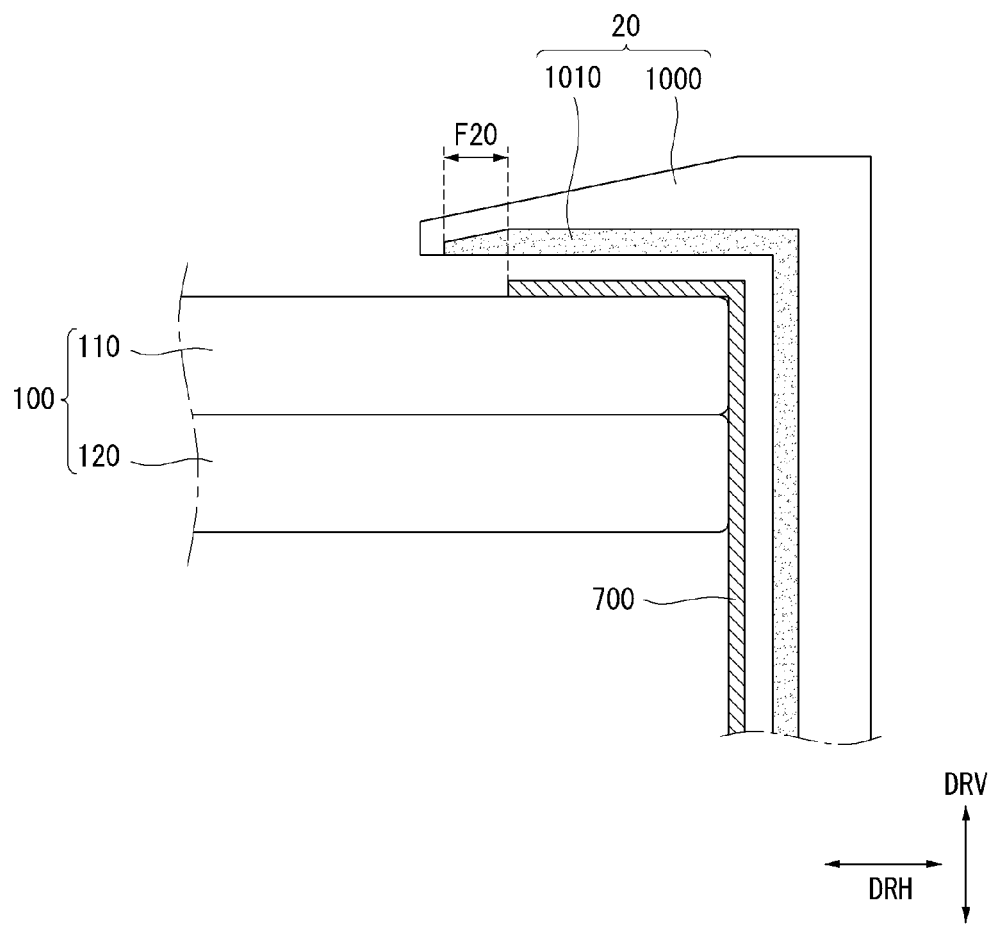

For example, as shown in FIG. 41, the transparent cover 20 may include a first transparent part 1000 and a second transparent part 1010.

When the second transparent part 1010 is disposed between the first transparent part 1000 and the black frame 700, a refractive index of the second transparent part 1010 may be greater than a refractive index of the first transparent part 1000. In this instance, the visual effect of the smaller size of the bezel area of the display device 1 may further increase.

The second transparent part 1010 of the transparent cover 20 may extend further than the black frame 700 by a predetermined distance F20 toward the middle of the display panel 100 in the direction DRH horizontal to the display panel 100.

Figure 42:
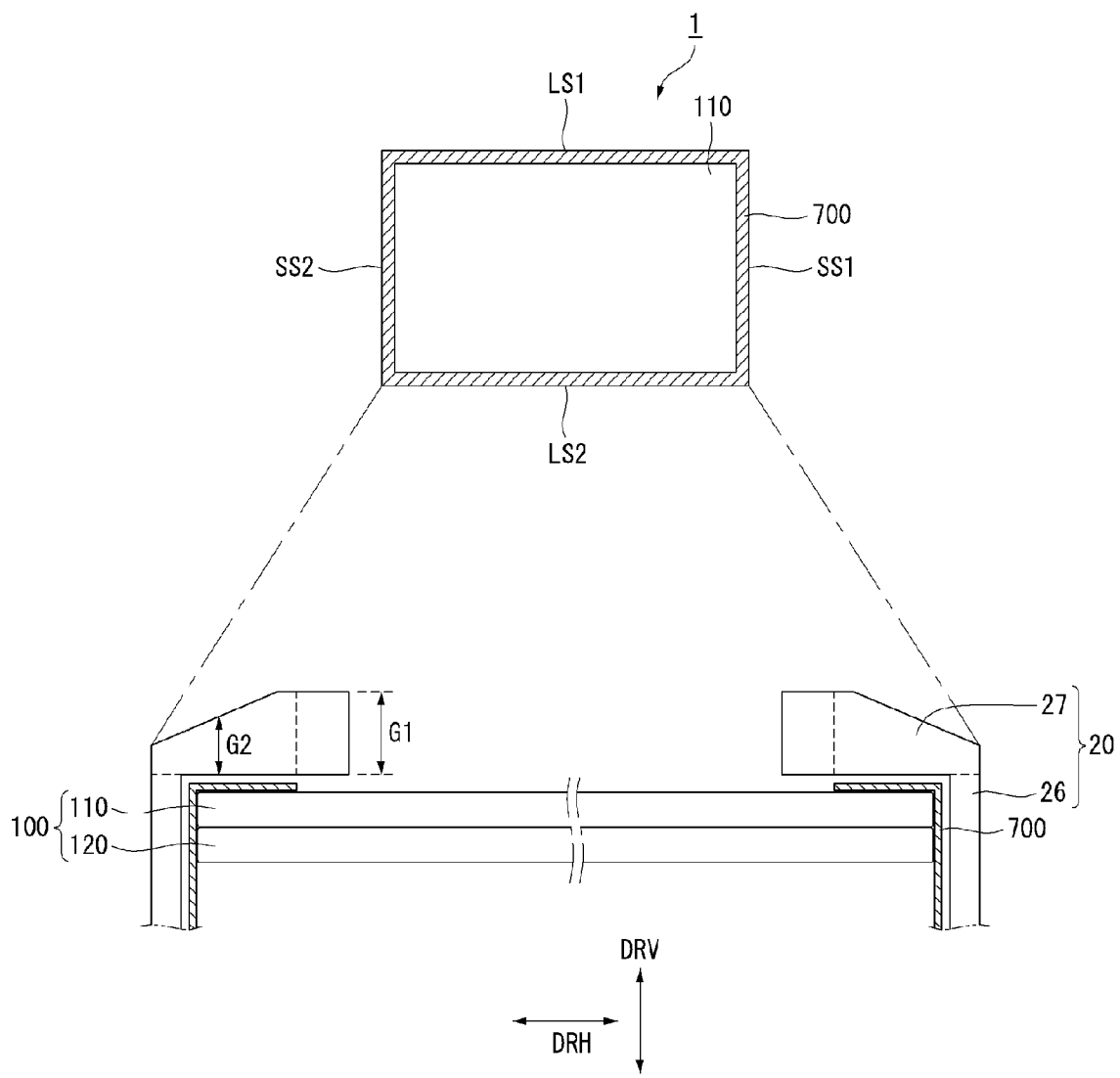
FIGS. 42 and 43 illustrate another configuration of a display device according to an example embodiment of the invention.
Figure 43:
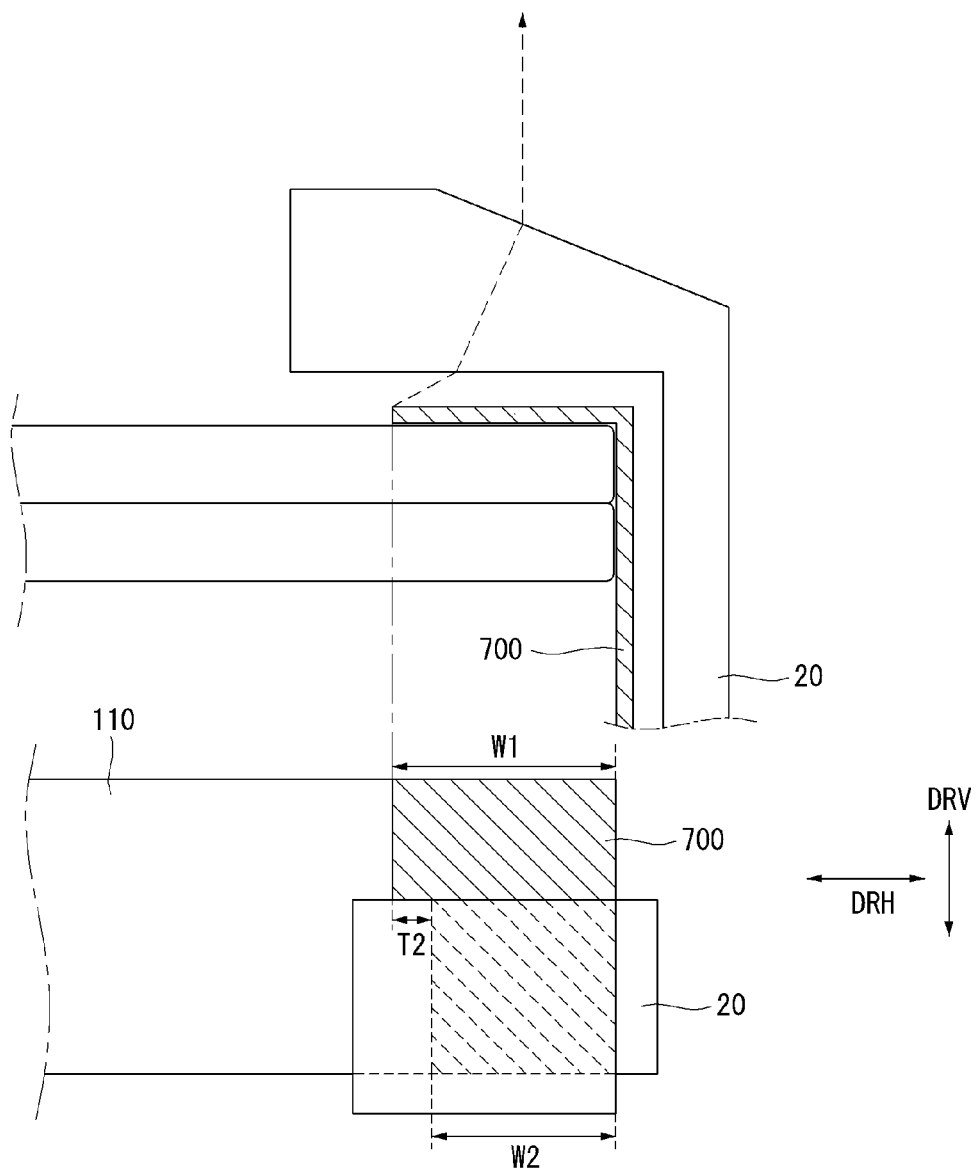

FIGS. 42 and 43 illustrate another configuration of the display device according to the example embodiment of the invention. In the following description, the descriptions of the configuration and the structure described above are omitted.

As shown in FIG. 42, the transparent cover 20 may include a portion which has a gradually increasing thickness as it approaches the middle of the display panel 100 in the direction DRH horizontal to the display panel 100.

For example, when the transparent cover 20 includes a portion overlapping the black frame 700 and a portion not overlapping the black frame 700 in the direction DRV vertical to the display panel 100, a thickness G2 of the portion of the transparent cover 20 overlapping the black frame 700 in the direction DRV vertical to the display panel 100 may be less than a thickness G1 of the portion of the transparent cover 20 not overlapping the black frame 700 in the direction DRV vertical to the display panel 100.

In other words, in the horizontal part 27 of the transparent cover 20, the thickness G2 of the portion overlapping the black frame 700 in the direction DRV vertical to the display panel 100 may be less than the thickness G1 of the portion not overlapping the black frame 700 in the direction DRV vertical to the display panel 100.

In the structure illustrated in FIG. 42, a boundary between the black frame 700 and the front substrate 110 may seem to move by a distance T2 in the direction away from the middle of the display panel 100 due to an optical effect illustrated in FIG. 43. Hence, the viewer may feel that the size of the black frame 700 may be reduced from W1 to W2.

FIGS. 44 to 66 illustrate another configuration of the display device according to the example embodiment of the invention. In the following description, the descriptions of the configuration and the structure described above are omitted.

Figure 44:
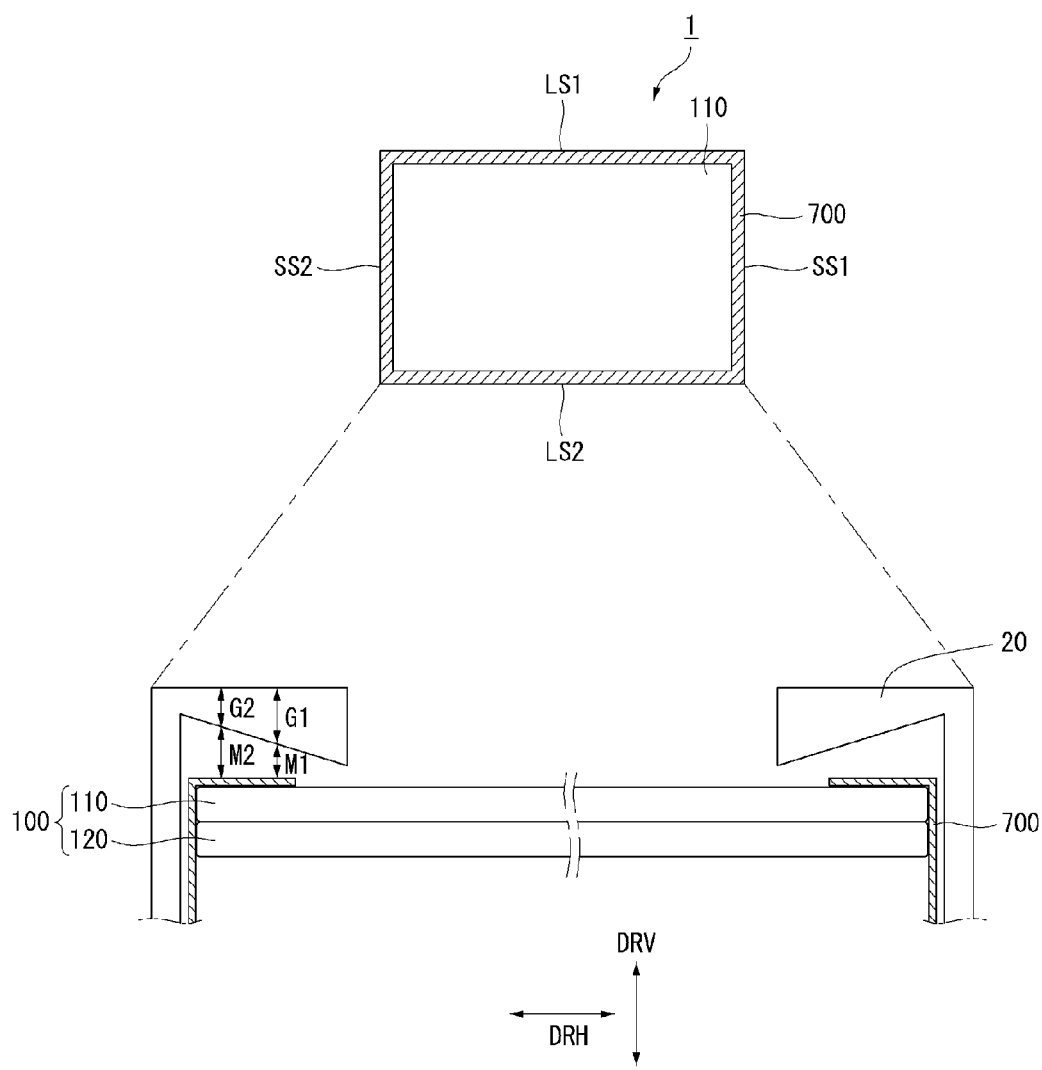
FIGS. 44 to 66 illustrate another configuration of a display device according to an example embodiment of the invention.
Figure 45:
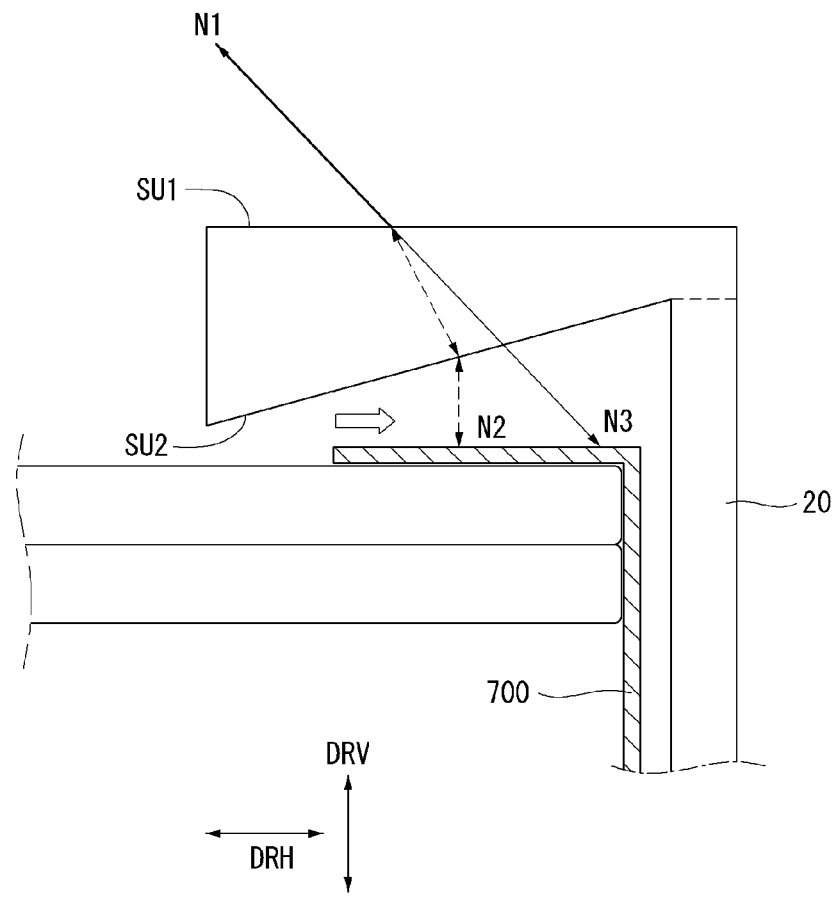

As shown in FIGS. 44 and 45, a distance between the transparent cover 20 and the black frame 700 may change depending on a location thereof.

For example, the distance between the transparent cover 20 and the black frame 700 may decrease as it approaches the middle of the display panel 100 in the direction DRH horizontal to the display panel 100.

It is assumed that there are a first part 27A of the transparent cover 20 and a second part 27B of the transparent cover 20 which is further away from the middle of the display panel 100 than the first part 27A in the direction DRH horizontal to the display panel 100.

In this instance, a distance M1 between the first part 27A of the transparent cover 20 and the black frame 700 may be less than a distance M2 between the second part 27B of the transparent cover 20 and the black frame 700.

Further, a thickness G1 of the first part 27A may be greater than a thickness G2 of the second part 27B. In other words, the transparent cover 20 may include a portion having the increasing thickness as it approaches the middle of the display panel 100 in the direction DRH horizontal to the display panel 100.

Even in the above-described structure, as shown in FIG. 43, the boundary between the black frame 700 and the front substrate 110 may seem to move in the direction away from the middle of the display panel 100 due to the optical effect.

Figure 46:
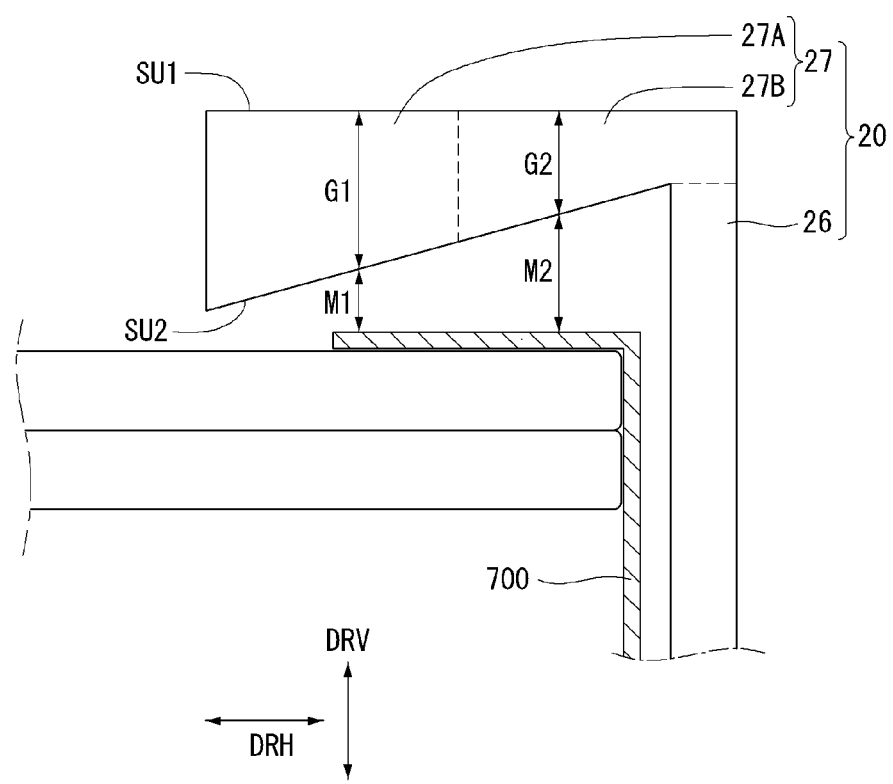

For example, as shown in FIG. 46, when the viewer at a position N1 sees a position N3, the viewer actually seeing the position N3 may observe a position N2. Hence, the viewer may perceive that the boundary between the black frame 700 and the front substrate 110 moves in the direction away from the middle of the display panel 100. This is generated by the refraction of light shown in FIG. 46.

In this instance, an inclined surface of the transparent cover 20, for example, a second surface SU2 of the transparent cover 20 shown in FIG. 45 may be disposed opposite the display panel 100 or the black frame 700.

Further, a first surface SU1 opposite the second surface SU2 of the transparent cover 20 may be parallel to the display panel 100. In this instance, a distance between the front substrate 110 and the first surface SU1 of the transparent cover 20 in the direction DRV vertical to the display panel 100 may be uniform irrespective of a location.

Alternatively, the distance between the transparent cover 20 and the black frame 700 may increase as it approaches the middle of the display panel 100 in the direction DRH horizontal to the display panel 100.

Figure 47:
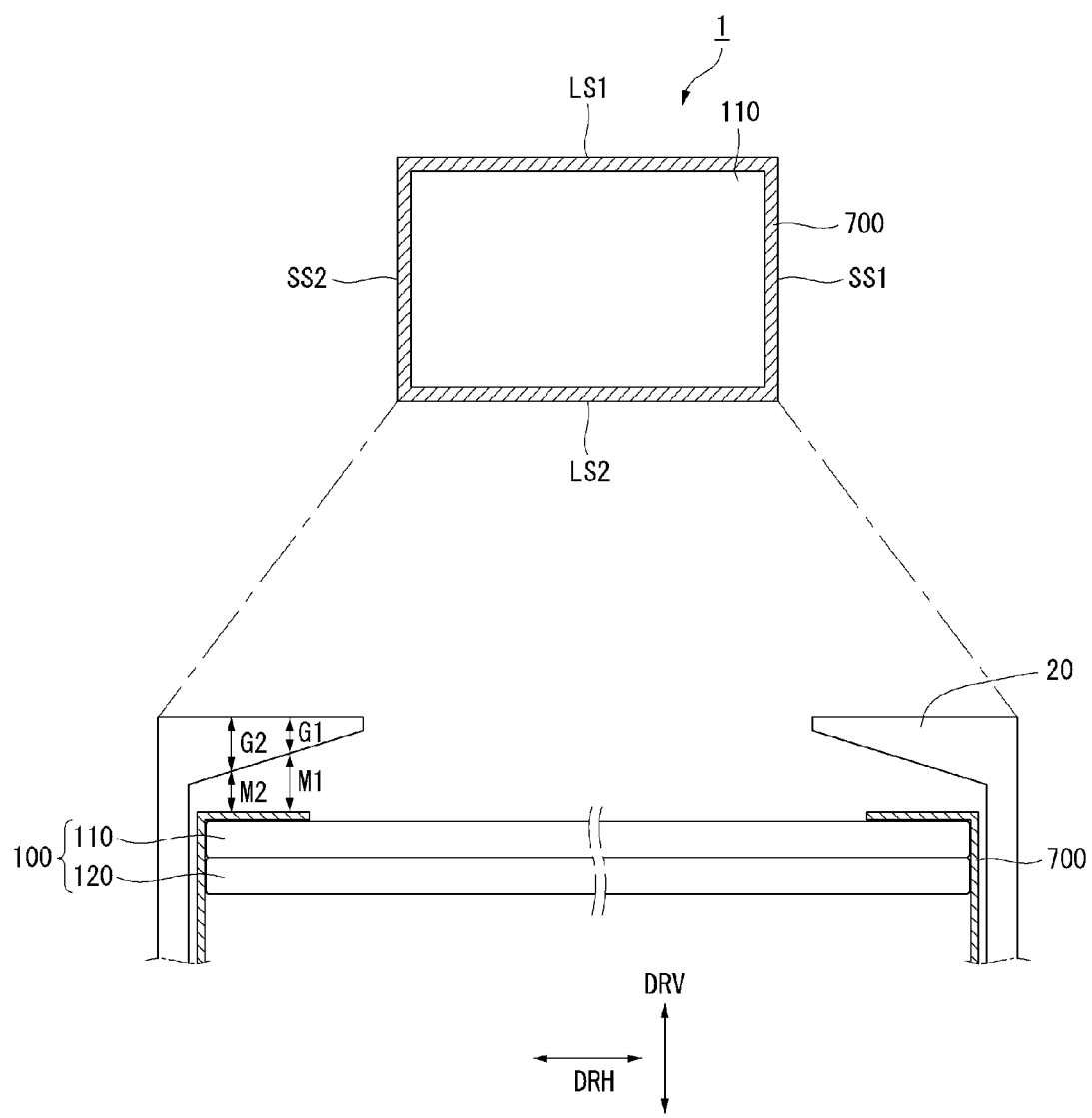
Figure 48:
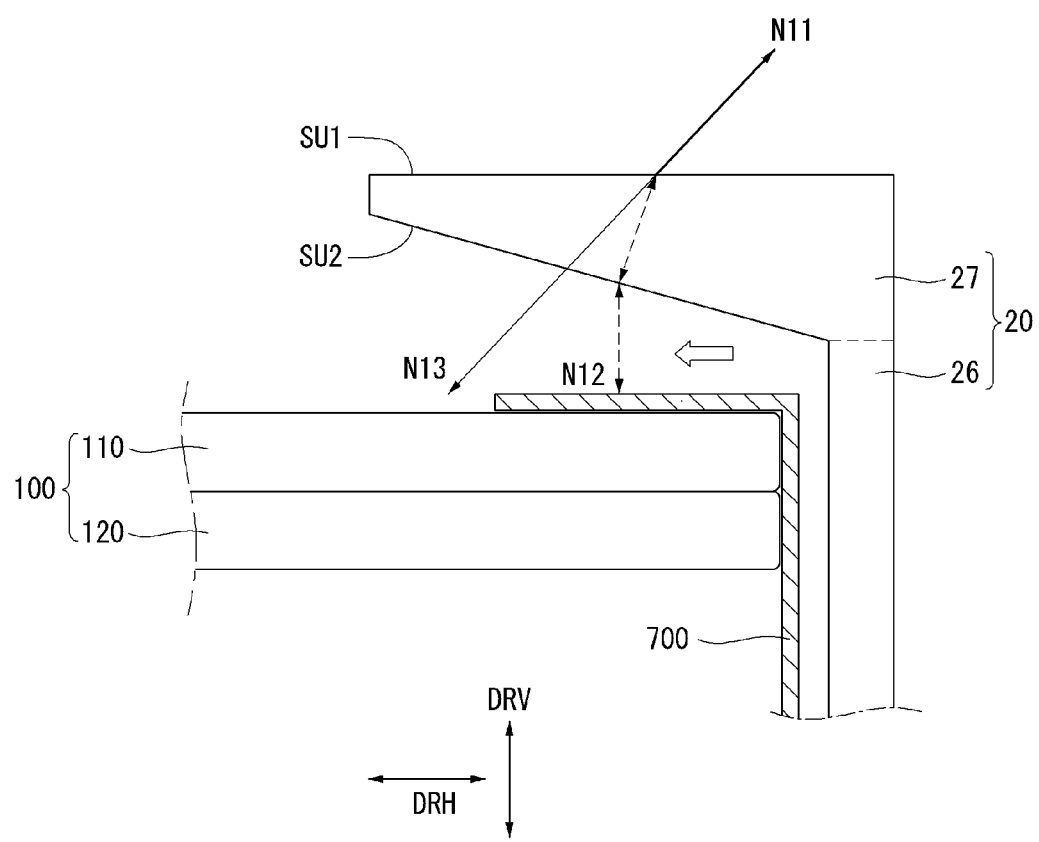

For example, as shown in FIGS. 47 and 48, it is assumed that there are a third part 27C of the transparent cover 20 and a fourth part 27D of the transparent cover 20 which is further away from the middle of the display panel 100 than the third part 27C in the direction DRH horizontal to the display panel 100.

In this instance, a distance M1 between the third part 27C of the transparent cover 20 and the black frame 700 may be greater than a distance M2 between the fourth part 27D of the transparent cover 20 and the black frame 700.

Further, a thickness G1 of the third part 27C may be less than a thickness G2 of the fourth part 27D. In other words, the transparent cover 20 may include a portion having the decreasing thickness as it approaches the middle of the display panel 100 in the direction DRH horizontal to the display panel 100.

Even in the above-described structure, as shown in (B) of FIG. 8, the end of the black frame 700 may seem to move to the middle of the display panel 100 in the direction DRH horizontal to the display panel 100 due to the optical effect.

Figure 49:
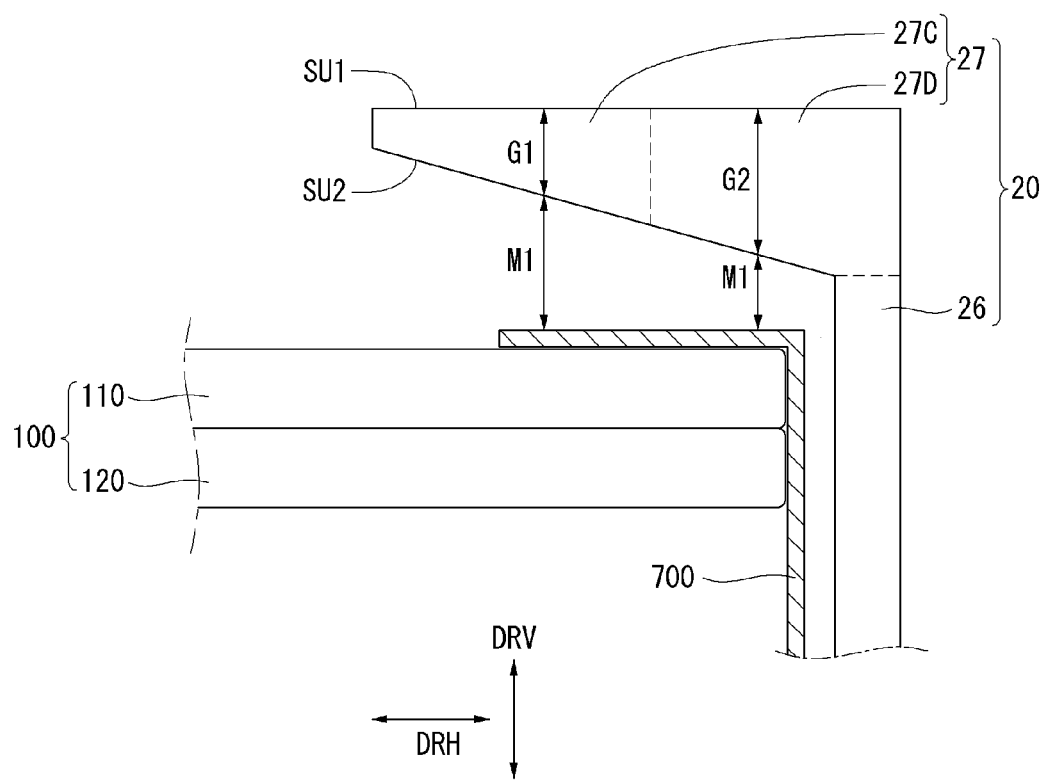

For example, as shown in FIG. 49, when the viewer at a position N11 sees a position N13, the viewer actually seeing the position N13 may observe a position N12 due to the refraction of light shown in FIG. 49. Hence, the viewer may perceive that the end of the black frame 700 moves in the direction toward the middle of the display panel 100.

Figure 50:
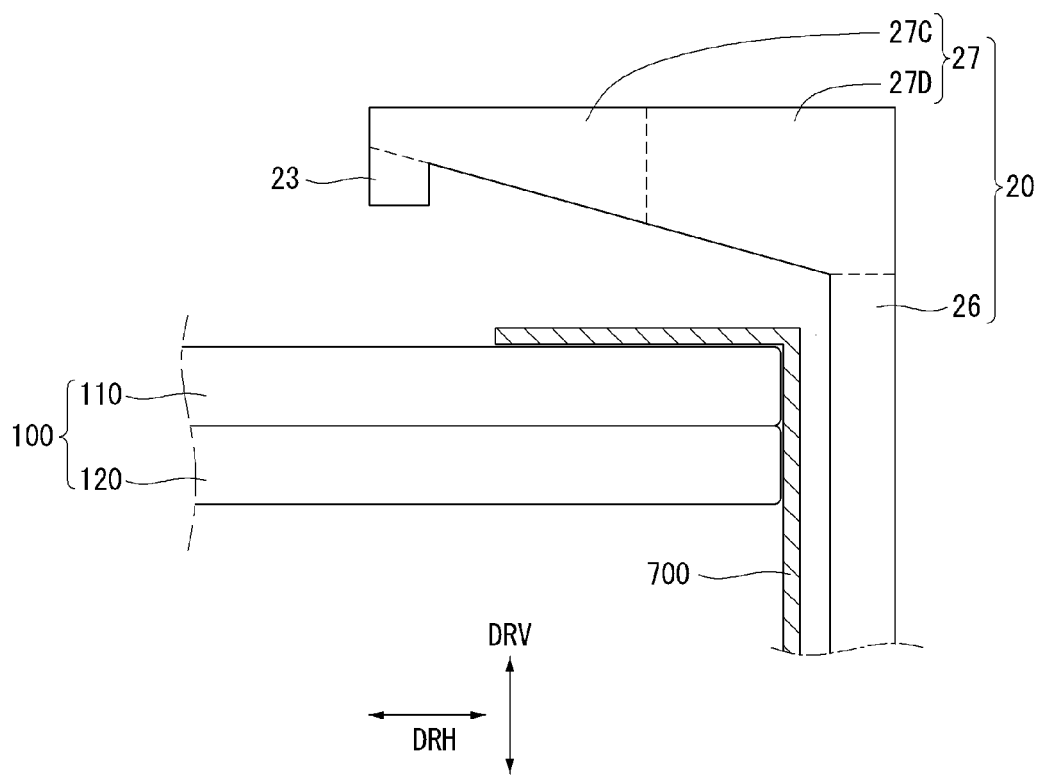

In this instance, as shown in FIG. 50, the transparent cover 20 may include a fifth portion 23 protruding from the end of the transparent cover 20 in a direction toward the front substrate 110.

The fifth portion 23 may prevent a foreign material such as dust from entering into a space between the front substrate 110 and the transparent cover 20.

The transparent cover 20 may include a plurality of lens parts. The lens parts are described in detail below.

Figure 51:
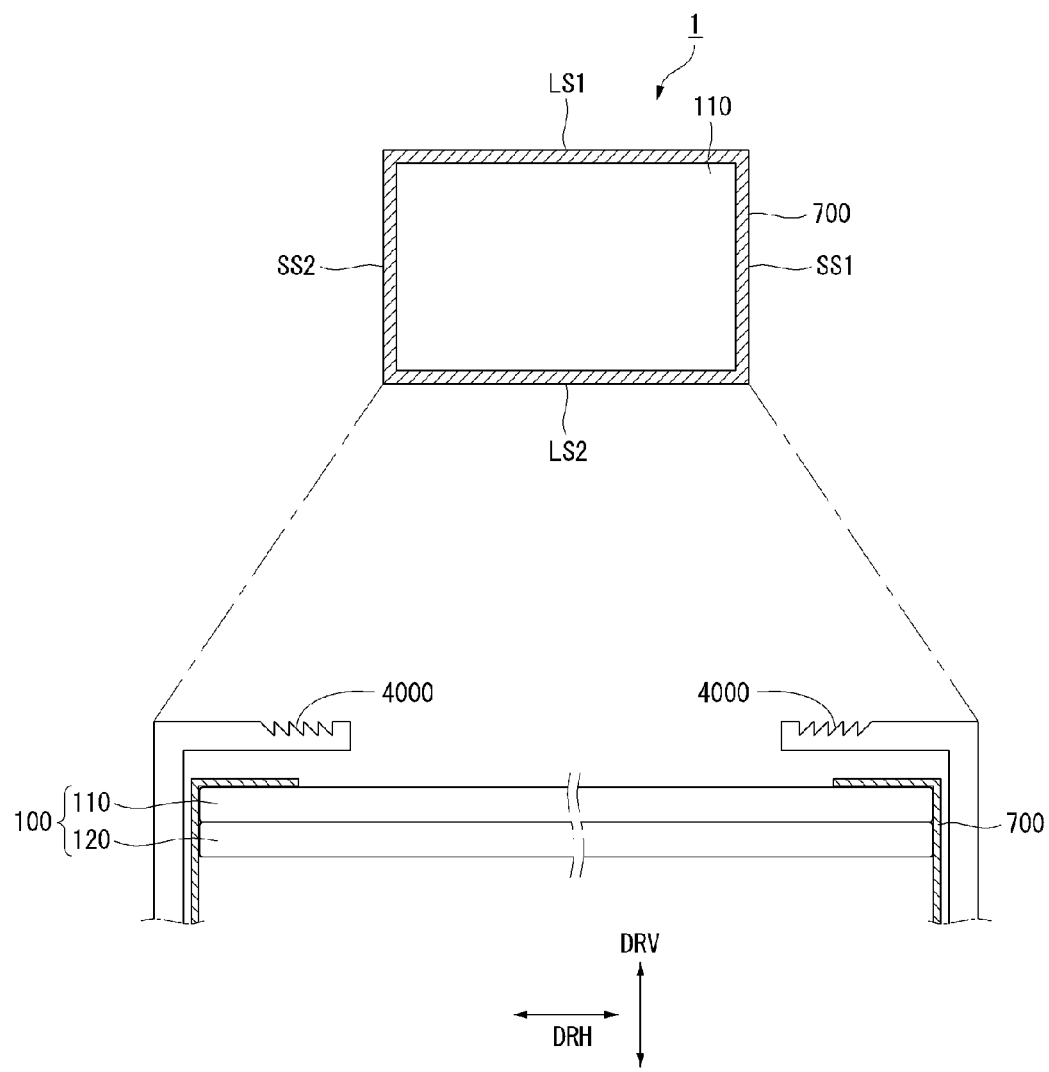

More specifically, as shown in FIG. 51, the transparent cover 20 may include at least one first lens 4000 on its surface. A formation area of the at least one first lens 4000 may be referred to as a first lens part. The first lens 4000 may have a triangular shape or a wedge shape. In other words, the transparent cover 20 may include a plurality of protrusions protruding in the direction away from the display panel 100 in the direction DRV vertical to the display panel 100. The protrusion may mean the first lens 4000.

Figure 52:
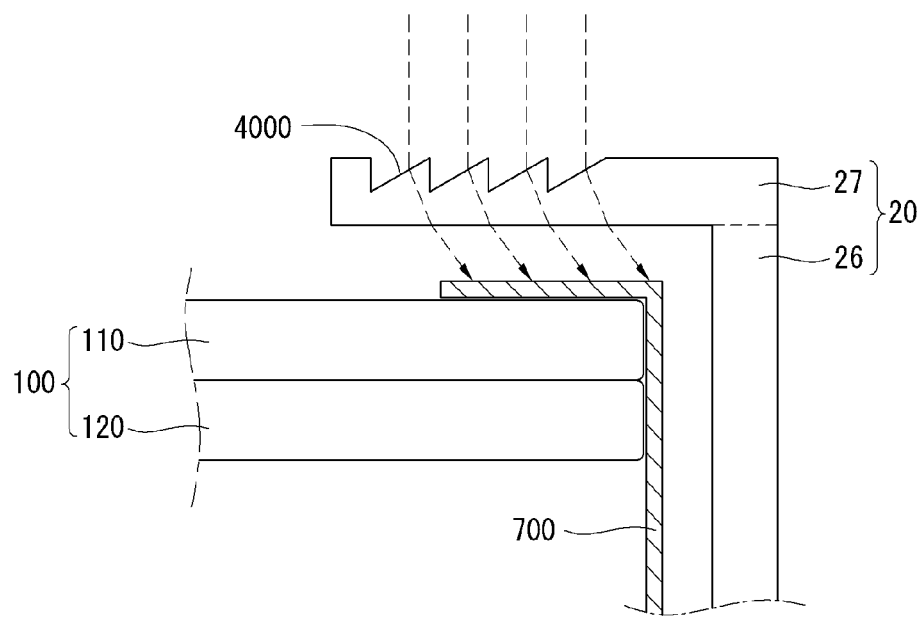

As shown in FIG. 52, the first lens 4000 may refract incident light at a predetermined angle.

The refraction of light using the first lens 4000 is described in detail above with reference to FIG. 17.

Hence, as shown in (B) of FIG. 8, the visual effect of the smaller size of the bezel area of the display panel 100 may be obtained.

As above, when the transparent cover 20 includes the plurality of first lenses 4000, the thickness of the transparent cover 20 may decrease.

Figure 53:
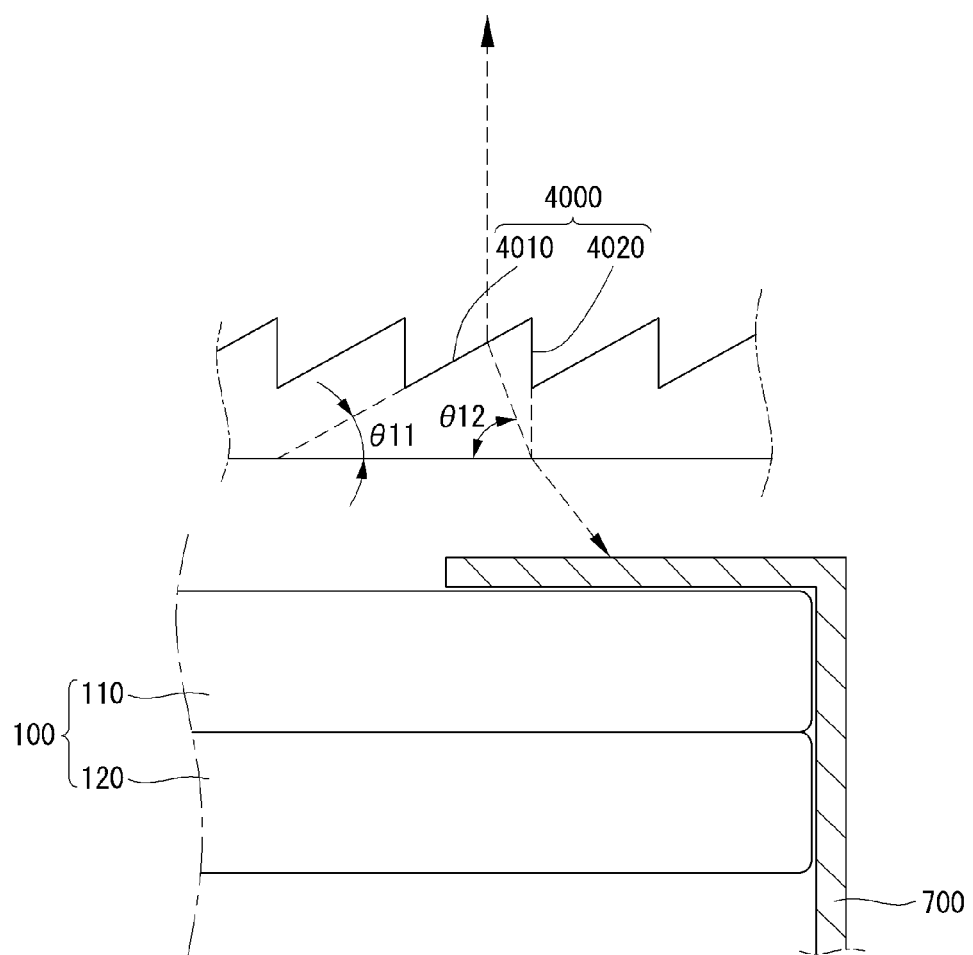

As shown in FIG. 53, the first lens 4000 may have a shape inclined to the outside of the display panel 100.

For example, an angle between a base side of the transparent cover 20 and a first surface 4010 of the first lens 4000 may be θ11, and an angle between the base side of the transparent cover 20 and a second surface 4020 of the first lens 4000 may be θ12 greater than θ11. In this instance, the visual effect of the smaller size of the bezel area of the display panel 100 may further increase.

Figure 54:
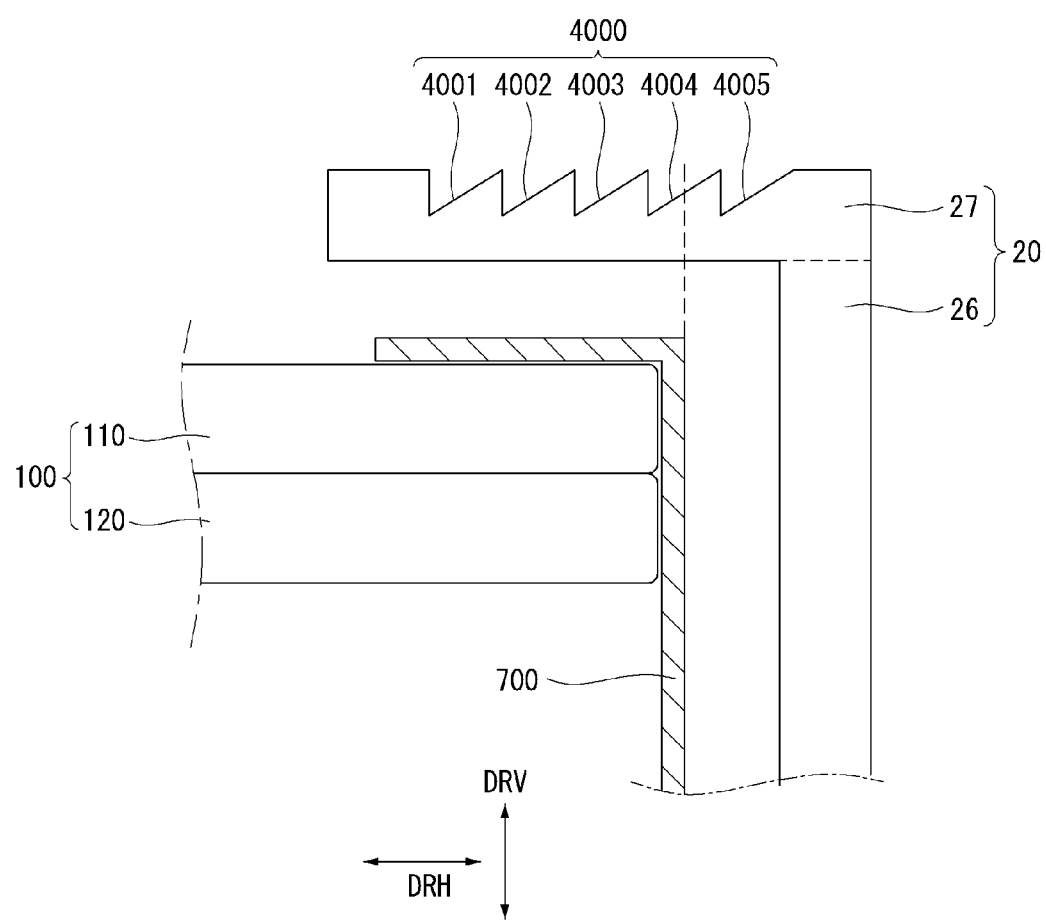

As shown in FIG. 54, when the transparent cover 20 includes the plurality of first lenses 4000, at least one first lens 4000 may entirely overlap the black frame 700 and at least one first lens 4000 may partially overlap the black frame 700. More specifically, at least one first lens 4000 may overlap the end of the black frame 700 adjacent to the outside of the display panel 100 in the direction DRH horizontal to the display panel 100. In other words, the first lens part may overlap the end of the black frame 700 adjacent to the outside of the display panel 100 in the direction DRH horizontal to the display panel 100.

For example, a 1-4 lens 4004 of the plurality of first lenses 4000 may overlap the end of the black frame 700 adjacent to the outside of the display panel 100 (i.e., the black frame 700 toward the direction away from the middle of the display panel 100) in the direction DRH horizontal to the display panel 100. In other words, the 1-4 lens 4004 may partially overlap the black frame 700.

In this instance, the visual effect of the smaller size of the bezel area of the display panel 100 may further increase.

Figure 55:
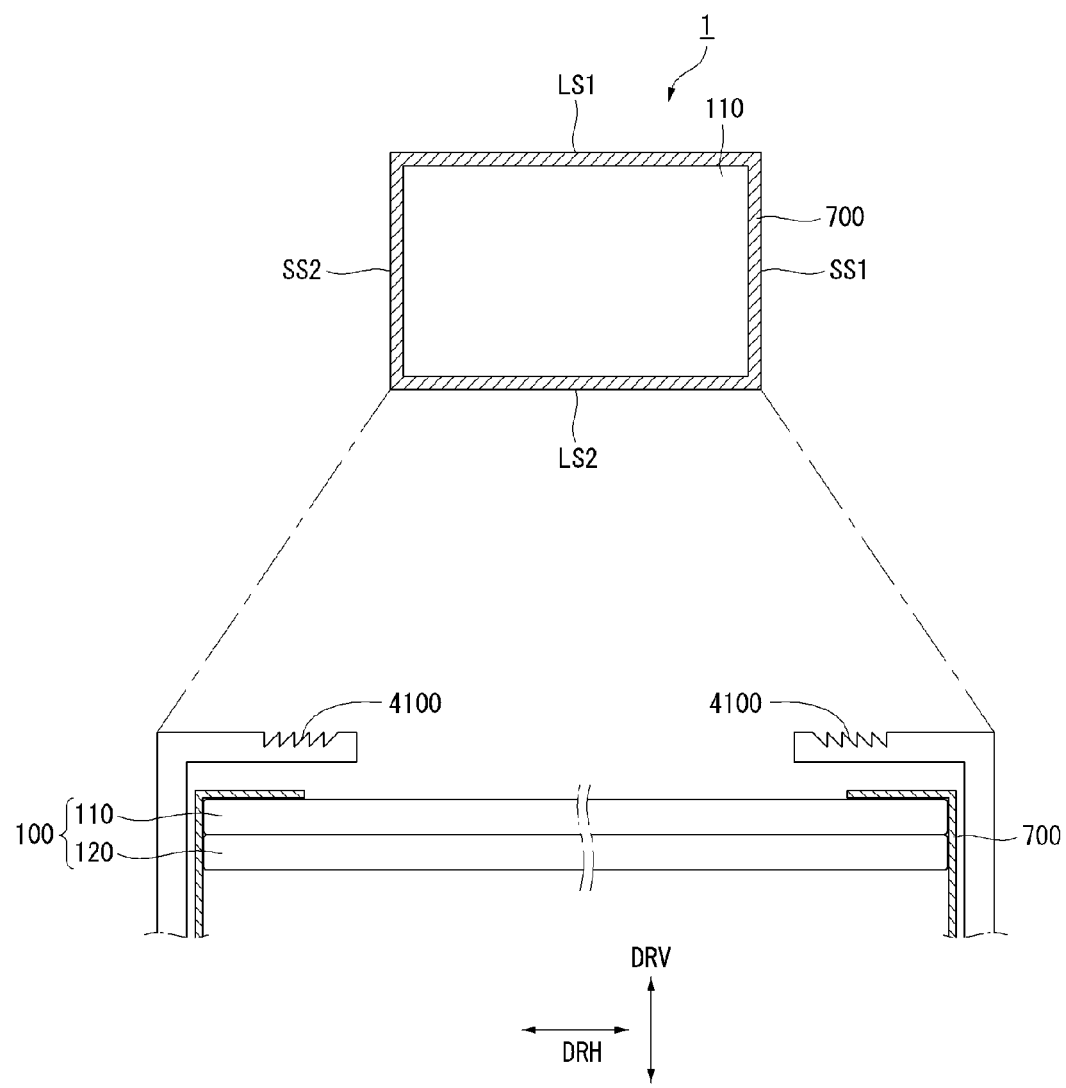

Alternatively, as shown in FIG. 55, the transparent cover 20 may include at least one second lens 4100 on its surface. A formation area of the second lens 4100 may be referred to as a second lens part. The second lens 4100 may have a triangular shape or a wedge shape. The second lens 4100 may have a shape symmetrical to the first lens 4000 shown in FIG. 51.

Figure 56:
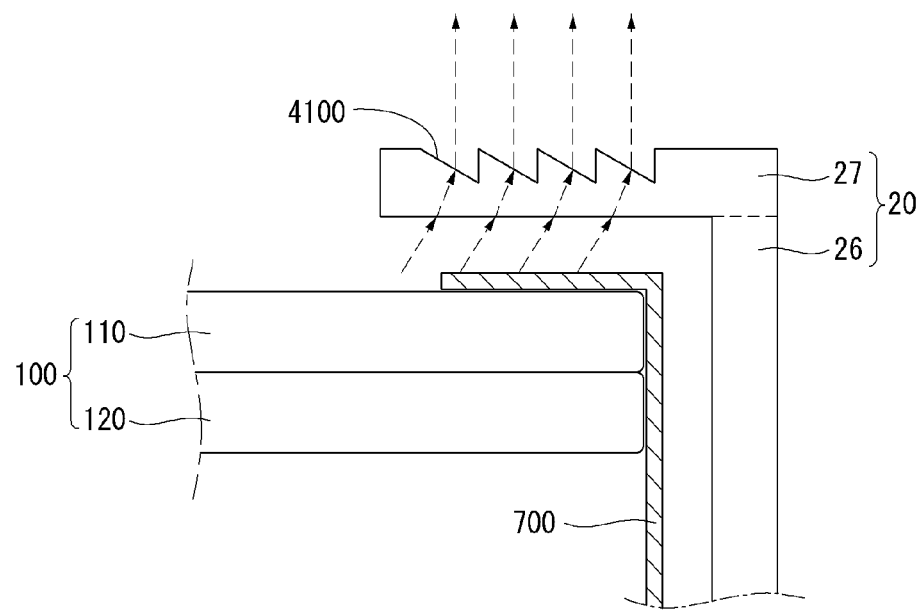

As shown in FIG. 56, the second lens 4100 may refract incident light at a predetermined angle.

The refraction of light using the second lens 4100 is described in detail above with reference to FIG. 43.

Accordingly, as shown in FIG. 43, because the boundary between the black frame 700 and the front substrate 110 seems to move in the direction away from the middle of the display panel 100, the visual effect of the smaller size of the bezel area of the display panel 100 may be obtained.

Figure 57:
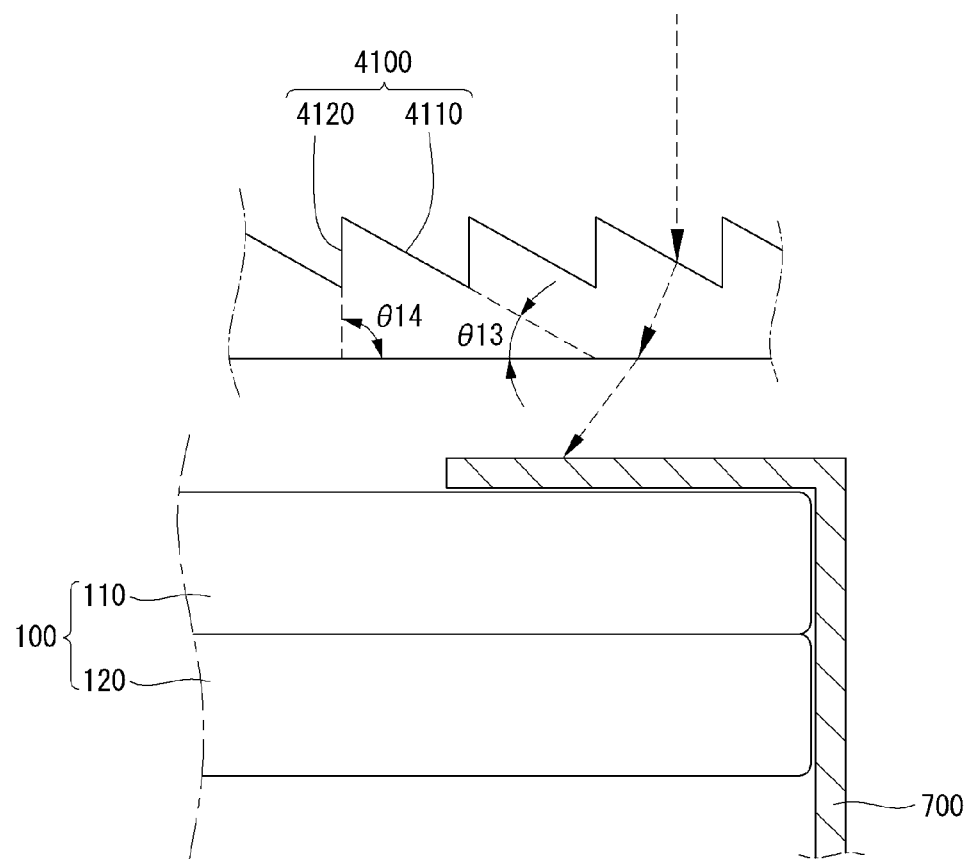

As shown in FIG. 57, the second lens 4100 may have a shape inclined to the middle of the display panel 100.

For example, an angle between the base side of the transparent cover 20 and a first surface 4110 of the second lens 4100 may be θ13, and an angle between the base side of the transparent cover 20 and a second surface 4120 of the second lens 4100 may be θ14 greater than θ13. In this instance, the visual effect of the smaller size of the bezel area of the display panel 100 may further increase.

When the transparent cover 20 includes the plurality of second lenses 4100, at least one second lens 4100 may entirely overlap the black frame 700 and at least one second lens 4100 may partially overlap the black frame 700. More specifically, at least one second lens 4100 may overlap the end of the black frame 700 (i.e., the boundary between the black frame 700 and the front substrate 110) toward the middle of the display panel 100 in the direction DRH horizontal to the display panel 100. In other words, the second lens part may overlap the boundary between the black frame 700 and the front substrate 110.

Figure 58:
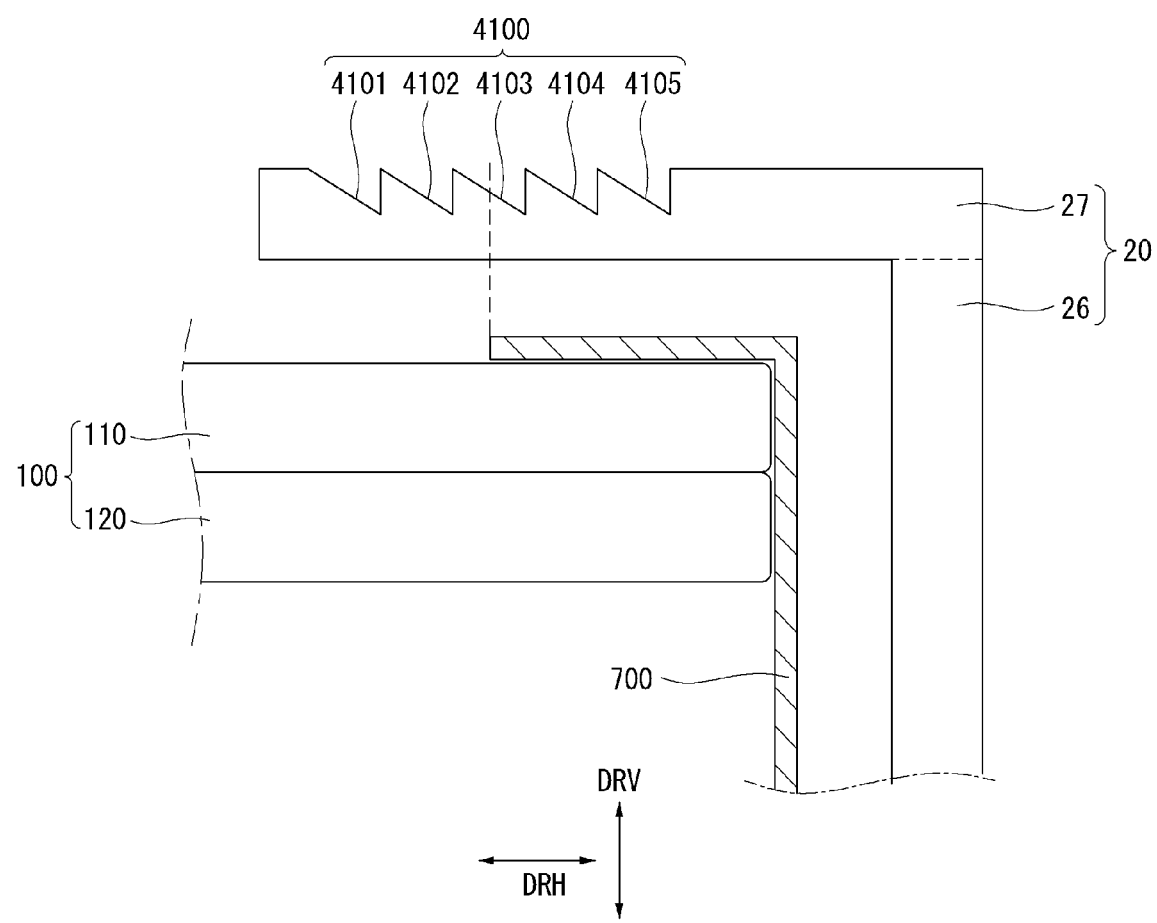

For example, as shown in FIG. 58, a 2-3 lens 4103 of the plurality of second lenses 4100 may overlap the end of the black frame 700 toward the middle of the display panel 100 (i.e., the boundary between the black frame 700 and the front substrate 110) in the direction DRH horizontal to the display panel 100. In other words, the 2-3 lens 4103 may partially overlap the black frame 700.

In this instance, the visual effect of the smaller size of the bezel area of the display panel 100 may further increase.

The transparent cover 20 may include at least one first lens 4000 and at least one second lens 4100. In this instance, the configuration and the effect resulting from the formation of the at least one first lens 4000 and the configuration and the effect resulting from the formation of the at least one second lens 4100 may be equally applied to the transparent cover 20.

Figure 59:
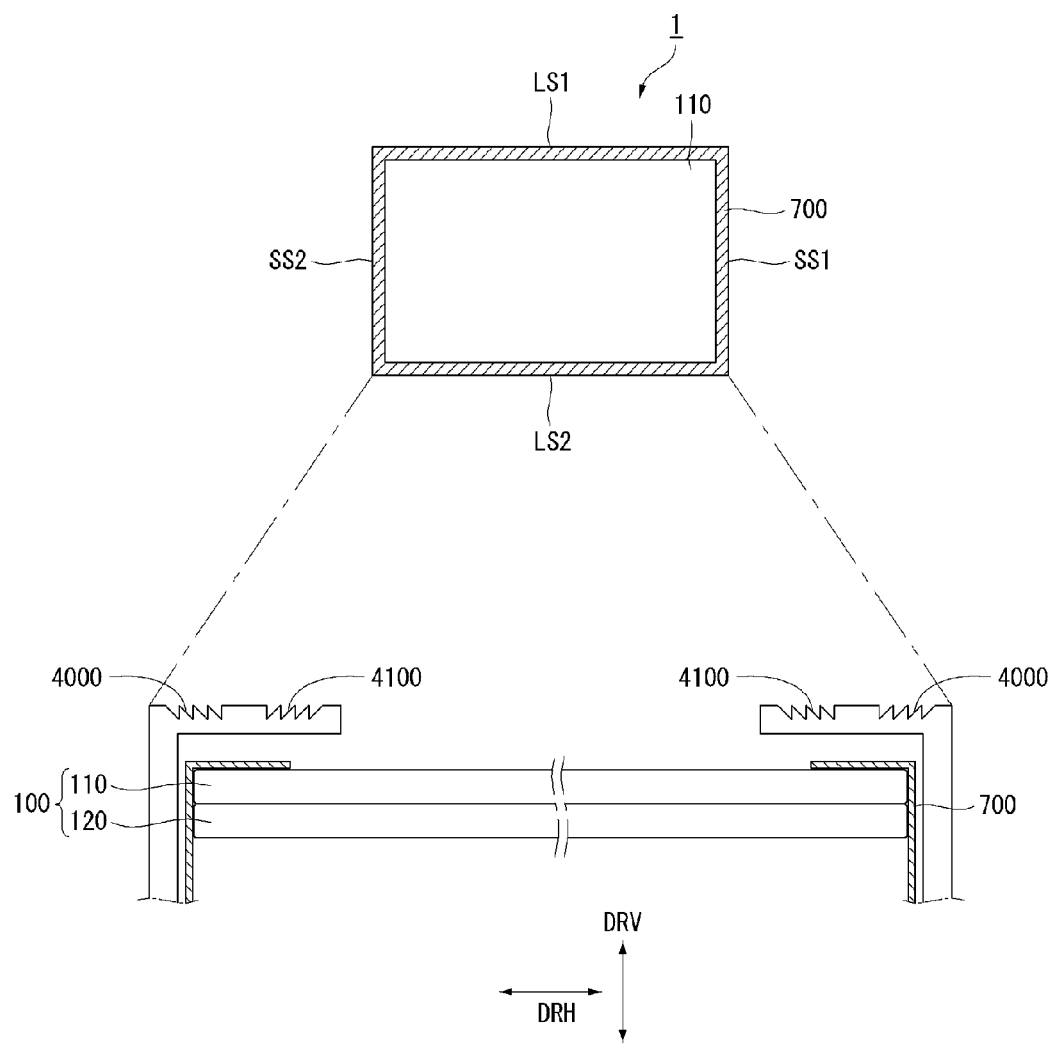

For example, as shown in FIG. 59, the transparent cover 20 may include at least one first lens 4000 and at least one second lens 4100 on its surface. The at least one first lens 4000 and the least one second lens 4100 may be formed on the surface of the transparent cover 20 in a line.

The second lens part may be positioned closer to the middle of the display panel 100 than the first lens part in the direction DRH horizontal to the display panel 100.

Figure 60:
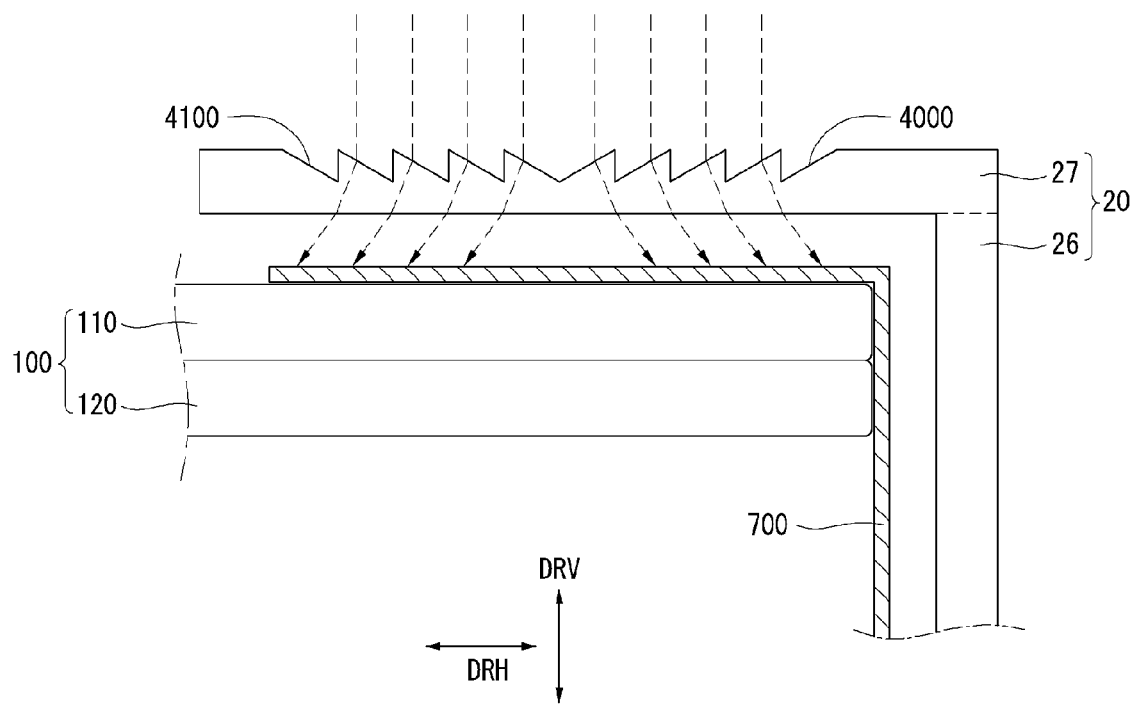

As shown in FIG. 60, each of the first lens 4000 and the second lens 4100 may refract incident light at a predetermined angle.

The refraction of light using the first lens 4000 is described in detail above with reference to FIG. 17, and the refraction of light using the second lens 4100 is described in detail above with reference to FIG. 43.

Accordingly, as shown in FIG. 43, because the boundary between the black frame 700 and the front substrate 110 seems to move in the direction away from the middle of the display panel 100, the visual effect of the smaller size of the bezel area of the display panel 100 may be obtained. Furthermore, as shown in (B) of FIG. 8, the visual effect of the smaller size of the bezel area of the display panel 100 may be obtained.

In other words, both ends of the black frame 700 may seem to move in the direction DRH horizontal to the display panel 100. Namely, the visual effect of the smaller size of the black frame 700 may be obtained.

Figure 61:
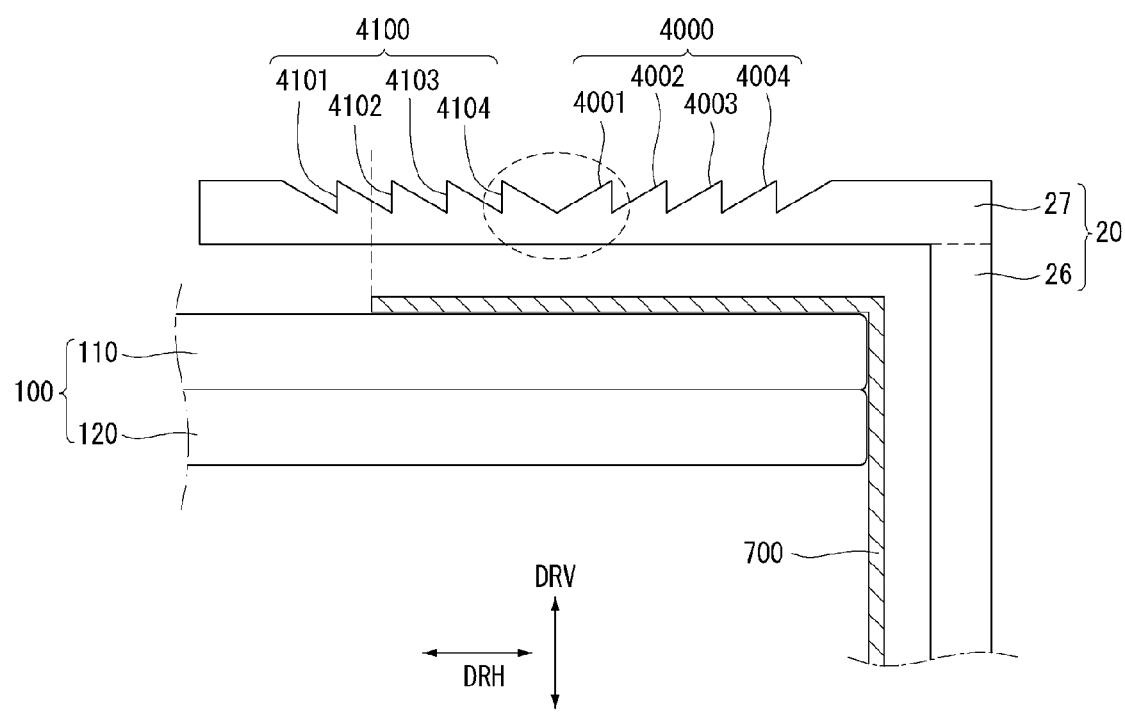

As shown in FIG. 61, the first lens 4000 and the second lens 4100 of the transparent cover 20 may be positioned adjacent to each other. For example, the first lens 4000 and the second lens 410 may be connected to each other. A 1-1 lens 4001 of the plurality of first lenses 4000 and a 2-4 lens 4104 of the plurality of second lenses 4100 may be connected to each other.

Figure 62:
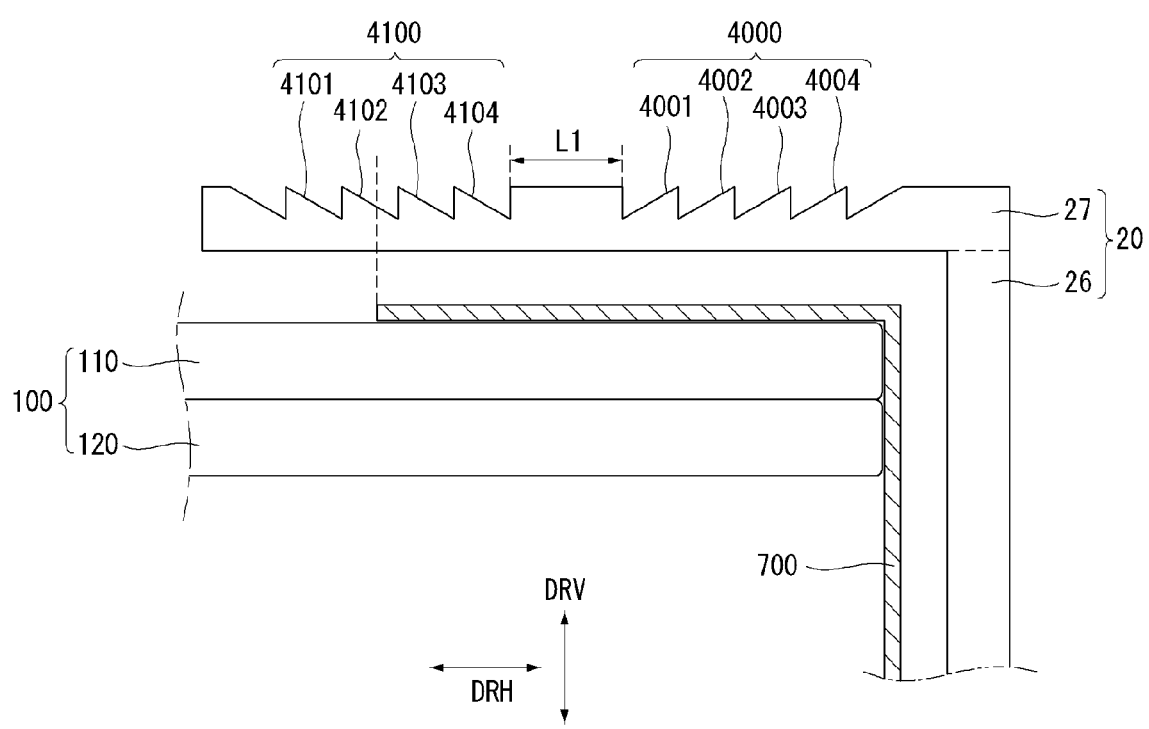

Alternatively, as shown in FIG. 62, the first lens part and the second lens part may be separated from each other by a predetermined distance L1. For example, a buffer having the predetermined length L1 may be disposed between the 1-1 lens 4001 of the plurality of first lenses 4000 and the 2-4 lens 4104 of the plurality of second lenses 4100.

Figure 63:
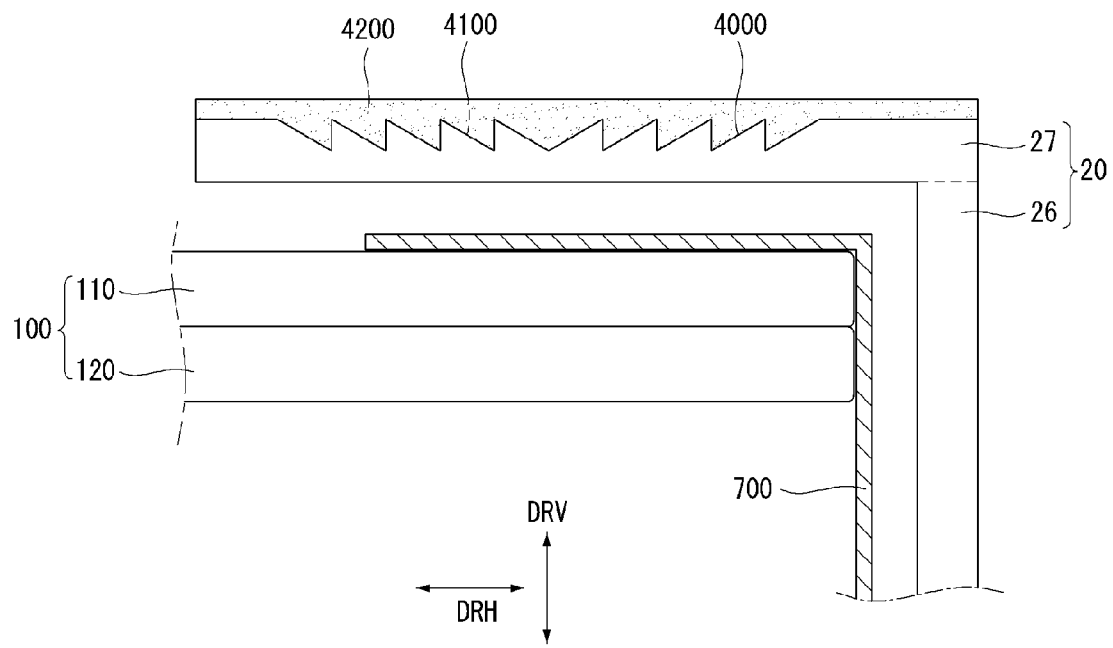

Alternatively, as shown in FIG. 63, a buffer layer 4200 may be formed on the first lens 4000 and the second lens 4100.

A refractive index of the buffer layer 4200 may be less than a refractive index of the transparent cover 20.

The buffer layer 4200 may protect the first and second lenses 4000 and 4100 from an impact applied from the outside. Further, the buffer layer 4200 may prevent a foreign material such as dust from entering into a space between the first and second lenses 4000 and 4100, thereby securing optical characteristic of the transparent cover 20.

At least one lens may be formed on the surface of the transparent cover 20 opposite the front substrate 110 of the display panel 100.

Figure 64:
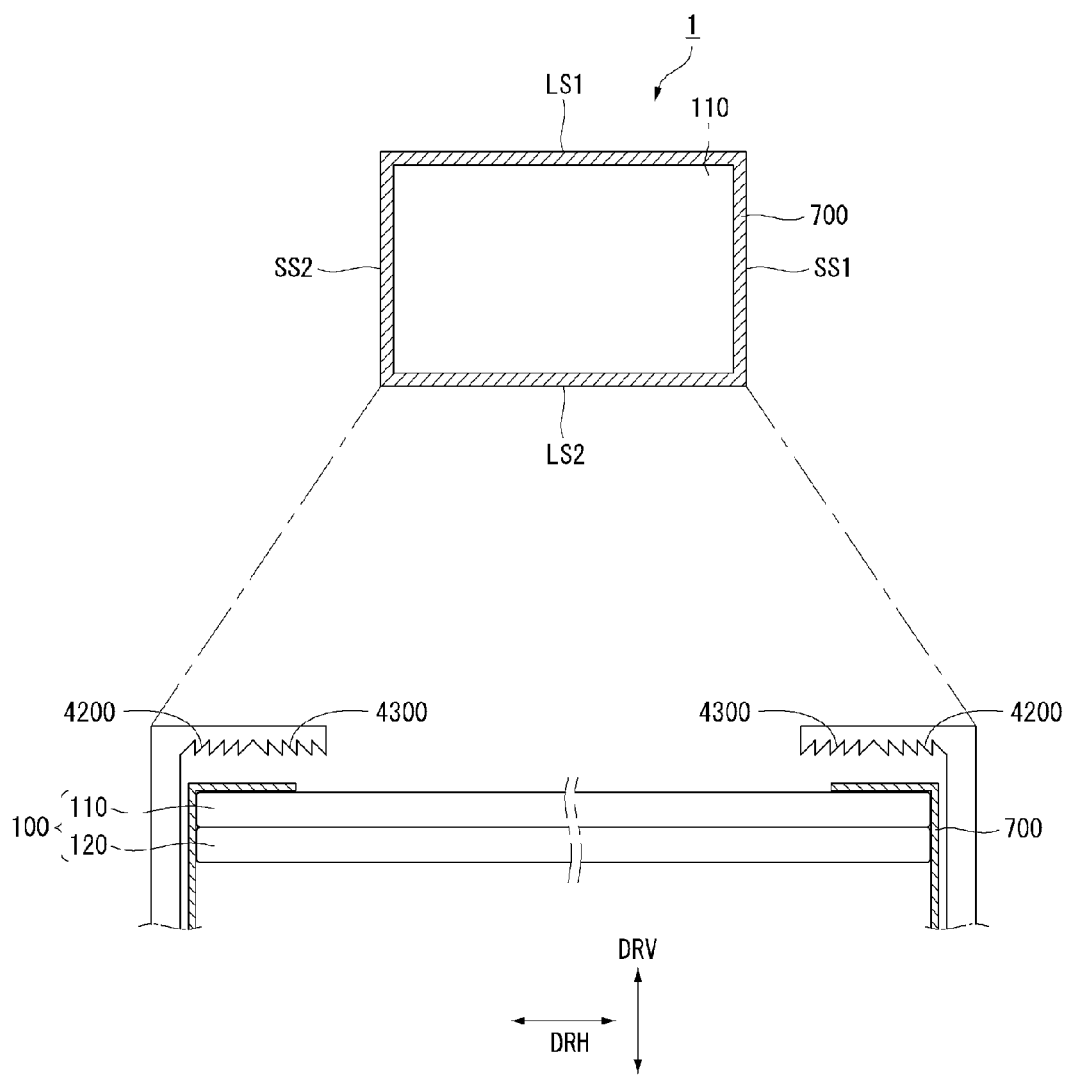

For example, as shown in FIG. 64, at least one third lens 4200 and at least one fourth lens 4300 may be formed on the surface of the transparent cover 20 opposite the front substrate 110 in a line.

A formation area of the at least one third lens 4200 may be referred to as a third lens part, and a formation area of the at least one fourth lens 4300 may be referred to as a fourth lens part.

Each of the third and fourth lenses 4200 and 4300 may have a triangular shape or a wedge shape. In other words, the transparent cover 20 may include a plurality of protrusions protruding in the direction toward the display panel 100 in the direction DRV vertical to the display panel 100. The protrusions may mean the third lens 4200 and/or the fourth lens 4300.

FIG. 64 shows the transparent cover 20 including both the third lens 4200 and the fourth lens 4300. However, the transparent cover 20 may include only one of the third lens 4200 and the fourth lens 4300. In this instance, the configuration of the transparent cover 20 may be sufficiently analogized through the above-described configurations of the first and second lenses 4000 and 4100.

The fourth lens part may be positioned closer to the middle of the display panel 100 than the third lens part in the direction DRH horizontal to the display panel 100.

Figure 65:
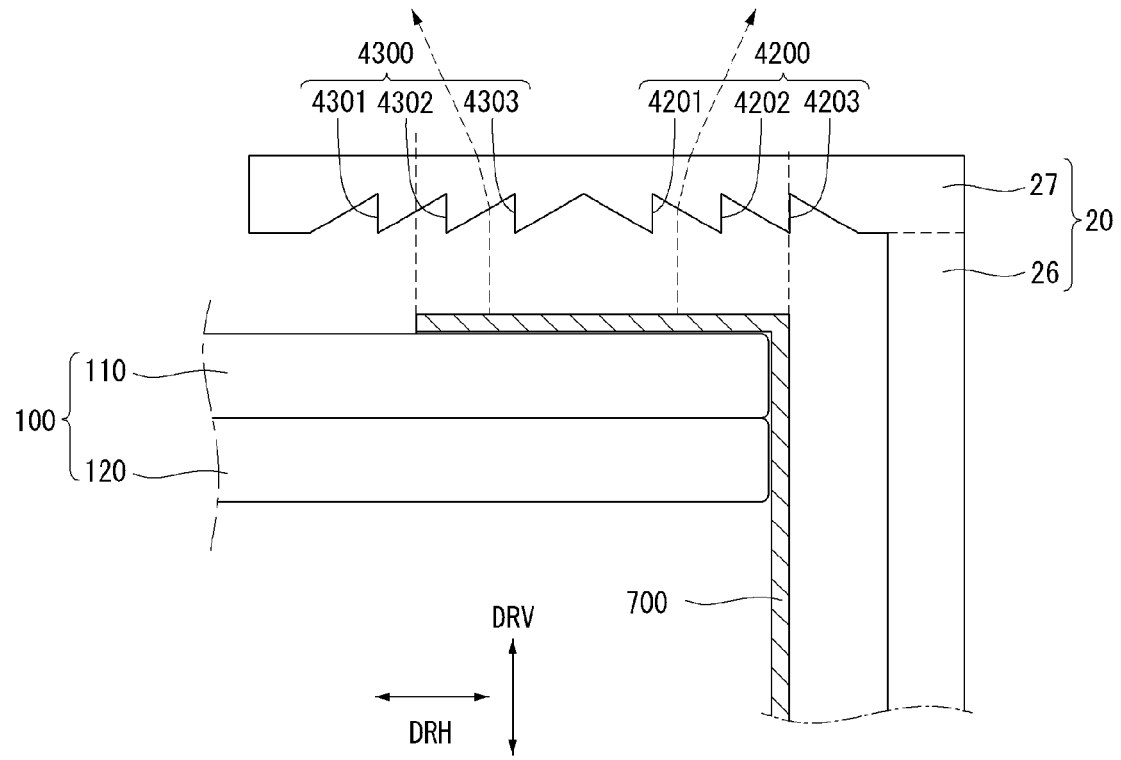

As shown in FIG. 65, each of the third lens 4200 and the fourth lens 4300 may refract incident light at a predetermined angle.

The refraction of light using the third lens 4200 is described in detail above with reference to FIG. 48, and the refraction of light using the fourth lens 4300 is described in detail above with reference to FIG. 45.

Accordingly, as shown in FIG. 45, because the boundary between the black frame 700 and the front substrate 110 seems to move in the direction away from the middle of the display panel 100, the visual effect of the smaller size of the bezel area of the display panel 100 may be obtained. Furthermore, as shown in FIG. 48, the end of the black frame 700 may seem to move in the direction toward the middle of the display panel 100.

In other words, both ends of the black frame 700 may seem to move in the direction DRH horizontal to the display panel 100. Namely, the visual effect of the smaller size of the black frame 700 may be obtained.

When the transparent cover 20 includes the plurality of third lenses 4200, at least one third lens 4200 may entirely overlap the black frame 700 and at least one third lens 4200 may partially overlap the black frame 700. More specifically, at least one third lens 4200 may overlap the end of the black frame 700 adjacent to the outside of the display panel 100 in the direction DRH horizontal to the display panel 100. In other words, the third lens part may overlap the end of the black frame 700 adjacent to the outside of the display panel 100 in the direction DRH horizontal to the display panel 100.

For example, as shown in FIG. 65, a 3-3 lens 4203 of the plurality of third lenses 4200 may overlap the end of the black frame 700 adjacent to the outside of the display panel 100 (i.e., the black frame 700 toward the direction away from the middle of the display panel 100) in the direction DRH horizontal to the display panel 100. In other words, the 3-3 lens 4203 may partially overlap the black frame 700.

Further, at least one fourth lens 4300 may overlap the end of the black frame 700 (i.e., the boundary between the black frame 700 and the front substrate 110) toward the middle of the display panel 100 in the direction DRH horizontal to the display panel 100. In other words, the fourth lens part may overlap the boundary between the black frame 700 and the front substrate 110.

For example, as shown in FIG. 65, a 4-2 lens 4302 of the plurality of fourth lenses 4300 may overlap the end of the black frame 700 toward the middle of the display panel 100 (i.e., the boundary between the black frame 700 and the front substrate 110) in the direction DRH horizontal to the display panel 100. In other words, the 4-2 lens 4302 may partially overlap the black frame 700.

In this instance, the visual effect of the smaller size of the bezel area of the display panel 100 may further increase.

The third lens 4200 and the fourth lens 4300 of the transparent cover 20 may be positioned adjacent to each other. For example, the third lens 4200 and the fourth lens 4300 may be connected to each other.

Figure 66:
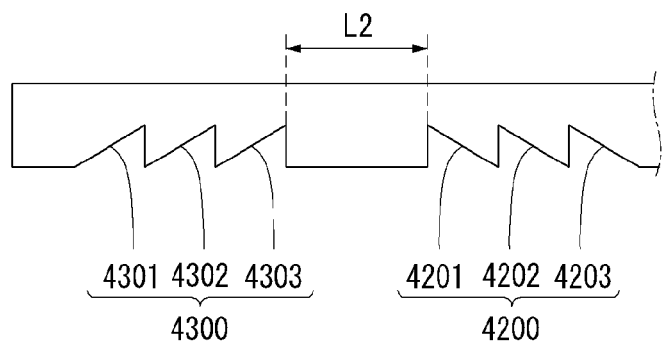

Alternatively, as shown in FIG. 66, the third lens part and the fourth lens part may be separated from each other by a predetermined distance L2. For example, a buffer having the predetermined length L2 may be disposed between a 3-1 lens 4201 of the plurality of third lenses 4200 and a 4-3 lens 4303 of the plurality of fourth lenses 4300.

FIGS. 67 to 73 illustrate a configuration and an operation of a broadcasting signal receiver according to an example embodiment of the invention. In the following description, the descriptions of the configuration and the structure described above are omitted. Namely, in the following description, a display unit 180Q may correspond to the display device 1 illustrated in FIGS. 1 to 66. In the following description, the display device 1 according to the embodiment of the invention may be referred to as the display unit 180Q.

The broadcasting signal receiver according to the embodiment of the invention is a smart broadcasting signal receiver to which a computer assisted function is added to a broadcast receiving function. Thus, the smart broadcasting signal receiver may faithfully perform the broadcast receiving function and also may perform an internet function. The smart broadcasting signal receiver may be equipped with a user-friendly interface, such as an input device driven by a manual operation and a spatial remote controller. The smart broadcasting signal receiver may be connected to the internet and the computer by the support of wired/wireless internet function and thus may perform e-mail, web browsing, banking, games, etc. The standard universal operating system (OS) may be used for various functions of the smart broadcasting signal receiver.

Accordingly, because various applications may be freely added to or omitted in universal OS kernel in the broadcasting signal receiver disclosed herein, various user-friendly functions may be performed. The broadcasting signal receiver may be a network TV, HBBTV, and a smart TV, for example. Further, the broadcasting signal receiver may be applied to smart phones, if necessary.

Figure 67:
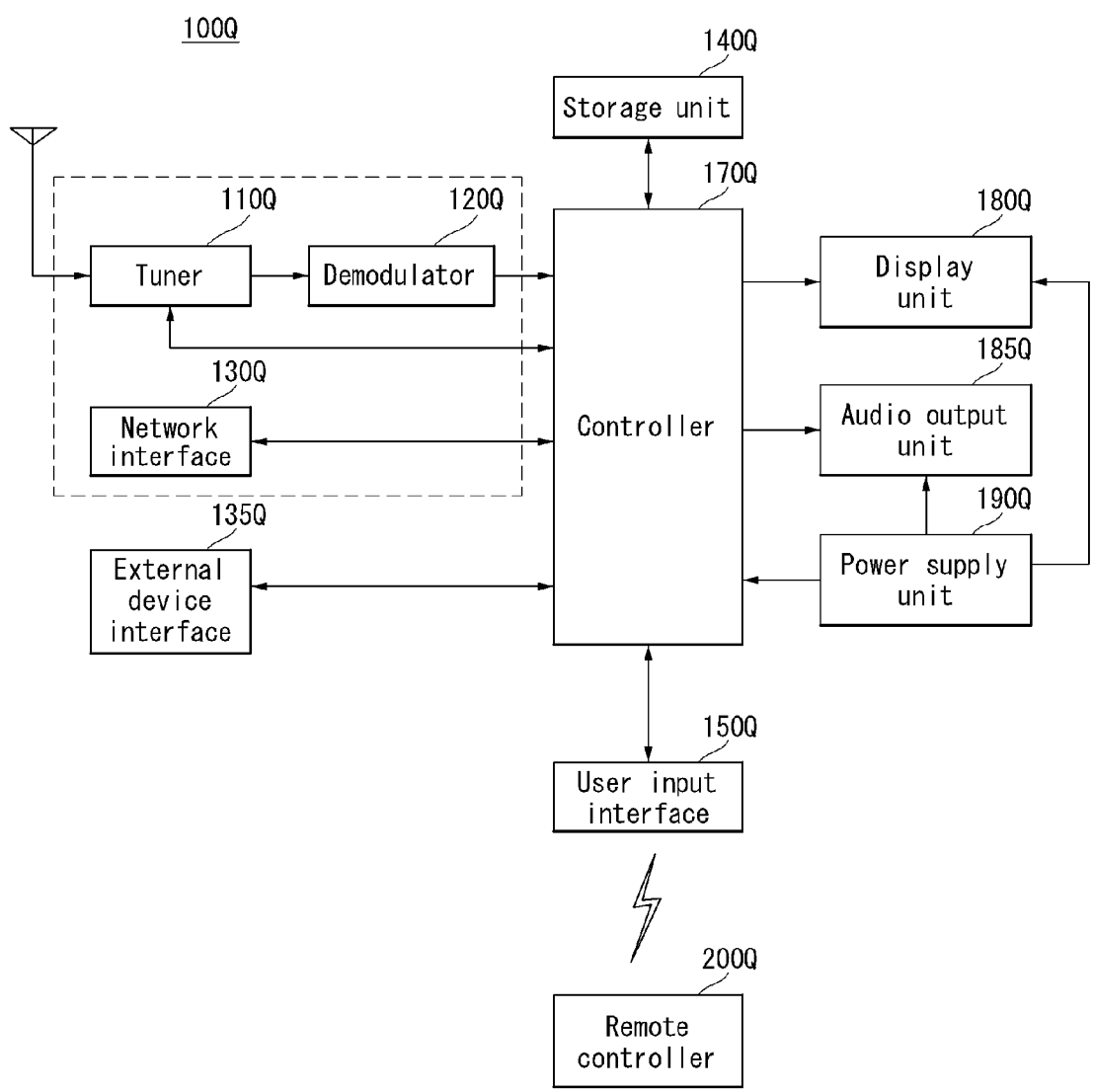
FIGS. 67 to 73 illustrate a configuration and an operation of a broadcasting signal receiver according to an example embodiment of the invention.

As shown in FIG. 67, a broadcasting signal receiver 100Q according to the embodiment of the invention may include a broadcasting receiving unit 105Q, an external device interface 135Q, a storage unit 140Q, a user input interface 150Q, a controller 170Q, a display unit 180Q, an audio output unit 185Q, a power supply unit 190Q, and a photographing unit (not shown). The broadcasting receiving unit 105Q may include a tuner 110Q, a demodulator 120Q, and a network interface 130Q.

If necessary, the broadcasting receiving unit 105Q may be designed so that it includes the tuner 110Q and the demodulator 120Q and does not include the network interface 130Q. On the contrary, the broadcasting receiving unit 105Q may be designed so that it includes the network interface 130Q and does not include the tuner 110Q and the demodulator 120Q.

The tuner 110Q tunes a radio frequency (RF) broadcasting signal, which corresponds to a channel selected by the user or all of previously stored channels, among RF broadcasting signals received through an antenna. Further, the tuner 110Q converts the tuned RF broadcasting signal into a middle frequency signal, a base band image signal, or a voice signal.

For example, when the tuned RF broadcasting signal is a digital broadcasting signal, the tuner 110Q converts the tuned RF broadcasting signal into a digital IF signal DIF. When the tuned RF broadcasting signal is an analog broadcasting signal, the tuner 110Q converts the tuned RF broadcasting signal into an analog base band image signal or a voice signal CVBS/SIF. Namely, the tuner 110Q may process the digital broadcasting signal and the analog broadcasting signal. The analog base band image signal or the voice signal CVBS/SIF output from the tuner 110Q may be directly input to the controller 170Q.

The demodulator 120Q receives the digital IF signal DIF converted by the tuner 110Q and performs a demodulating operation.

For example, when the digital IF signal DIF output from the tuner 110Q is an ATSC type signal, the demodulator 120Q performs 8-level vestigal sideband (8-VSB) demodulation. Further, the demodulator 120Q may perform the channel decoding. For this, the demodulator 120Q may include a trellis decoder, a De-interleaver, and a Reed-Solomon decoder and thus may perform trellis decoding, De-interleaving decoding, and Reed-Solomon decoding.

The demodulator 120Q may perform the demodulation and the channel decoding and then may output a stream signal. The stream signal output by the demodulator 120Q may be a signal obtained by multiplexing an image signal, a voice signal, or a data signal. For example, the stream signal may be MPEG-2 transport stream (TS) obtained by multiplexing MPEG-2 standard image signal, Dolby AC-3 standard voice signal, etc. More specifically, the MPEG-2 TS may include 4-byte header and 184-byte payload.

The stream signal output by the demodulator 120Q may be input to the controller 170Q. The controller 170Q performs demultiplexing, image/voice signal processing, etc. Then, the controller 170Q outputs an image to the display unit 180Q and outputs a voice to the audio output unit 185Q.

The external device interface 135Q may connect an external device to the broadcasting signal receiver 100Q. For this, the external device interface 135Q may include an audio-visual (AV) input/output unit (not shown) or a wireless communication unit (not shown).

The network interface 130Q provides an interface for connecting the broadcasting signal receiver 100Q to a wired/wireless network including an internet network. The network interface 130Q may have an ethernet terminal, for example, for connecting the broadcasting signal receiver 100Q to the wired network. Further, the network interface 130Q may use communication standards such as WLAN (Wireless LAN) (Wi-Fi), Wireless broadband (Wibro), World Interoperability for Microwave Access (Wimax), and High Speed Downlink Packet Access (HSDPA) for connecting the broadcasting signal receiver 100Q to the wireless network.

The storage unit 140Q may store a program for the signal processing and the control operation of the controller 170Q and may store the processed image signal, the processed voice signal, or the processed data signal.

Further, the storage unit 140Q may temporarily store the image signal, the voice signal, or the data signal received from the external device interface 135Q or the network interface 130Q. The storage unit 140Q may store information about a predetermined broadcasting channel through its channel memory function.

FIG. 67 illustrates the broadcasting signal receiver 100Q separately including the storage unit 140Q and the controller 170Q. Other configurations may be used for the broadcasting signal receiver 100Q. For example, the controller 170Q may include the storage unit 140Q.

The user input interface 150Q may transfer the signal the user inputs to the controller 170Q, or may transfer the signal from the controller 170Q to the user.

For example, the user input interface 150Q may receive and process the control signal indicating the power on or off, the channel selection, the screen setting, etc. from a remote controller 200Q based on various communication manners such as a RF communication manner and an infrared communication manner. Alternatively, the user input interface 150Q may operate so that the control signal from the controller 170Q is transmitted to the remote controller 200Q.

For example, the user input interface 150Q may transfer a control signal, which is input from a power key, a channel key, a volume key, a local key (not shown) such as a setting key, to the controller 170Q.

The controller 170Q may perform the demultiplexing processing on the stream input through the tuner 110Q, the demodulator 120Q, or the external device interface 135Q or may perform the processing of demultiplexed signals, thereby generating or outputting the signals for outputting the image or the voice.

The image signal processed by the controller 170Q may be input to the display unit 180Q and may display an image corresponding to the image signal. Further, the image signal processed by the controller 170Q may be input to an external output device through the external device interface 135Q.

The voice signal processed by the controller 170Q may be output to the audio output unit 185Q. Further, the voice signal processed by the controller 170Q may be input to the external output device through the external device interface 135Q.

Although not shown in FIG. 67, the controller 170Q may include a demultiplexing unit, an image processing unit, etc. This is described later.

The controller 170Q may control the entire operation of the broadcasting signal receiver 100Q. For example, the controller 170Q may control the tuner 110Q, so that the tuner 110Q tunes a RF broadcasting signal corresponding to a channel selected by the user or a previously stored channel.

The controller 170Q may control the broadcasting signal receiver 100Q using a user command or an internal program input through the user input interface 150Q. In particular, the controller 170Q may be connected to the network and may allow an application or an application list the user wants to be downed to the broadcasting signal receiver 100Q.

For example, the controller 170Q controls the tuner 110Q, so that a signal of a channel selected based on a predetermined channel selection command received through the user input interface 150Q is input. The controller 170Q processes the image signal, the voice signal, or the data signal of the selected channel. The controller 170Q may operate, so that channel information the user selects, along with the processed image signal or the processed voice signal may be output through the display unit 180Q or the audio output unit 185Q.

As another example, the controller 170Q may operate, so that the image signal or the voice signal from the external device, for example, the camera or the camcorder input through the external device interface 135Q based on an image display command of the external device received through the user input interface 150Q may be output through the display unit 180Q or the audio output unit 185Q.

The controller 170Q may control the display unit 180Q, so that the display unit 180Q displays the image. For example, the controller 170Q may control the display unit 180Q, so that the display unit 180Q displays a broadcasting image input through the tuner 110Q, an external input image input through the external device interface 135Q, an image input through the network interface, or an image stored in the storage unit 140Q. The image displayed on the display unit 180Q may be a still image or a moving picture. Further, the image displayed on the display unit 180Q may be the 2D or 3D image.

The display unit 180Q may convert the image signal, the data signal, and an OSD signal, which are processed by the controller 170Q, or the image signal and the data signal which are received from the external device interface 135Q, into red, green, and blue signals and may generate a driving signal.

The display unit 180Q may be a PDP device, a LCD, an OLED display, a flexible display, a 3D display, etc. It may be preferable that the display unit 180Q may be the PDP device so as to use a pen touch manner.

The audio output unit 185Q may receive the voice signal (for example, stereo signal, 3.1 channel signal, or 5.1 channel signal) processed by the controller 170Q and may output the voice. The audio output unit 185Q may be implemented as various types of speakers.

The power supply unit 190Q supplies the power required in all of the components of the broadcasting signal receiver 100Q.

The remote controller 200Q transmits the user command the user inputs to the user input interface 150Q. For this, the remote controller 200Q may use Bluetooth, RF communication, infrared communication, Ultra-wideband (UWB), Zigbee, etc.

The remote controller 200Q may receive the image signal, the voice signal, or the data signal output from the user input interface 150Q and may display the image signal, the voice signal, or the data signal or may output the voice or the vibration.

Unlike the configuration illustrated in FIG. 67, the broadcasting signal receiver 100Q may not include the tuner 110Q and the demodulator 120Q. Further, the broadcasting signal receiver 100Q may receive image contents through the network interface 130Q or the external device interface 135Q and may reproduce the image contents.

Figure 68:
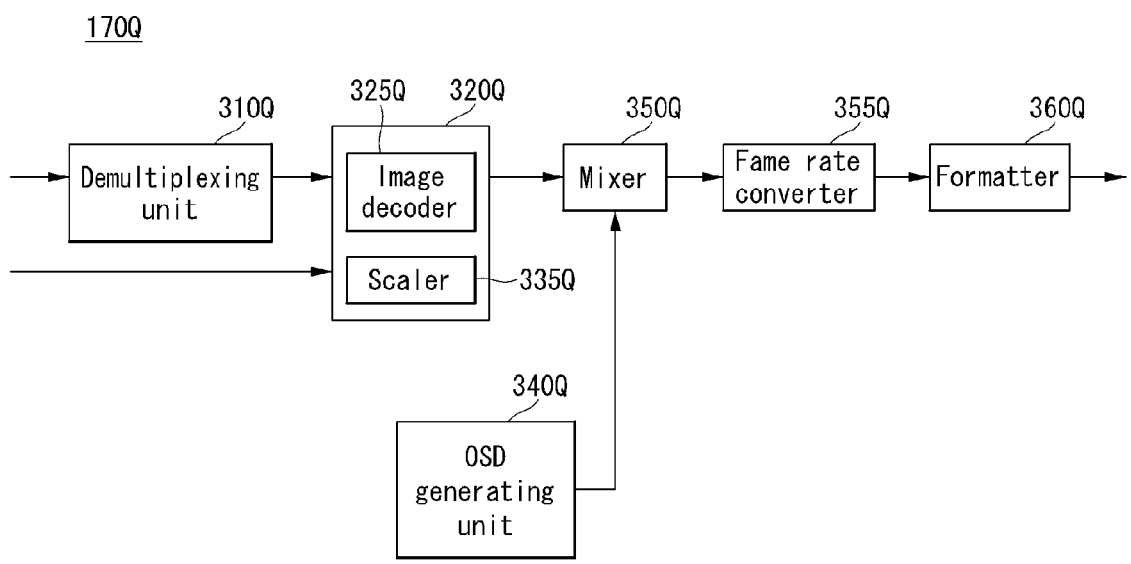

FIG. 68 is an internal block diagram of the controller shown in FIG. 67.

As shown in FIG. 68, the controller 170Q may include a demultiplexing unit 310Q, an image processing unit 320Q, an OSD generating unit 340Q, a mixer 350Q, a frame rate converter 355Q, and a formatter 360Q. The controller 170Q may further include an audio processing unit (not shown) and a data processing unit (not shown).

The demultiplexing unit 310Q demultiplexes an input stream. For example, when MPEG-2 TS is input, the demultiplexing unit 310Q may demultiplex the MPEG-2 TS and may divide the MPEG-2 TS into an image signal, a voice signal, and a data signal. A stream signal input to the demultiplexing unit 310Q may be a stream signal output to the tuner 110Q, the demodulator 120Q, or the external device interface 135Q.

The image processing unit 320Q may perform image processing on the demultiplexed image signal. For this, the image processing unit 320Q may include an image decoder 325Q and a scaler 335Q.

The image decoder 325Q decodes the demultiplexed image signal. The scaler 335Q performs a scaling operation, so that a resolution of the decoded image signal can be output to the display unit 180Q.

The image decoder 325Q may have various standards of decoders.

For example, when the demultiplexed image signal is the decoded image signal of MPEG-2 standard, the demultiplexed image signal may be decoded by MPEG-2 decoder.

Further, for example, when the demultiplexed image signal is the decoded image signal of H.264 standard based on digital multimedia broadcasting (DMB) manner or DVB-H, the demultiplexed image signal may be decoded by H.264 decoder.

The image signal decoded by the image processing unit 320Q is input to the mixer 350Q.

The OSD generating unit 340Q generates an OSD signal based on the user input or based on its own input. For example, the OSD generating unit 340Q may generate a signal for displaying various informations on the screen of the display unit 180Q based on the control signal from the user input interface 150Q as a graphic or a text. The generated OSD signal may include various data such as a user interface screen, various menu screens, widget, and icons of the broadcasting signal receiver 100Q.

For example, the OSD generating unit 340Q may generate a signal for displaying subtitles of a broadcasting image or broadcasting information based on EPG. Alternatively, the OSD generating unit 340Q may generate a cursor based on the user input.

The mixer 350Q may mix the OSD signal generated by the OSD generating unit 340Q with the image signal decoded by the image processing unit 320Q. The mixed signal is provided to the formatter 360Q. Because the decoded broadcasting image signal or the external input signal is mixed with the OSD signal, the OSD may be overlaid and displayed on the broadcasting image or the external input image. For example, the cursor generated by the OSD generating unit 340Q may be displayed on the display unit 180Q.

The frame rate converter 355Q may convert a frame rate of the input image. For example, the frame rate converter 355Q may convert a frame rate of 60 Hz into a frame rate of 120 Hz or 240 Hz. When the frame rate of 60 Hz is converted into the frame rate of 120 Hz, a first frame may be inserted between the first frame and a second frame. Alternatively, a third frame estimated from the first and second frames may be inserted between the first frame and the second frame. When the frame rate of 60 Hz is converted into the frame rate of 240 Hz, the three same frames may be inserted or the three estimated frames may be inserted. The input frame rate may be maintained without a separate conversion.

The formatter 360Q receives an output signal of the frame rate converter 355Q and converts the output signal into a signal of a format suitable for the display unit 180Q. The formatter 360Q then outputs the signal. For example, the formatter 360Q may output R, G, and B data signals, and the R, G, and B data signals may be output as a low voltage differential signaling (LVDS) signal or a mini-LVDS signal.

Other configurations may be used for the controller 170Q shown in FIG. 68. For example, other module may be added to or omitted in the controller 170Q shown in FIG. 68.

As described above with reference to FIGS. 1 to 66, the display unit 180Q of the broadcasting signal receiver 100Q according to the embodiment of the invention may include the transparent cover 20 positioned at the edge of the display panel 100.

The transparent cover 20 may transmit light.

Considering the characteristic of the transparent cover 20, the user input interface 150Q of the broadcasting signal receiver 100Q may be positioned at a location overlapping with the transparent cover 20 of the display unit 180Q.

Figure 69:
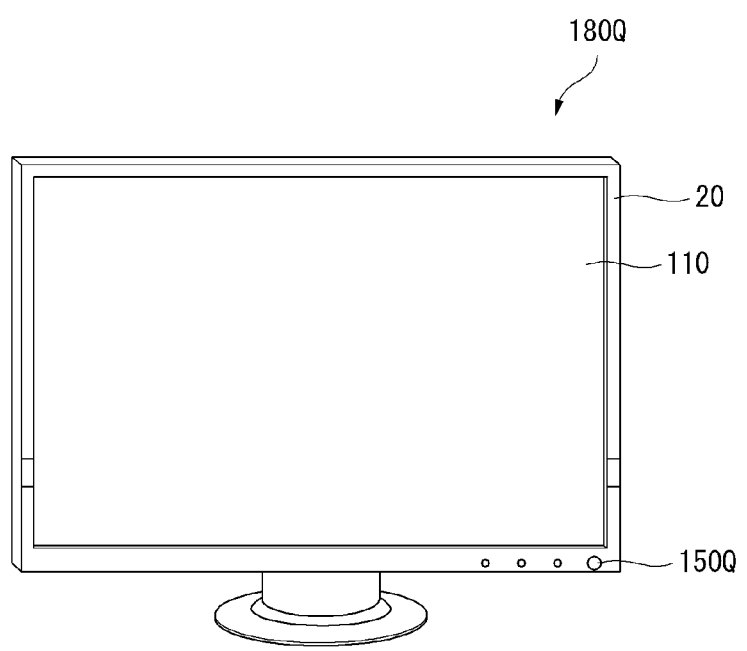
Figure 69:
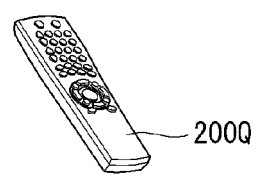

For example, as shown in FIG. 69, the user input interface 150Q may be positioned at a location overlapping with the transparent cover 20 positioned at the edge of the front substrate 110 of the display unit 180Q.

In this instance, the command input by the remote controller 200Q may pass through the transparent cover 20 and may be transferred to the user input interface 150Q.

This is described in detail below.

Figure 70:
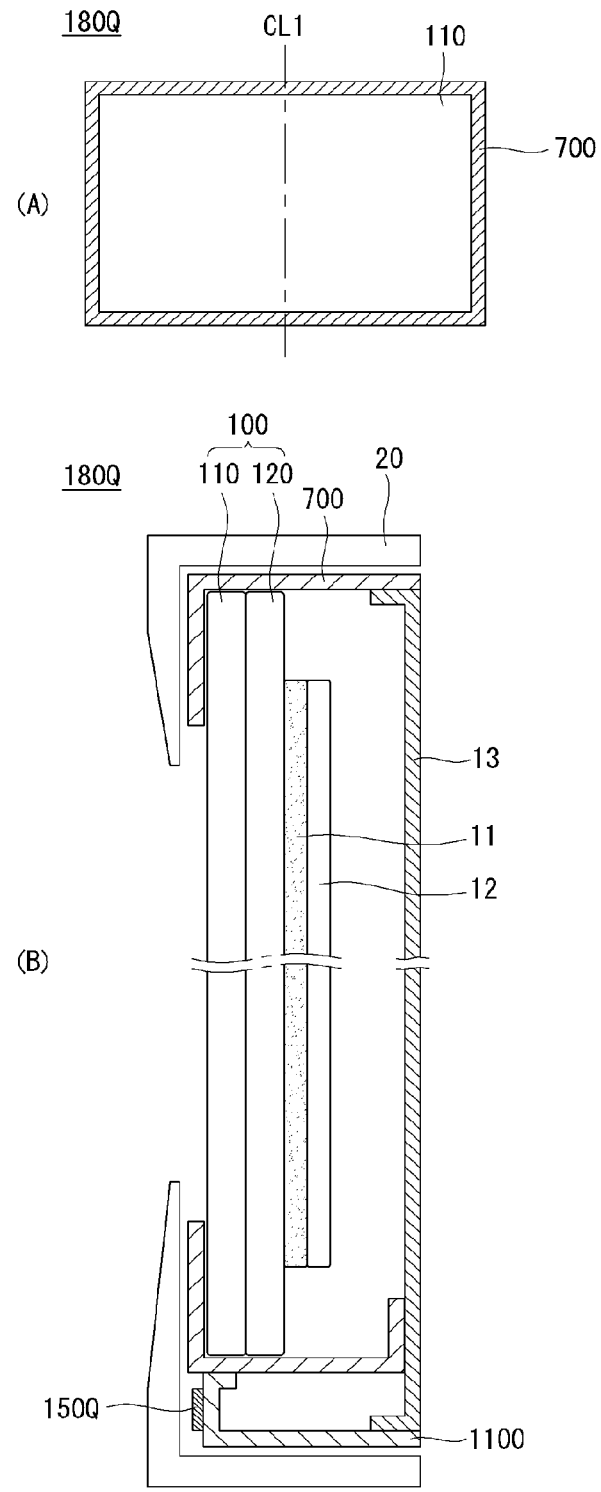

As shown in FIG. 70, the user input interface 150Q may be disposed in the display unit 180Q according to the embodiment of the invention, so that the user command input from the remote controller 200Q may pass through the transparent cover 20 and may be transferred to the user input interface 150Q.

For this, the display unit 180Q according to the embodiment of the invention may further include an auxiliary frame 1100. The user input interface 150Q may be disposed between the auxiliary frame 1100 and the transparent cover 20.

Although the embodiment of the invention describes that the display unit 180Q further includes the auxiliary frame 1100 so as to dispose the user input interface 150Q, other configuration may be used. For example, the auxiliary frame 1100 may be omitted, and the user input interface 150Q may be disposed between the black frame 700 and the transparent cover 20.

As above, when the display unit 180Q includes the transparent cover 20, the user input interface 150Q may be disposed in the rear of the transparent cover 20. Hence, the user may perceive that the user input interface 150Q is covered by the transparent cover 20. Further, because a separate space for the user input interface 150Q does not need to provide, the good appearance of the display unit 180Q may be provided.

Further, when the display unit 180Q includes the transparent cover 20, another command input unit for inputting the command including the power on or off, the channel change, etc. may be configured as a touch sensor. The touch sensor may be disposed in the rear of the transparent cover 20.

Figure 71:
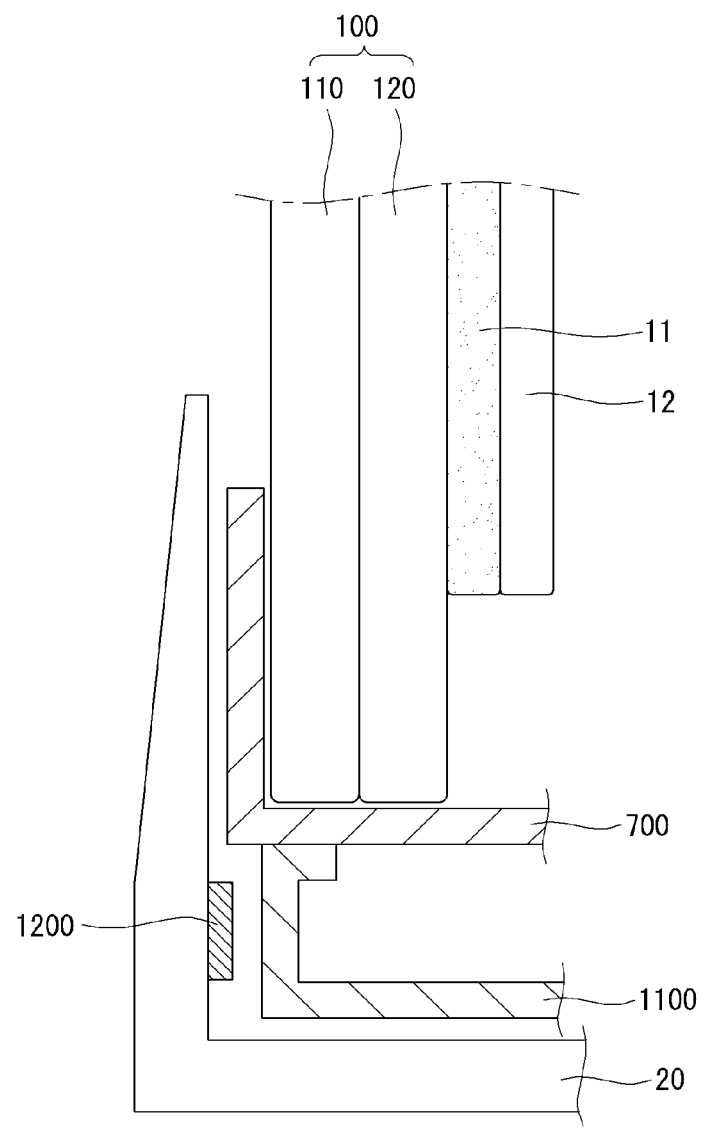

For example, as shown in FIG. 71, a touch sensor 1200 may be disposed between the transparent cover 20 and the auxiliary frame 1100.

Figure 72:
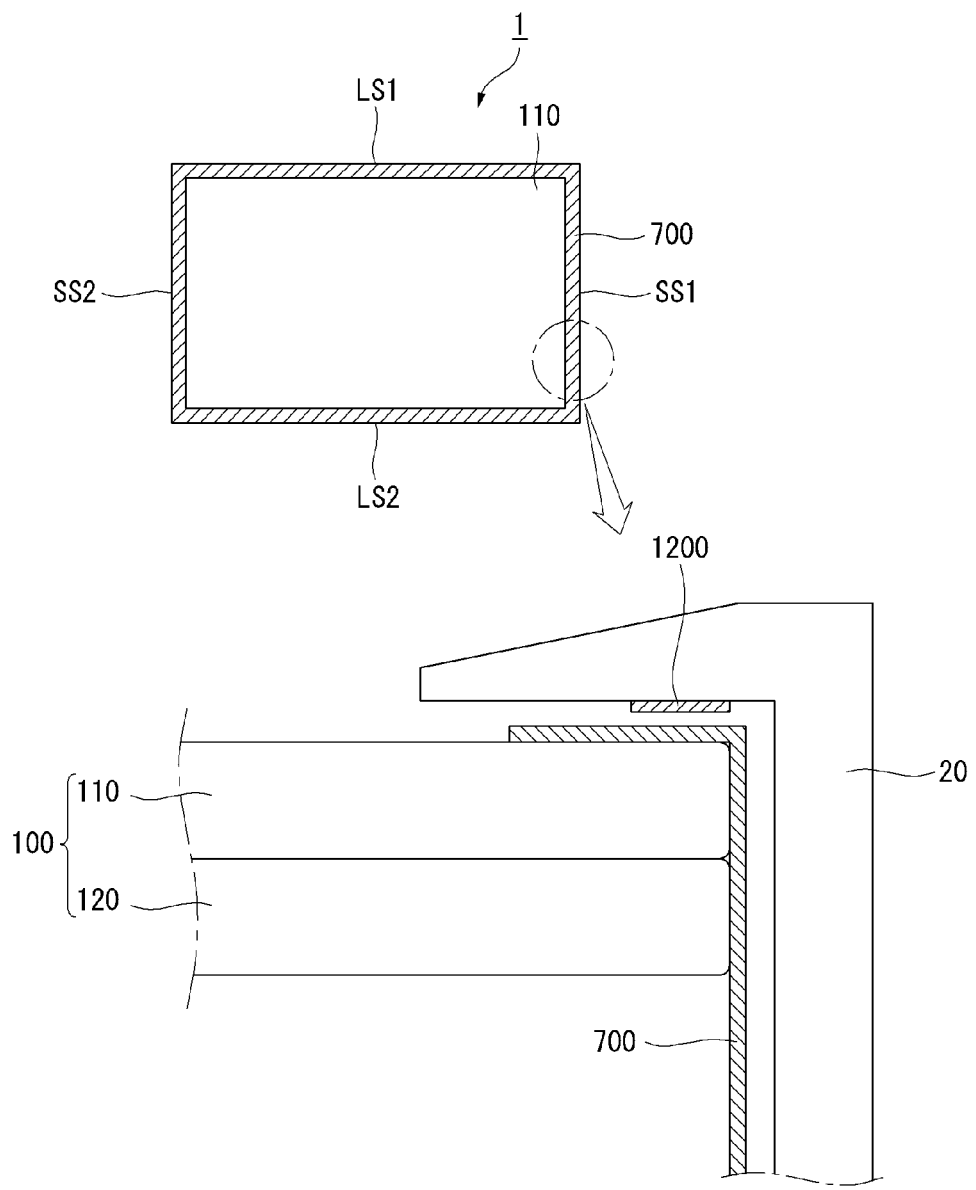
Figure 73:
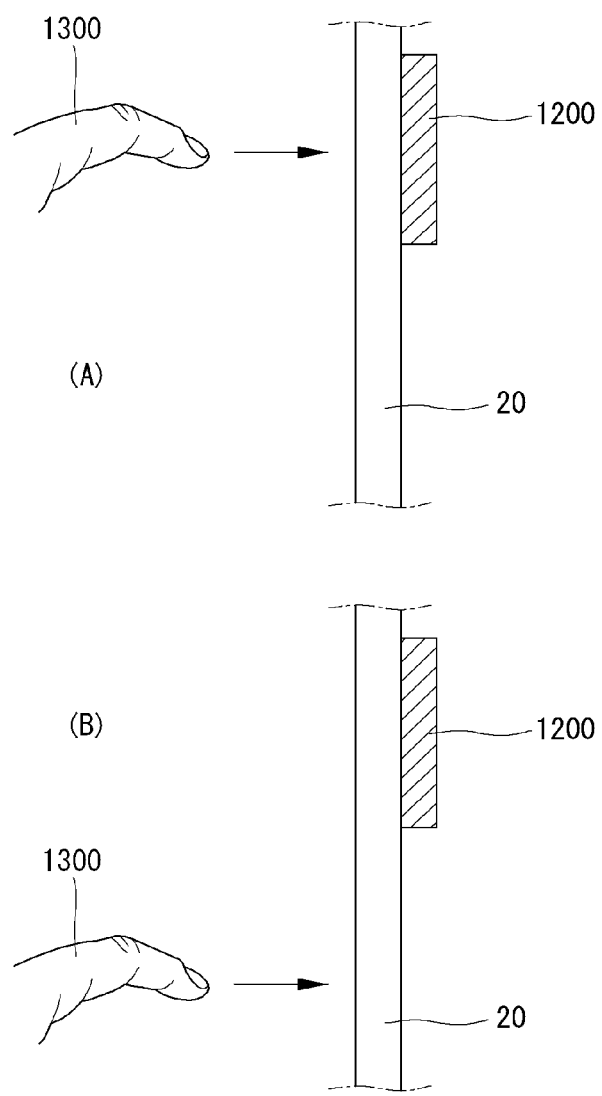

Alternatively, as shown in FIG. 72, the touch sensor 1200 may be disposed between the transparent cover 20 and the black frame 700.

When the user touches a portion of the transparent cover 20, the touch sensor 1200 may recognize the user's touch operation and may drive the broadcasting signal receiver 100Q.

The touch sensor 1200 may be a sensor capable of sensing the user's body or a small capacitance a specific object has. In this instance, when the user performs a touch operation using his or her body or a specific object having the capacitance, the touch sensor 1200 may recognize the user's touch operation and operate.

For example, as shown in FIG. 73(A), when the user touches a formation area of the touch sensor 1200 in the transparent cover 20, the touch sensor 1200 may sense small changes in the capacitance generated by the user's touch operation and may recognize the user's touch operation. Hence, the broadcasting signal receiver 100Q may perform a predetermined operation.

On the other hand, as shown in FIG. 73(B), when the user touches a non-formation area of the touch sensor 1200 in the transparent cover 20, the touch sensor 1200 may not operate.

As above, when the touch sensor 1200 is disposed in a predetermined area of the transparent cover 20, a portion of the transparent cover 20 may be used as a switch.

The touch sensor 1200 may directly contact the transparent cover 20. Alternatively, a non-conductive buffer (not shown) may be disposed between the transparent cover 20 and the touch sensor 1200.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a display panel including a front substrate and a back substrate;
    a back cover disposed in the rear of the display panel;
    a transparent cover including a first portion provided over a front surface of the front substrate of the display panel and a second portion extending from the first portion to cover a side of the display panel, the side being perpendicular to the front surface of the display device, and the second portion of the transparent cover being connected to the back cover; and
    a frame provided between the transparent cover and display panel.

2. The display device of claim 1, wherein the transparent cover contains a resin material having transmission capable of transmitting light.

3. The display device of claim 1, wherein a gap is provided between the front surface of the display panel and the first portion.

4. The display device of claim 3, wherein the first portion extends further than the frame in a horizontal direction.

5. The display device of claim 1, wherein the frame includes a portion positioned between the first portion and the display panel, and black region.

6. The display device of claim 1, wherein the frame is visible through the transparent cover.

7. The display device of claim 1, further comprising a painted part disposed on an edge of the front substrate of the display panel.

8. The display device of claim 1, wherein the second portion covers a side of each of the front and back substrates.

9. The display device of claim 1, wherein an air gap is provided between the frame and the first portion.

10. The display device of claim 1, wherein the first portion includes a first surface facing the front substrate of the display panel and a second surface opposite to the first surface, at least one of the first surface or second surface is an inclined.

11. A display device comprising:
- a display panel including a front substrate and a back substrate;
- a back cover disposed in the rear of the display panel;
- a transparent cover including a first portion provided over a front surface of the front substrate of the display panel and a second portion extending from the first portion to cover a side of the display panel, the side being perpendicular to the front surface of the display device, the second portion being connected to the back cover, and the transparent cover being configure for transmission of light; and
- a gap provided between the front surface of the front substrate and the first portion.

12. The display device of claim 11, wherein the second portion covers a side of each of the front and back substrates.

13. The display device of claim 11, wherein the first portion includes a portion with a first thickness and a portion with a second thickness different from the first thickness.

14. The display device of claim 13, wherein the first portion includes a first surface facing the front surface of the display panel and a second surface opposite to the first surface, and at least one of the first or second surfaces of first portion is an inclined surface.

* * * * *